(12) United States Patent
More et al.

(10) Patent No.: US 12,165,924 B2
(45) Date of Patent: Dec. 10, 2024

(54) SEMICONDUCTOR DEVICES HAVING MERGED SOURCE/DRAIN FEATURES AND METHODS OF FABRICATION THEREOF

(71) Applicant: TAIWAN SEMICONDUCTOR MANUFACTURING COMPANY, LTD., Hsinchu (TW)

(72) Inventors: Shahaji B. More, Hsinchu (TW); Chung-Hsien Yeh, Hsinchu (TW); Chih-Yu Ma, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/205,538

(22) Filed: Jun. 4, 2023

(65) Prior Publication Data

US 2023/0326800 A1    Oct. 12, 2023

Related U.S. Application Data

(62) Division of application No. 17/308,552, filed on May 5, 2021, now Pat. No. 11,705,371.

(51) Int. Cl.
| | |
|---|---|
| *H01L 21/8234* | (2006.01) |
| *B82Y 10/00* | (2011.01) |
| *H01L 27/088* | (2006.01) |
| *H01L 27/092* | (2006.01) |
| *H01L 29/06* | (2006.01) |
| *H01L 29/08* | (2006.01) |

(Continued)

(52) U.S. Cl.
CPC .......... *H01L 21/823425* (2013.01); *H01L 21/823412* (2013.01); *H01L 21/823431* (2013.01); *H01L 27/088* (2013.01); *H01L 27/0886* (2013.01)

(58) Field of Classification Search
CPC ..... H01L 21/823814; H01L 21/823418; H01L 29/66636; H01L 21/823821; H01L 27/0886; H01L 27/0924; H01L 29/41791; H01L 21/823431; H01L 29/66795; H01L 29/785; H01L 27/092; H01L 29/0847; H01L 29/45; H01L 23/5226; H01L 2029/7858; H01L 21/823425; H01L 21/823412; H01L 29/0673; H01L 29/78696; H01L 27/088; H01L 29/6656
See application file for complete search history.

(56) References Cited

U.S. PATENT DOCUMENTS 8,754,448 B2 * 6/2014 Liao .............. H01L 27/088
                                              117/22
9,105,490 B2   8/2015 Wang et al.
(Continued)

*Primary Examiner* — Sonya D McCall-Shepard
(74) *Attorney, Agent, or Firm* — NZ CARR LAW OFFICE

(57) ABSTRACT

Embodiments of the present disclosure provide methods for forming merged source/drain features from two or more fin structures. The merged source/drain features according to the present disclosure have a merged portion with an increased height percentage over the overall height of the source/drain feature. The increase height percentage provides an increased landing range for source/drain contact features, therefore, reducing the connection resistance between the source/drain feature and the source/drain contact features. In some embodiments, the emerged source/drain features include one or more voids formed within the merged portion.

20 Claims, 30 Drawing Sheets

(51) Int. Cl.
  *H01L 29/423*  (2006.01)
  *H01L 29/66*   (2006.01)
  *H01L 29/775*  (2006.01)
  *H01L 29/786*  (2006.01)

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,812,576 B2 * | 11/2017 | Lee ..................... H01L 29/785 |
| 9,831,183 B2 | 11/2017 | Lin et al. |
| 9,859,386 B2 | 1/2018 | Ho et al. |
| 10,164,042 B2 * | 12/2018 | Yeo ..................... H01L 29/7851 |
| 2017/0098648 A1 * | 4/2017 | Lee ................... H01L 21/823468 |
| 2019/0097006 A1 * | 3/2019 | Li ..................... H01L 29/66795 |
| 2019/0341318 A1 | 11/2019 | Adusumilli et al. |
| 2020/0105606 A1 | 4/2020 | Lin et al. |
| 2020/0105754 A1 * | 4/2020 | Murthy ............. H01L 29/66545 |

* cited by examiner

SEMICONDUCTOR DEVICES HAVING MERGED SOURCE/DRAIN FEATURES AND METHODS OF FABRICATION THEREOF

CROSS-REFERENCE TO RELATED APPLICATIONS

This application is a divisional application of U.S. patent application Ser. No. 17/308,552, filed May 5, 2021, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
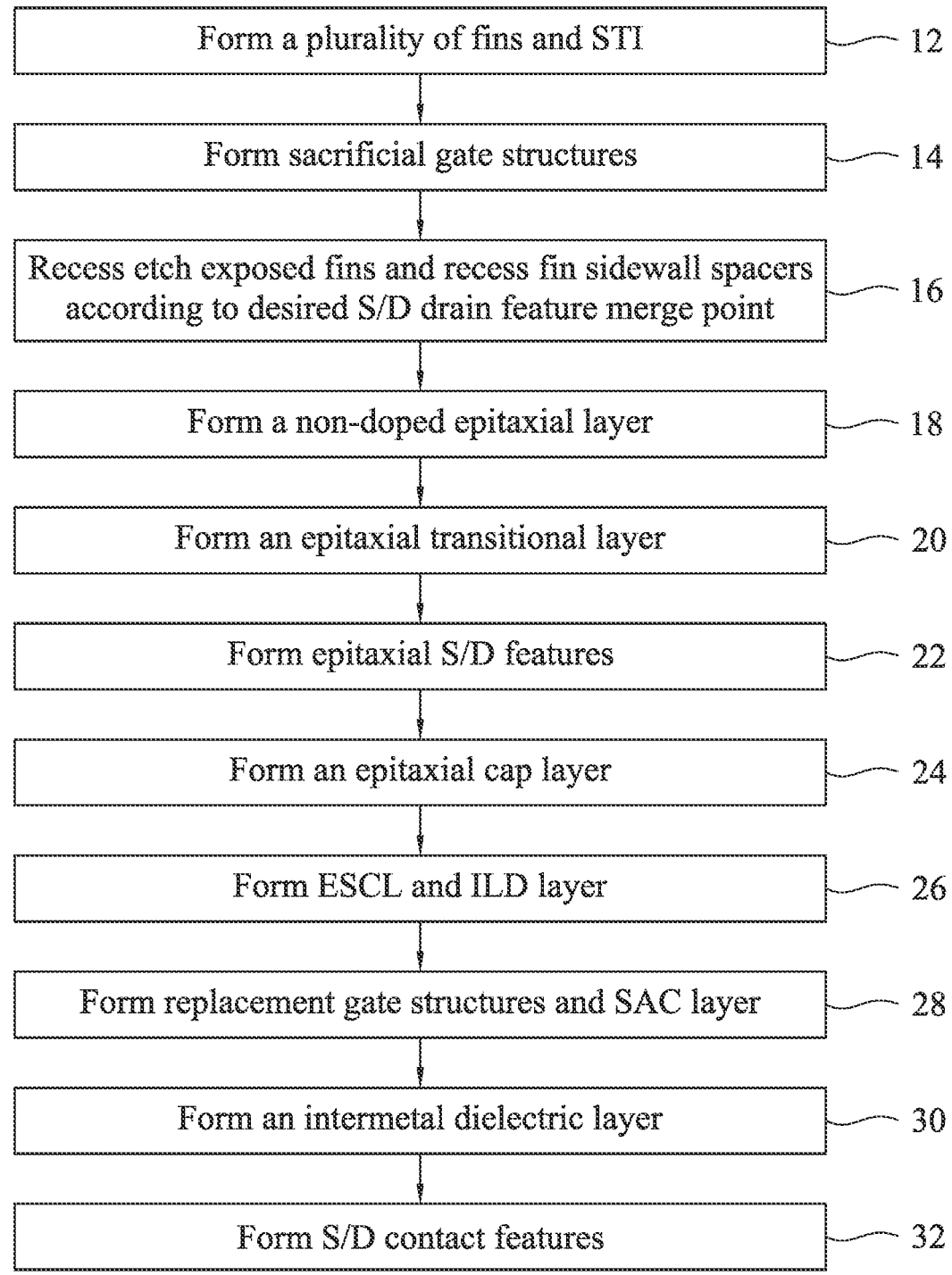
FIG. 1A is a flow chart of a method for manufacturing of a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanostructure FETs (e.g. nanowire transistor, nanosheet transistor, gate all around transistor, etc.), implementations of some aspects of the present disclosure may be used in other processes and/or in other devices, such as planar FETs, Fin-FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The nanostructure transistor may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure provide methods for forming merged source/drain features from two or more fin structures. The merged source/drain features according to the present disclosure have a merged portion with an increased height percentage over the overall height of the source/drain feature. The increased height percentage provides an increased landing range for source/drain contact features, therefore, reducing the connection resistance between the source/drain feature and the source/drain contact features. In some embodiments, the emerged source/drain features include one or more voids formed within the merged portion.

Figure 1B:
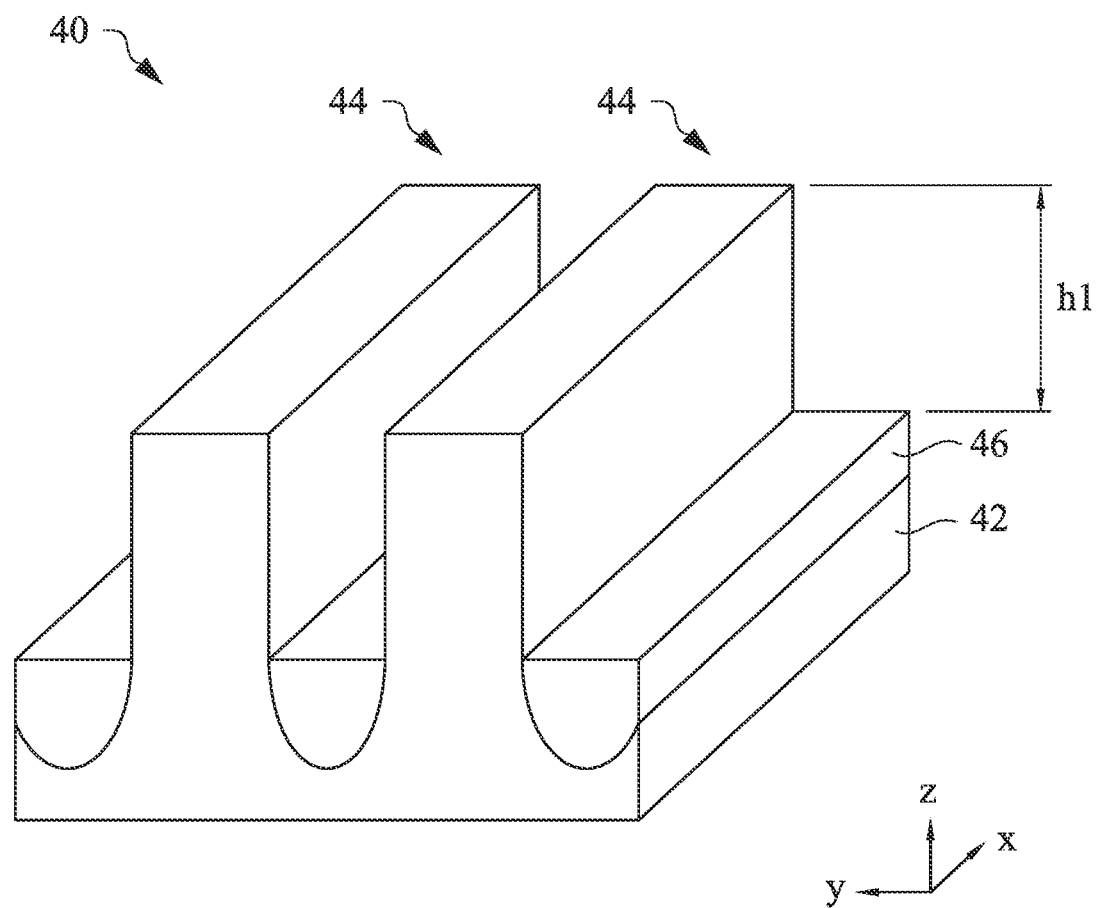
FIGS. 1B-1P schematically illustrate various stages of manufacturing a semiconductor device according to embodiments of the present disclosure.

FIG. 1A is a flow chart of a method 10 for manufacturing of a semiconductor device according to embodiments of the present disclosure. FIGS. 1B-1P schematically illustrate various stages of manufacturing a semiconductor device 40 according to embodiments of the present disclosure. Particularly, the semiconductor device 40 may be manufactured according to the method 10 of FIG. 1A.

At operation 12 of the method 10, fin structures 44 are formed on a substrate 42, and an isolation layer 46 is formed in trenches between the fin structures 44, as shown in 1B. FIG. 1B is a schematic side view of the semiconductor device 40 according to the present disclosure. The substrate 42 may include a single crystalline semiconductor material such as, but not limited to Si, Ge, SiGe, GaAs, InSb, GaP, GaSb, InAlAs, InGaAs, GaSbP, GaAsSb, and InP. The substrate 42 may include various doping configurations depending on circuit design. For example, the substrate 42 may include one or more p-doped regions and one or more n-doped regions. In some embodiments, the substrate 42 is a silicon (100) substrate. The fin structures 44 are then formed using one or more patterning and etching processes. The isolation layer 46 is formed in the trenches between the fin structures 44 by a suitable deposition followed by an etch back process. The bottom profile of the isolation layer 46 is shown to be curved as an example. Depending on pitch and/or height of the fin structures 44, a bottom profile of the isolation layer 46 may vary, for example curved, substantially flat, or other shapes. The isolation layer 46 may be formed by a high-density plasma chemical vapor deposition (HDP-CVD), a flowable CVD (FCVD), or other suitable deposition process. In some embodiments, the isolation layer 46 may include silicon oxide, silicon nitride, silicon oxynitride, fluorine-doped silicate glass (FSG), a low-k dielectric, or combinations thereof. In some embodiments, the isolation layer 46 is formed to cover the fin structures 44 by a suitable deposition process to fill the trenches between the fin structures 44, a planarization process may be performed to expose the fin structures 44, and then recess etched using a suitable anisotropic etching process to expose a portion of the fin structures 44, as shown in FIG. 1B. In some embodiments, the fin structures 44 have a height h1 over the isolation layer 46. The height h1 may vary according to circuit design. In some embodiments, the height h1 is in a range between about 20 nm to about 100 nm.

Figure 1C:
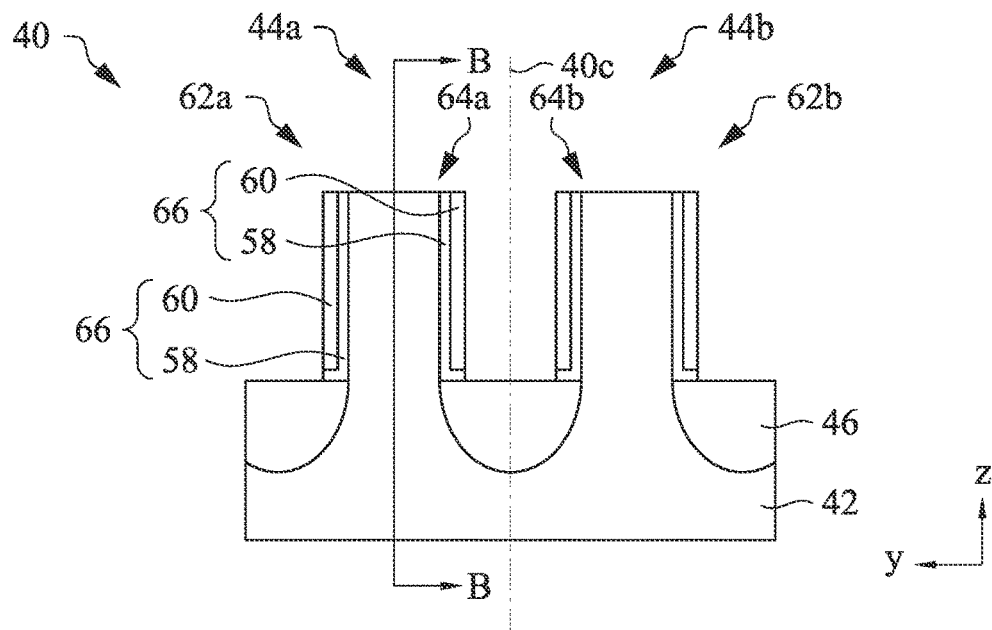
Figure 1D:
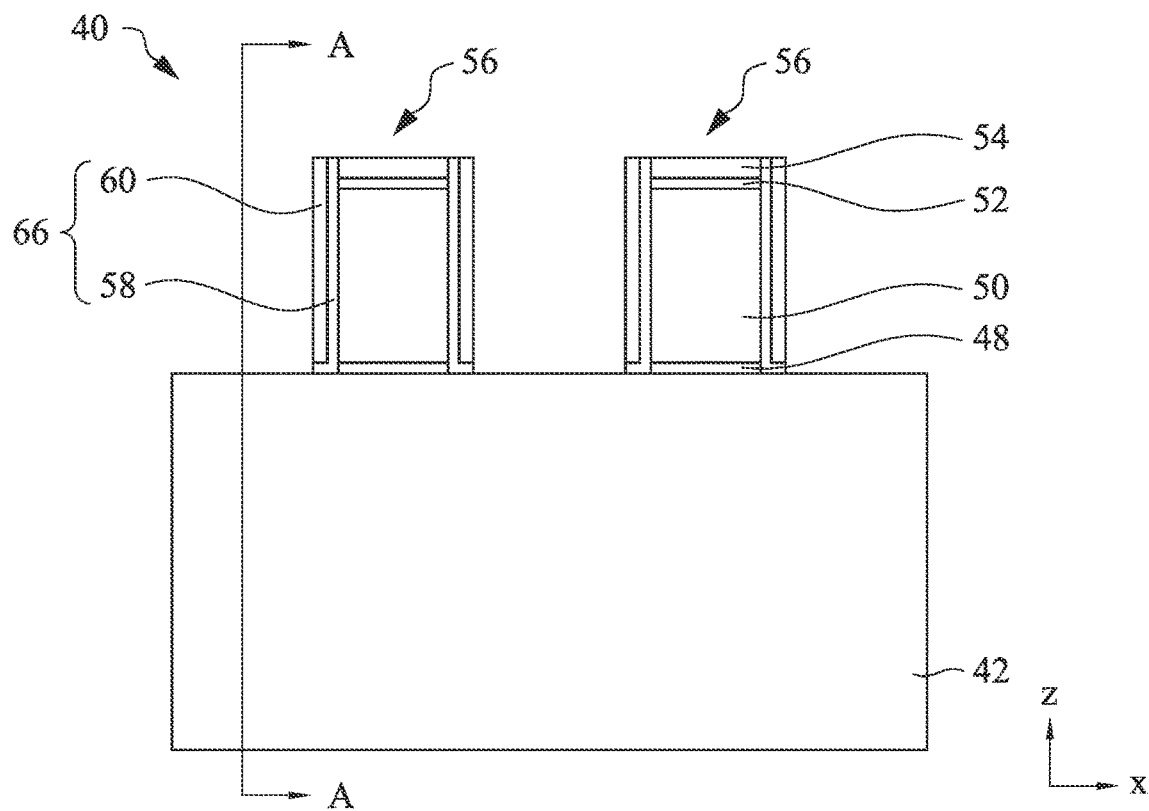

At operation 14, sacrificial gate structures 56, gate sidewall spacers 66, and fin sidewall spacers 62, 62a, 62b, 64, 64a, 64b are formed as shown in FIGS. 1C and 1D. FIG. 1C is a sectional view of the semiconductor device 40 along the line A-A in FIG. 1D. FIG. 1D is a sectional view of the semiconductor device 40 along the line B-B in FIG. 1C.

A sacrificial gate dielectric layer 48 is conformally formed over the substrate 42. The sacrificial gate dielectric layer 48 is formed over the fin structures 44 and the isolation layer 46. The sacrificial gate dielectric layer 48 may include silicon oxide, silicon nitride, a combination thereof, or the like. The sacrificial gate dielectric layer 48 may be deposited or thermally grown according to acceptable techniques, such as thermal CVD, CVD, ALD, and other suitable methods.

A sacrificial gate electrode layer 50 is deposited on the sacrificial gate dielectric layer 48 and then planarized, such as by a CMP process. The sacrificial gate electrode layer 50 includes silicon such as polycrystalline silicon, amorphous silicon, poly-crystalline silicon-germanium (poly-SiGe), or the like. In some embodiments, the sacrificial gate electrode layer 50 is subjected to a planarization operation. The sacrificial gate electrode layer 50 may be deposited using CVD, including LPCVD and PECVD, PVD, ALD, or other suitable process. In some embodiments, a pad layer 52, and a mask layer 54 are sequentially deposited over the sacrificial gate electrode layer 50. The pad layer 52 may include silicon nitride. The mask layer 54 may include silicon oxide. A patterning operation is performed on the mask layer 54, the pad layer 52, the sacrificial gate electrode layer 50, and the sacrificial gate dielectric layer 48 to form the sacrificial gate structures 56 using one or more etching processes, such as one or more plasma etching processes or one or more wet etching processes. In some embodiments, the mask layer 54 and pad layer 52 are first patterned using a patterning process. The sacrificial gate electrode layer 50 is then patterned using the patterned mask layer 54 and pad layer 52 as an etching mask. In some embodiments, the sacrificial gate electrode layer 50 may be etched by an anisotropic etching, such as a reactive ion etching (RIE) process. The anisotropic etching has a greater etching rate along the Z direction than etching rates along the X and Y directions. During the etching of the sacrificial gate electrode layer 50, the sacrificial gate dielectric layer 48 on the fin structures 44 may act as an etch stop to prevent the etchant from removing the fin structures 44.

In some embodiments, after patterning the sacrificial gate electrode layer 50, any exposed residual sacrificial gate dielectric layer 48 is removed by a suitable etch process. In some embodiments, the residual sacrificial gate dielectric layer 48 can be etched by tuning one or more parameters, such as etchant, etching temperature, etching solution concentration, etching pressure, source power, radio frequency (RF) bias voltage, etchant flow rate, of the etch process for etching the sacrificial gate electrode layer 50.

The sacrificial gate structure 56 covers a portion of the fin structures 44. The portion of the fin structures 44 covered by the sacrificial gate structures 56 eventually form a channel region.

In some embodiments, a spacer layer 58 and a spacer layer 60 may be formed over exposed surfaces of the semiconductor device 40. The spacer layer 58 and the spacer layer 60 may be formed by ALD or CVD, or any other suitable method. The spacer layer 58 may include an oxide material, such as silicon oxide, and the spacer layer 60 may include a nitride material, such as silicon nitride. Alternatively, the spacer layer 60 includes another suitable dielectric material, such as silicon oxide, silicon oxynitride, or combinations thereof. The spacer layer 58 may also comprise another suitable dielectric material. The spacer layer 58 and spacer layer 60 are formed by a suitable process. For example, the spacer layer 58 and spacer layer 60 are formed by blanket deposition sequentially. In some embodiments, an anisotropic etching may be performed to remove the spacer layer 58 and spacer layer 60 from horizontal surfaces, such that the spacer layer 58 and spacer layer 60 are positioned on sidewalls of the sacrificial gate structures 56. As shown in FIG. 1D, the gate sidewall spacers 66 formed on sidewall of the sacrificial gate structures 56. In this example, the gate sidewall spacers 66 include spacer layer 58 and the spacer layer 60. The gate sidewall spacers 66 may have other suitable arrangements and/or compositions.

The fin sidewall spacers 62 are formed from the spacer layer 58 and spacer layer 60 and may remain on exposed sidewalls of the fin structures 44. In FIG. 1C, the fin structures 44 are denoted as fin structure 44a, 44b respectively. The fin structures 44a, 44b are neighboring fin structures. In some embodiments, the fin structures 44a, 44b are substantially symmetrical to a central line 40c. In other words, the fin structures 44a, 44b may be disposed on opposite sides of the central line 40c and at substantially equal distances from the central line 40c. The As sown in FIG. 1C, fin sidewall spacers 62a, 64a are formed on sidewalls of the fin structure 44a, and fin sidewall spacers 62b, 64b are formed on sidewalls of the fin structure 44b. The fin sidewall spacers 62a, 62b, collectively 62, are formed on outer sidewalls of the fin structures 44a, 44b and the fin sidewall spacers 64a, 64b, collectively 64, are formed on inner sidewalls of the fin structures 44a, 44b. In this example, the fin side wall spacers 62a, 64a, 62b, 64b include the spacer layer 58 and the spacer layer 60. The fin side wall spacers 62a, 64a, 62b, 64b may have other suitable arrangements and/or compositions.

Figure 1E:
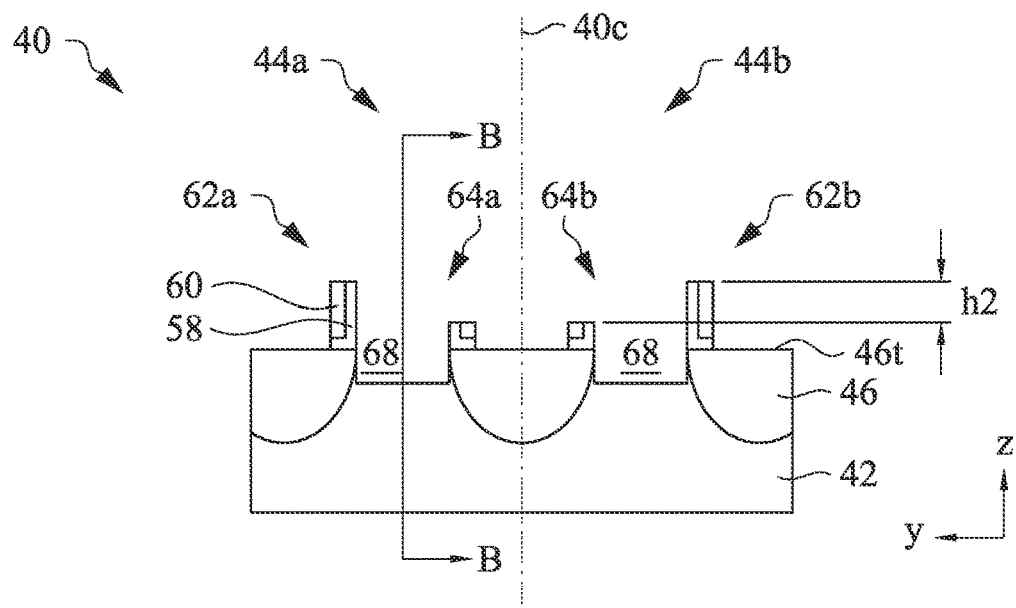
Figure 1F:
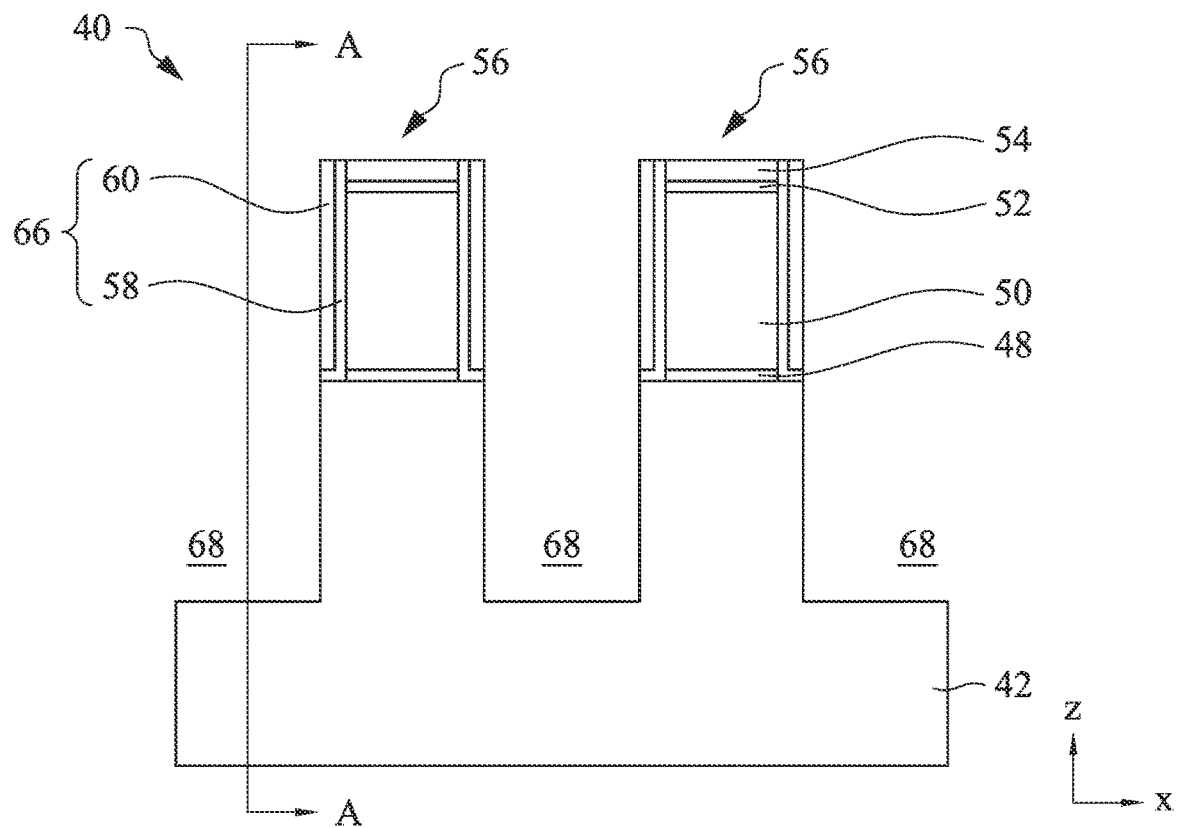

In operation 16, the fin structures 44 in source/drain region, or regions not covered by the sacrificial gate structures 46, are recess etched, as shown in FIGS. 1E and 1F. FIG. 1E is a sectional view of the semiconductor device 40 along the line A-A in FIG. 1F. FIG. 1F is a sectional view of the semiconductor device 40 along the line B-B in FIG. 1E. The fin sidewall spacers 62, 64 are also at least partially recessed. In some embodiments, suitable dry etching and/or wet etching may be used to remove the semiconductor material in the fin structure 44. In some embodiments, the fin structures 44a, 44b are recessed to a level below the isolation layer 46, as shown in FIG. 1E. As shown in FIG. 1F, source/drain recesses 68 are formed on both sides of the sacrificial gate structures 56.

In some embodiments, the fin sidewall spacers 64a, 62a, 62b, 64b are partially recessed as shown in FIG. 1E. In some embodiments, the fin sidewall spacers 64a, 62a, 62b, 64b may be recessed during recess etch of the fin structures 44. In other embodiments, the fin sidewall spacers 64a, 62a, 62b, 64b may be removed using a separate process. In some embodiments, heights of the fin sidewall spacers 64a, 62a, 62b, 64b may be controlled to achieve desired shape of the source/drain features to be formed from the fin structures 44. For example, the heights of the fin sidewall spacers 64a, 62a, 62b, 64b, along the z-direction, from a top surface 46t of the isolation layer 46 may be controlled to define critical dimension and/or shape of the source/drain features to be formed. In some embodiments, the heights of the fin sidewall spacers 64a, 62a, 62b, 64b may be set to control location of the merge point of the two source/drain features formed from the neighboring fin structures 44a, 44b. For example, the heights of the fin sidewall spacers 64a, 62a, 62b, 64b are used control the level of merge point along the z-direction.

Various factors may be considered when selecting heights of the fin sidewall spacers 64a, 62a, 62b, 64b to achieve desired shape of the source/drain features to be formed, for example, the pitch of the fin structures 44a, 44b, i.e. the distance between the fin structures 44a, 44b along the y-axis, the width of the fin structures 44a, 44b along the Y-axis, the height h1 of the fin structures 44 over the top surface 46t of the isolation layer 46, and other relevant geometry and/or material properties of the fin structures 44a, 44b and source/drain structures to be formed.

In some embodiments, the fin sidewall spacers 64a, 62a, 62b, 64b may have the same heights. In other embodiments, the fin sidewall spacers 62a, 64a may have different heights as shown in FIG. 1C. Similarly, the fin sidewall spacers 62b, 64b may also have different heights. In some embodiments, the fin sidewall spacers 64a, 64b are higher than the fin sidewall spacers 62a, 62b. In other embodiments, the fin sidewall spacers 64a, 64b are shorter than the fin sidewall spacers 62a, 62b. In some embodiments, heights of the fin sidewall spacers 64a, 62a, 62b, 64b maybe symmetrical to the central line 40c. For example, the fin sidewall spacers 64a, 64b may have substantially the same height and the fin sidewall spacers 62a, 62b may have substantially the same height. In some embodiments, the fin sidewall spacers 62a, 62b and the fin sidewall spacers 64a, 64b may have a height difference h2. The dimension of h2 may vary according to the dimension of the semiconductor device 40. In some embodiment, h2 may be in a range between 5 nm and about 30 nm. In other embodiments, a ratio of h2 over h1 may be in a range between 0.05 and about 0.5.

Figure 1G:
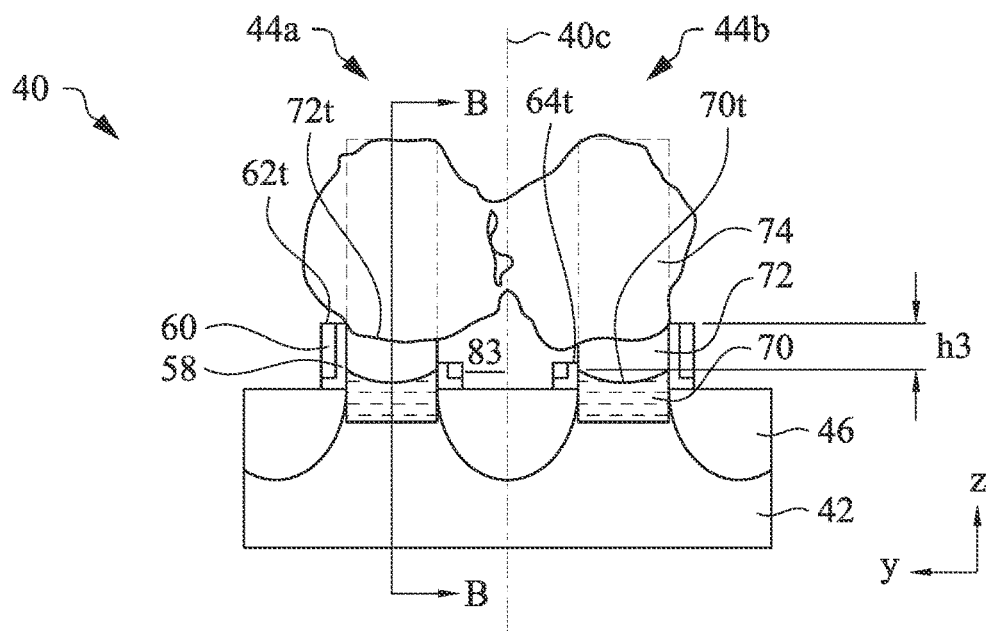
Figure 1H:
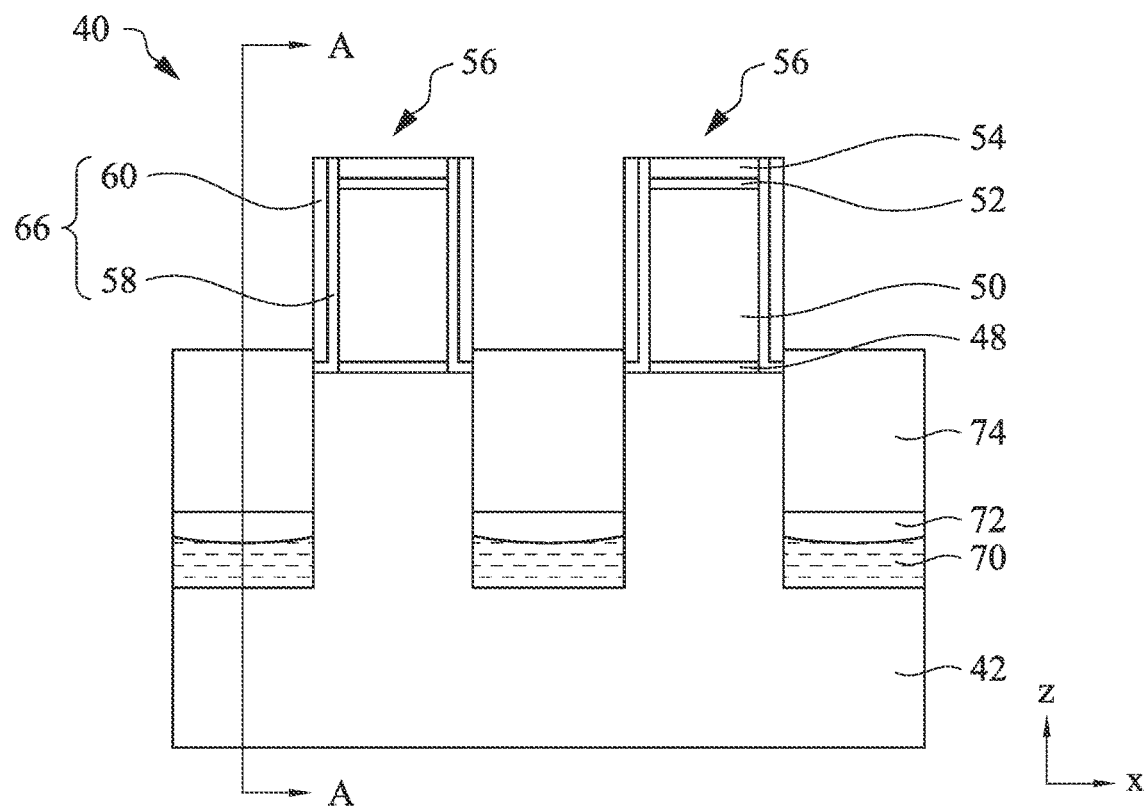

At operation 18, an undoped epitaxial layer 70 is formed in the source/drain recess 68, as shown in FIGS. 1G and 1H. FIG. 1G is a sectional view of the semiconductor device 40 along the line A-A in FIG. 1H. FIG. 1H is a sectional view of the semiconductor device 40 along the line B-B in FIG. 1G.

In some embodiments, a pre-clean process may be performed to remove any undesirable silicon oxide that is formed as a result of the oxidation of the exposed surfaces of the source/drain recesses 68. In some embodiments, the pre-clean process may be performed using inductively coupled plasma of a cleaning agent. In some embodiment, the cleaning agent includes Ar, $NF_3$, and $NH_3$. The pre-cleaning process may be performed in a temperature range between about 25° C. and about 74° C. for a time period between 80 seconds and about 400 seconds. Alternatively, the pre-cleaning process may be performed using an HF-based gas or a SiCoNi based gas.

In some embodiments, the undoped epitaxial layer 70 may be an epitaxial silicon layer. The undoped epitaxial layer 70 may be formed by any suitable method, such as by CVD, CVD epitaxy, molecular beam epitaxy (MBE), or any suitable deposition technique.

In some embodiments, the undoped epitaxial layer 70 may be formed to refill the fin structure 44 between the fin sidewall spacers 62a, 64a and between the fin sidewall spacers 62b, 64b. The undoped epitaxial layer 70 may be formed to a level between below the top surface 46t of the isolation layer 46 and below the fin sidewall spacers 64a/64b. For example, the undoped epitaxial layer 70 may level with the top surface 46t of the isolation layer 46. As shown in FIG. 1G, a top surface 70t of the undoped epitaxial layer 70 is substantially level with a top surface 64t of the fin sidewall spacers 64a, 64b.

At operation 20, an epitaxial transitional layer 72 is formed over the undoped epitaxial layer 70, as shown in FIGS. 1G and 1H. The epitaxial transitional layer 72 is formed over the undoped epitaxial layer 70. The epitaxial transitional layer 72 may be formed by any suitable method, such as by CVD, CVD epitaxy, molecular beam epitaxy (MBE), or any suitable deposition technique. The epitaxial transitional layer 72 can serve to gradually change the lattice constant from that of the undoped epitaxial layer 70 to that of the source/drain features to be formed. In some embodiments, the epitaxial transitional layer 72 may be a semiconductor material with a lattice structure similar to the semiconductor material configured to function as a source/drain feature for a n-type device. In some embodiments, the epitaxial transitional layer 72 may be a semiconductor material includes n-type dopants at a dopant concentration lower than a dopant concentration used in a source/drain feature. The epitaxial transitional layer 72 may include one or more layers of Si, SiAs, SiP, SiC and SiCP. The epitaxial transitional layer 72 also include n-type dopants, such as phosphorus (P), arsenic (As), etc. In some embodiments, the epitaxial transitional layer 72 may be a Si layer includes arsenic dopants. In some embodiments, the epitaxial transitional layer 72 includes a dopant concentration in a range between about 15E19 atoms/$cm^3$ and about 5E20 atoms/$cm^3$.

The epitaxial transitional layer 72 may have a thickness h3 in a range between about 3 nm and about 15 nm. If the thickness of the epitaxial transitional layer 72 is below 3 nm, the epitaxial transitional layer 72 may not be thick enough to function as lattice transitional layer between the undoped epitaxial layer 70 and the source/drain features to be formed. If the thickness of epitaxial transitional layer 72 is greater than 15 nm, the epitaxial transitional layer 72 may be in contact with the semiconductor channel layers 206 and affect the device function and without obvious additional advantages for crystalline structural transition. In some embodiments, the top surface 72t of the epitaxial transitional layer 72 may be substantially level with a top surface of the higher one of the fin sidewall spacers 62a/62b and 64a/64b. As shown in FIG. 1G, the top surface 72t of the epitaxial transitional layer 72 is substantially level with a top surface 62t of the fin sidewall spacers 62a, 62b. In some embodiments, the height difference between the fin sidewall spacers 62a/62b and 64a/64b and the epitaxial transitional layer 72 may result in the top surface 72t that is lob sided towards the central line 40c, enabling formation of merged source/drain features to be formed.

In some embodiments, the epitaxial transitional layer 72 may be grown in an epitaxial chamber by a suitable process. For example, the epitaxial transitional layer 72 is formed by a selective etching growth process, in which a thin film is deposited by introducing a reactant gas including deposition agent and etchant together. In some embodiments, an optional etching process may be performed to achieve desired shape and/or thickness of the epitaxial layer being formed. The epitaxial deposition may be performed at a temperature in a range between about 600° C. and 700° C., under a pressure in a range between about 100 and 600 Torr, and performed for a time duration in a range between about 100 seconds and 400 seconds, by using a Si containing gas such as $SiCl_2H_2$, $SiH_4$, or $Si_2H_6$, such as $AsH_3$, and $PH_3$, HCl, and a carrier gas, such as $H_2$. In some embodiments, the reactant gas may include $SiCl_2H_2$ at a flow rate in a range between 200 sccm and 600 sccm, $AsH_3$ at a flow rate in a range between 100 sccm and 300 sccm, HCl at a flow rate in a range between 50 sccm and 200 sccm, and $H_2$ at a flow rate in a range between 2000 sccm and 8000 sccm. In some embodiments, an optional etch process may be performed at a temperature in a range between about 650° C. and 750° C., under a pressure in a range between about 100 and 500 Torr, and performed for a time duration in a range between about 10 seconds and 80 seconds, by using an etchant, such as HCl. In some embodiments, the etchant may include HCl at a flow rate in a range between 300 sccm and 1000 sccm.

Figure 1I:
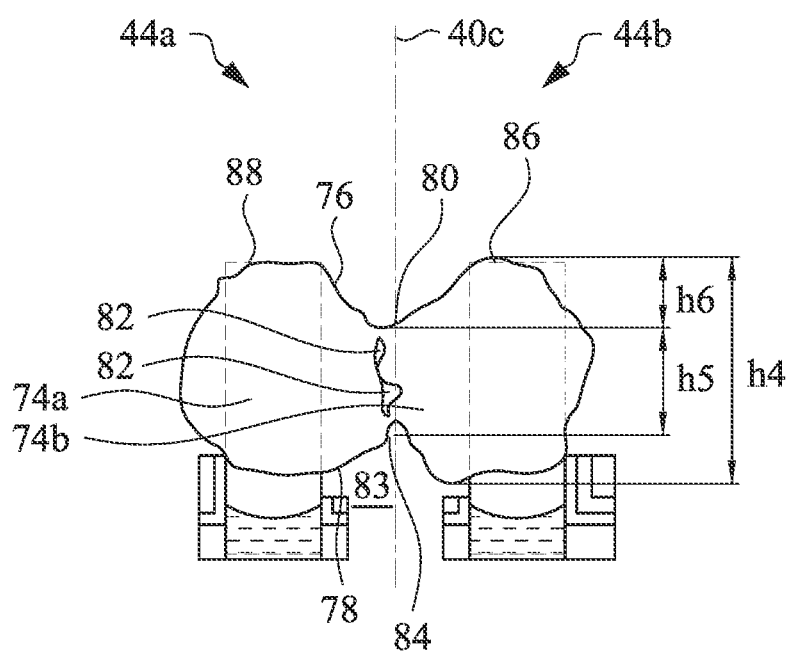

At operation 22, epitaxial source/drain features 74 are formed over the epitaxial transitional layer 72, as shown in FIGS. 1G, 1H, and 1I. FIG. 1I is a partial enlarged view of FIG. 1G showing the epitaxial source/drain features 74. The epitaxial source/drain features 74 are formed over the epitaxial transitional layer 72. The epitaxial source/drain features 74 may be formed by any suitable method, such as by CVD, CVD epitaxy, molecular beam epitaxy (MBE), or any suitable deposition technique. The epitaxial source/drain features 74 may include one or more layers of Si, SiP, SiC and SiCP. The epitaxial source/drain features 74 also include n-type dopants, such as phosphorus (P), arsenic (As), etc. In some embodiments, the epitaxial source/drain features 74 may be a Si layer including phosphorus dopants. The dopant concentration in the epitaxial source/drain features 74 is higher than that of the epitaxial transitional layer 72. In some embodiments, the epitaxial source/drain features 74 include a dopant concentration of between about 1E20 atoms/cm$^3$ and about 5E21 atoms/cm$^3$.

The epitaxial source/drain features 74 may have a height h4, shown in FIG. 1I, in a range between about 30 nm and about 70 nm or a thickness enough for side surfaces of the epitaxial features 74 to cover all of the fin structures 44 in the z-direction.

In some embodiments, the epitaxial source/drain features 74 may be grown in an epitaxial chamber by a suitable process. For example, the epitaxial source/drain features 74 are formed by a selective etching growth process, in which a thin film is deposited by introducing a reactant gas including deposition agent and etchant together. In some embodiments, an optional etching process may be performed to achieve desired shape and/or thickness of the epitaxial layer being formed. The epitaxial deposition may be performed at a temperature in a range between about 600° C. and 700° C., under a pressure in a range between about 100 and 600 Torr, and performed for a time duration in a range between about 50 seconds and 300 seconds, by using a Si containing gas such as $SiH_4$, $Si_2H_6$, and $SiCl_2H_2$, a dopant gas, such as $PH_3$, and $AsH_3$, and HCl, and a carrier gas, such as $H_2$. In some embodiments, the reactant gas may include $SiH_4$ at a flow rate in a range between 200 sccm and 500 sccm, $PH_3$ at a flow rate in a range between 100 sccm and 500 sccm, HCl at a flow rate in a range between 50 sccm and 100 sccm, and $H_2$ at a flow rate in a range between 2000 sccm and 4000 sccm. In some embodiments, an optional etch process following the epitaxial deposition may be performed at a temperature in a range between about 600° C. and 700° C., under a pressure in a range between about 100 and 500 Torr, and performed for a time duration in a range between about 10 seconds and 80 seconds, by using an etchant, including HCl and $SiH_4$. In some embodiments, the etchant may include HCl at a flow rate in a range between 500 sccm and 1000 sccm, and $SiH_4$ at a flow rate in a range between 100 sccm and 300 sccm. The etchant may include a carrier gas, such as $H_2$.

Because of the epitaxial process parameters at operation 22 and the height selection of the fin sidewall spacers 62a, 64a, 64b, 62b, the epitaxial source/drain features 74 grown from the fin structures 44a and 44b merged along the central line 40c. As shown in FIG. 1I, the epitaxial source/drain feature 74a grown from the fin structure 44a and the epitaxial source/drain feature 74b grown from the fin structure 44b merge together to form one epitaxial source/drain feature 74. The merged epitaxial source/drain feature 74 may have a top surface 76 and a bottom surface 78 opposing the top surface 76. The sidewalls connect the top surface 76 and the bottom surface 78. The epitaxial source/drain features 74a, 74b merge substantially along the central line 40c. The epitaxial source/drain features 74a, 74b are merged from a lower merge point 84 on the bottom surface 78 and an upper merge point 80 on the top surface 76. The lower merge point 84 and the top merge point 80 are at different vertical levels along the z-direction. A merge length in the z-direction from the lower merge point 84 to the upper merge point 80 is denoted by h5. In some embodiments, a ratio of the merge length h5 and the height h4 is in a range between about 65% and about 80%. The merge height h5 is about 50% to 70% of the non-merge height, or the height above the upper merge point 80 and below the lower merge point 84.

In some embodiments, the shapes of the epitaxial source/drain features 74a, 74b are tuned such that the epitaxial source/drain features 74a, 74b are "just" merge to allow the epitaxial source/drain features 74a, 74b substantially retain the natural shapes from epitaxial growth without merging. The "just" merge arrangement allows the epitaxial source/drain features 74a, 74b to merge yet substantially maintain "natural" or "unmerged" source/drain feature volume.

As shown in FIG. 1I, the top surface 76 may be a wavy surface having peak points 86, 88 defining a valley therebetween. The upper merge point 80 coincides with the valley point between the peak points 86, 88. A wavy height h6 is defined by a distance from the valley point to the peak points 86, 88. In some embodiments, a ratio of the wavy height h6 over the total height h4 is in a range between about 5% and about 35%.

In some embodiments, one or more voids 82 are formed along the merge line or the central line 40c as the "just" merge arrangement. The one or more voids 82 may be filled with air or gas, such as hydrogen, helium, or other suitable gas. In some embodiments, the voids 82 may have a shape of circular, elliptical, parabolic, or triangular in the z-y plane. In some embodiments, the voids 82 may have a radius in a range between about 0.5 nm and about 3 nm. In some embodiments, the void 82 may be located along the central line 40c about 3 nm to 7 nm below the upper merge point 80. The merging of the epitaxial source/drain features 74a, 74b also result a void 83 between the bottom surface 78 and the isolation layer 46. The void 83 may be filled with air or gas, such as hydrogen, helium, or other suitable gas.

Figure 1J:
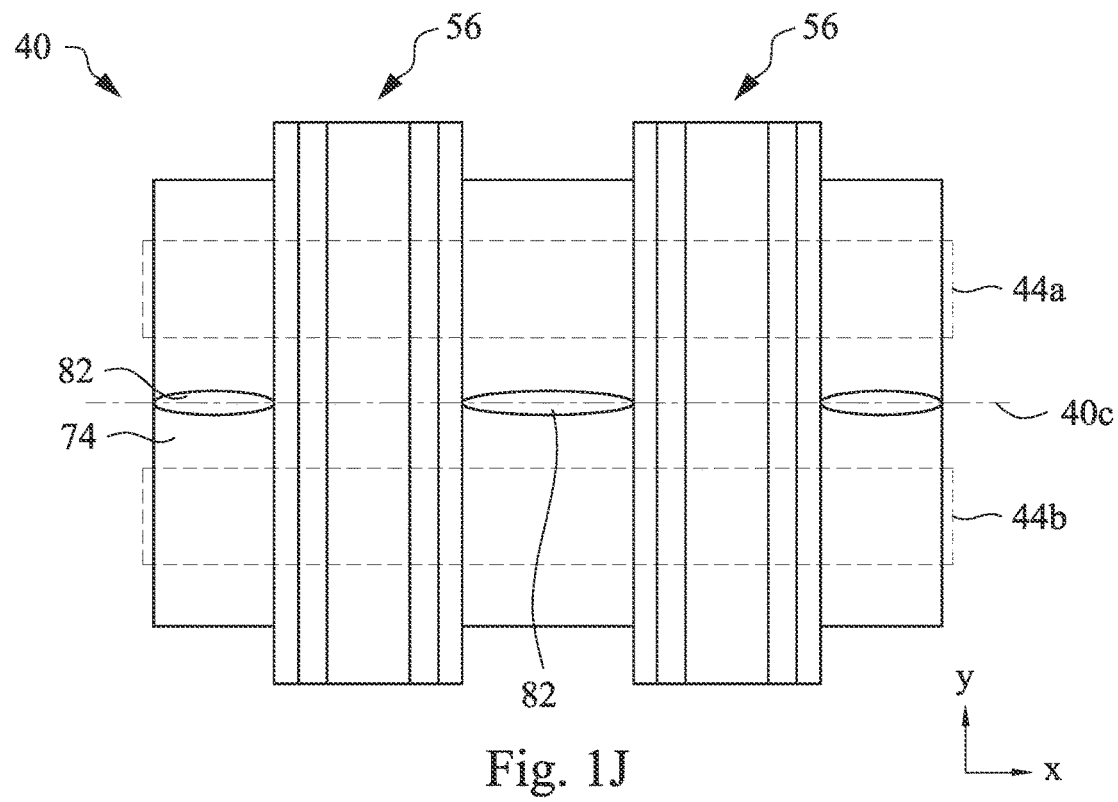
Figure 1K:
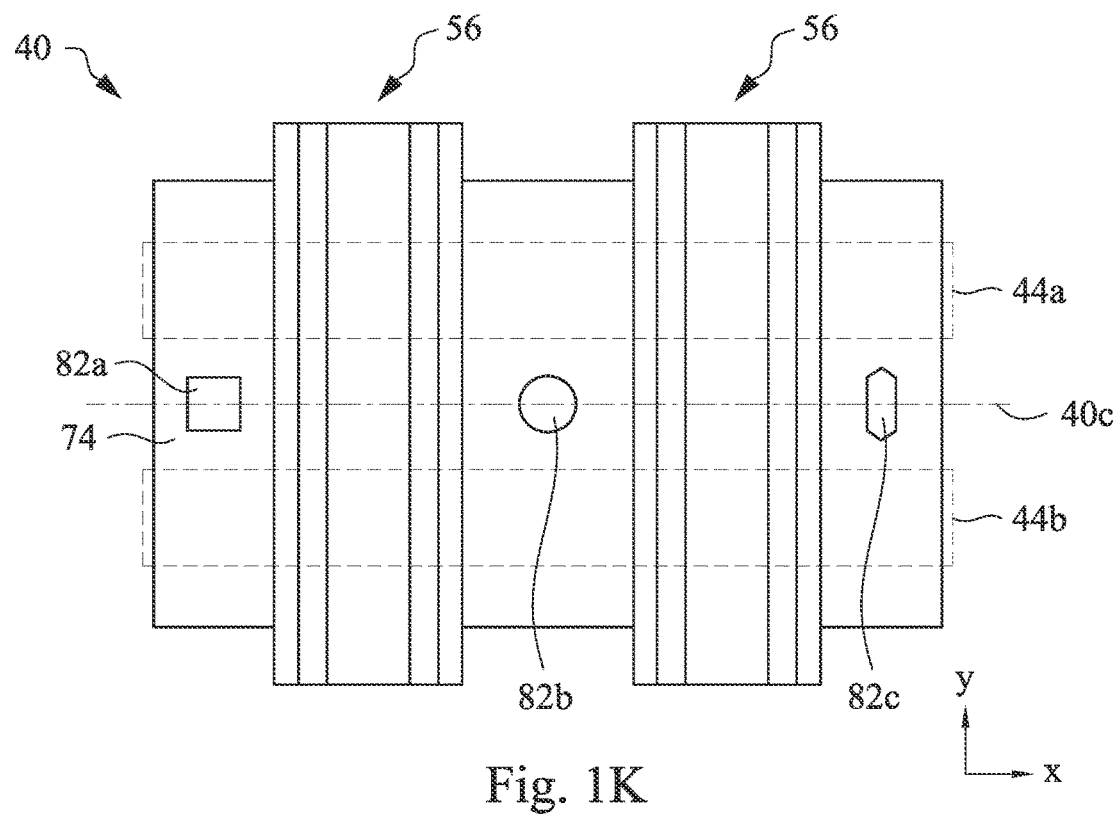

FIGS. 1J and 1K are schematic layout views of the semiconductor device 40 showing various positions and shapes of the voids 82 in the merged epitaxial source/drain features 74. As shown in FIG. 1J, the voids 82 may extend along the x-direction across the merged epitaxial source/drain features 74. Alternatively, the voids 82 may be located in a central portion of the epitaxial source/drain features 74. As shown in FIG. 1K, voids 82a, 82b, 82c of various cross-sectional shapes in the x-y plane are located within the epitaxial source/drain features 74. Particularly, a void with a triangle shaped cross section in the y-z plane (shown in FIG. 1G) may have a square or rectangular shaped cross section in the x-y plane as shown in the void 82a in FIG. 1K. A void with a cone or hyperbolic shaped cross section in the y-z plane (shown in FIG. 1G) may have an oval or circular shaped cross section in the x-y plane as shown in the void 82b in FIG. 1K. A void with an oval or elliptical shaped cross section in the y-z plane (shown in FIG. 1G) may have a hexagonal shaped cross section in the x-y plane as shown in the void 82c in FIG. 1K.

Figure 1L:
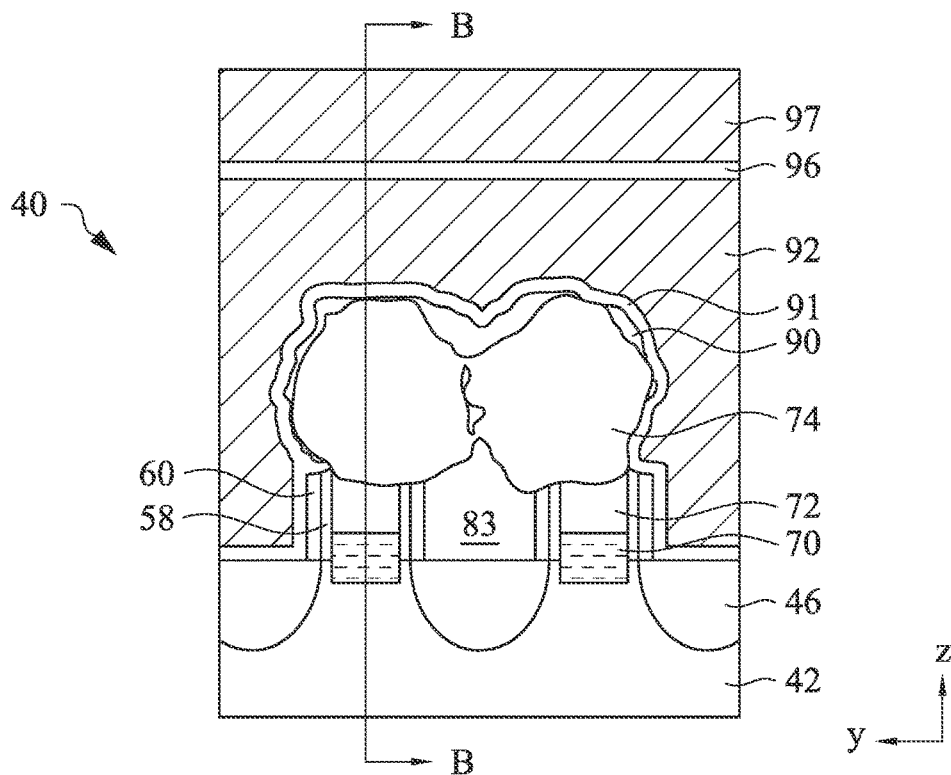
Figure 1M:
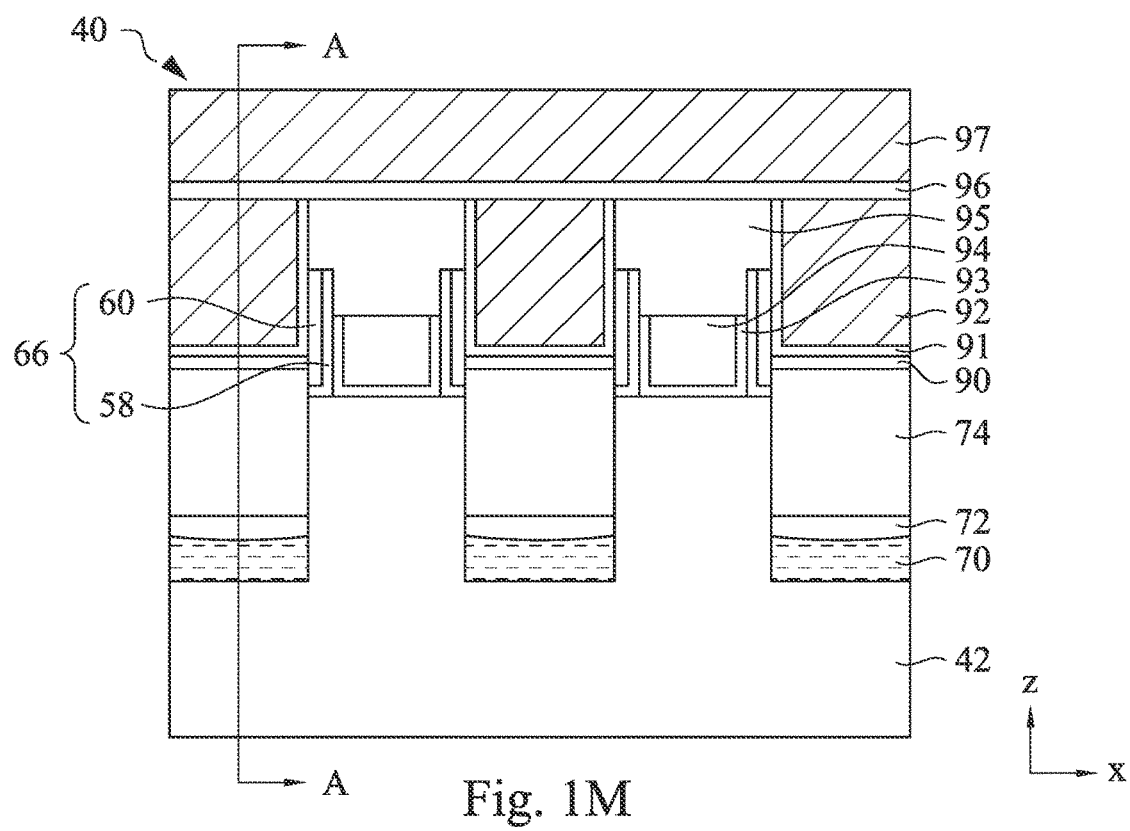

At operation 24, an epitaxial cap layer 90 is formed over the epitaxial source/drain features 74, as shown in FIGS. 1L and 1M. FIG. 1L is a sectional view of the semiconductor device 40 along the line A-A in FIG. 1M. FIG. 1M is a sectional view of the semiconductor device 40 along the line B-B in FIG. 1L.

The epitaxial cap layer 90 is formed on the exposed surfaces of the epitaxial source/drain features 74. The epitaxial cap layer 90 may be formed by any suitable method, such as by CVD, CVD epitaxy, molecular beam epitaxy (MBE), or any suitable deposition technique. The epitaxial cap layer 90 may include one or more layers of Si, SiP, SiC and SiCP. The epitaxial cap layer 90 also include n-type dopants, such as phosphorus (P), arsenic (As), etc. In some embodiments, the epitaxial cap layer 90 may be a Si layer including phosphorus dopants. In some embodiments, the epitaxial cap layer 90 includes a dopant concentration of between about 1E21 atoms/cm$^3$ and about 2E21 atoms/cm$^3$.

The epitaxial cap layer 90 may have a thickness along the z-direction in a range between about 3 nm and about 10 nm. The epitaxial cap layer 90 maintains a wavy shape over the top surface 76 of the merged epitaxial source/drain feature 74.

In some embodiments, the epitaxial cap layer 90 may be grown in an epitaxial chamber by a suitable process. For example, the epitaxial cap layer 90 is formed by a selective etching growth process, in which a thin film is deposited by introducing a reactant gas including deposition agent and etchant together. In some embodiments, an optional etching process may be performed to achieve desired shape and/or thickness of the epitaxial layer being formed. The epitaxial deposition may be performed at a temperature in a range between about 650° C. and 750° C., under a pressure in a range between about 100 and 600 Torr, and performed for a time duration in a range between about 20 seconds and 100 seconds, by using a Si containing gas such as $SiH_4$, $Si_2H_6$, and $SiCl_2H_2$, a dopant gas, such as $PH_3$, and $AsH_3$, and HCl, and a carrier gas, such as $H_2$. In some embodiments, the reactant gas may include $SiCl_2H_2$ at a flow rate in a range between 200 sccm and 500 sccm, $PH_3$ at a flow rate in a range between 20 sccm and 80 sccm, HCl at a flow rate in a range between 50 sccm and 100 sccm, and $H_2$ at a flow rate in a range between 2000 sccm and 6000 sccm. In some embodiments, an optional etch process following the epitaxial deposition may be performed at a temperature in a range between about 700° C. and 780° C., under a pressure in a range between about 5 and 50 Torr, and performed for a time duration in a range between about 10 seconds and 80 seconds, by using an etchant, including HCl and $GeH_4$. In some embodiments, the etchant may include HCl at a flow rate in a range between 1000 sccm and 2000 sccm, and $GeH_4$ at a flow rate in a range between 100 sccm and 400 sccm. The etchant may include a carrier gas, such as $H_2$.

In some embodiments, the epitaxial deposition at operations 18, 20, 22, and 24 may be performed in the same epitaxial deposition chamber.

At operation 26, a contact etch stop layer (CESL) 91 and an interlayer dielectric (ILD) layer 92 are formed over the semiconductor device 40, as shown in FIGS. 1L and 1M. The CESL 91 is conformally formed over exposed surfaces of the semiconductor device 40. The CESL 91 is formed on the epitaxial cap layer 90, the gate sidewall spacers 66, the fin sidewall spacers 62a, 62b, and the isolation layer 46 if exposed. The CESL 91 may include SiN, SiON, SiCN or any other suitable material, and may be formed by CVD, PVD, or ALD.

The interlayer dielectric (ILD) layer 92 is formed over the CESL 91. The materials for the ILD layer 92 include compounds comprising Si, O, C, and/or H, such as silicon oxide, SiCOH and SiOC. Organic materials, such as polymers, may be used for the ILD layer 92. In some embodiments, the ILD layer 92 may be formed by flowable CVD (FCVD). The ILD layer 92 protects the epitaxial source/drain features 74 during the removal of the sacrificial gate structures 56.

At operation 28, replacement gate structures are formed, as shown in FIGS. 1L and 1M. The sacrificial gate dielectric layer 48 and sacrificial gate electrode layer 50 are removed by one or more suitable process, such as dry etch, wet etch, or a combination thereof, to expose the fin structures 44. In some embodiments, a wet etchant such as a tetramethylammonium hydroxide (TMAH) solution is used. The replacement gate structure may include a gate dielectric layer 93, and a gate electrode layer 94. Optionally, the replacement gate structure may include a self-aligned contact (SAC) layer 95.

The gate dielectric layer 93 may be conformally deposited on exposed surfaces in the gate cavities. The gate dielectric layer 93 may have different composition and dimensions for N-type devices and P-type devices and are formed separately using patterned mask layers and different deposition recipes. The gate dielectric layer 93 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 93 may be formed by CVD, ALD or any suitable method.

The gate electrode layer 94 is then formed on the gate dielectric layer 93 to fill the gate cavities. The gate electrode layer 94 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 94 may be formed by CVD, ALD, electroplating, or other suitable method. After the formation of the gate electrode layer 94, a planarization process, such as a CMP process, is performed to remove excess deposition of the gate electrode material and expose the top surface of the ILD layer 92.

In some embodiments, a metal gate etching back (MGEB) process is performed to form the self-aligned contact (SAC) layer 95. One or more etching processes are performed to remove portions of the gate dielectric layer 93 and the gate electrode layer 94 to form trenches in the region above the remaining gate electrode layer 94. The MGEB process may be a plasma etching process employing one or more etchants such as chlorine-containing gas, a bromine-containing gas, and/or a fluorine-containing gas. The etching process allows the gate dielectric layer 93 and the gate electrode layer 94 to be selectively etched from the ILD layer 92 and the CESL 91.

In the MGEB process, the gate dielectric layer 93 and gate electrode layer 94 are etched back to a level lower than a top surface of high-k dielectric features formed on hybrid fins (not shown) parallel to the fin structures 44. In some embodiments, the gate sidewall spacers 66 are also etched back to a level be lower than the CESL 91 and higher than the gate electrode layer 94.

In some embodiments, a metal gate liner, not shown, may be first deposited on exposed surfaces in the trenches above the gate electrode layer 94 prior to depositing the SAC layer 95. The metal gate liner and the SAC layer 95 may be formed by a suitable deposition process, such as CVD, PVD, or ALD. The metal gate liner may function as a diffusion barrier for the gate electrode layer 94. The metal gate liner may be a dielectric layer including but not limited to SiO, SiN, SiC, SiCN, SiOC, SiON, SiOCN, ZrO, ZrN, or a combination thereof. The SAC layer 95 may be any dielectric layer that can be used as an etch stop layer during subsequent trench and via patterning for metal contacts. In some embodiments, the SAC layer 95 may a high-k dielectric layer. The SAC layer 95 may be a dielectric layer including but not limited to SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or any combinations thereof.

After filling the trenches with the SAC layer 95, a planarization process, such as a CMP process, is performed to remove excess deposition of the SAC layer 95 and metal gate liner to expose the top surface of the ILD layer 92.

At operation 30, an etch stop layer 96 and an interlayer dielectric (ILD) layer 97 are formed over the semiconductor device 40, as shown in FIGS. 1L and 1M. In some embodiments, the etch stop layer 96 may be conformally formed over the semiconductor device 40 by a blanket deposition. The etch stop layer 96 may include SiN, SiON, SiCN or any other suitable material, and may be formed by CVD, PVD, or ALD. The ILD layer 97 is formed over the etch stop layer 96. The materials for the ILD layer 97 may include compounds comprising Si, O, C, and/or H, such as silicon oxide, SiCOH and SiOC. Organic materials, such as polymers, may be used for the ILD layer 97. In some embodiments, the ILD layer 97 may be formed by flowable CVD (FCVD).

Figure 1N:
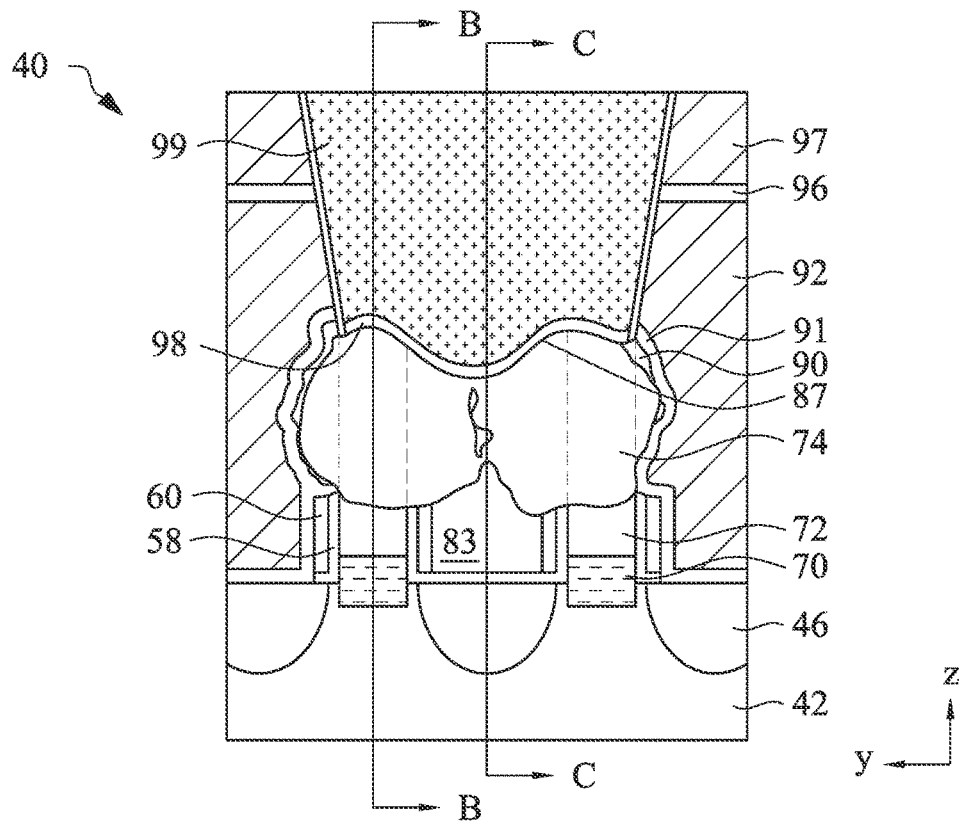
Figure 1O:
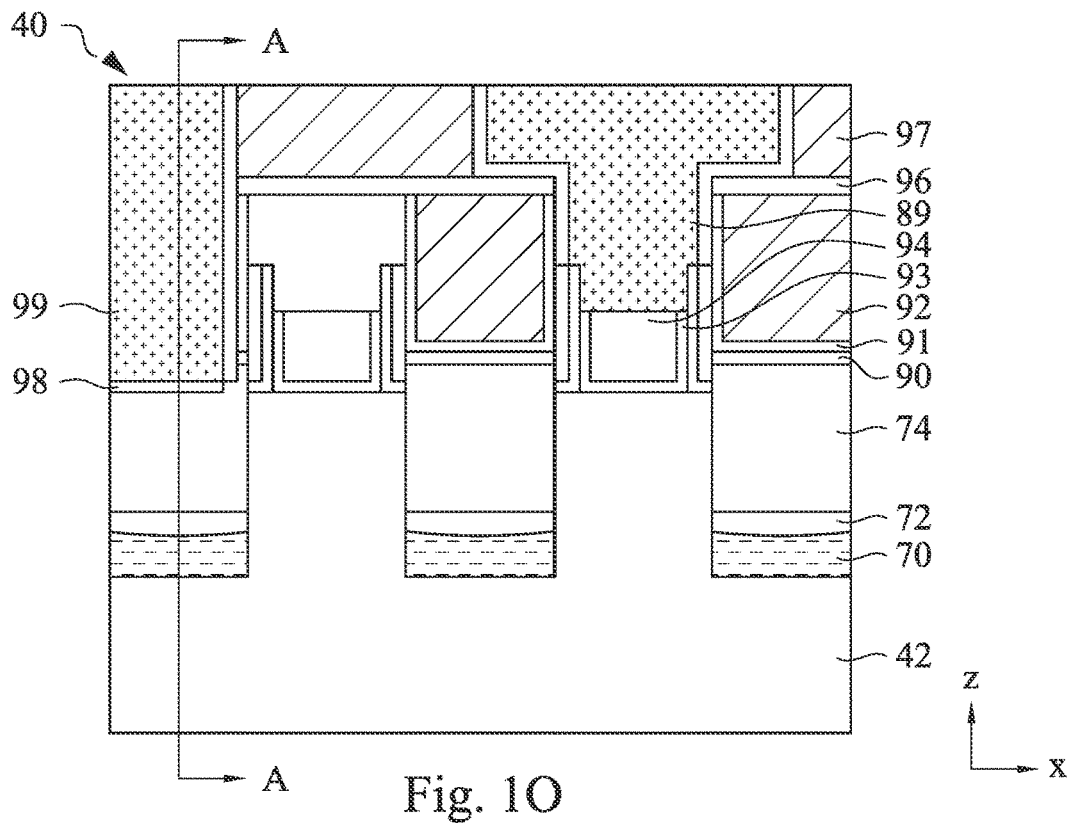
Figure 1P:
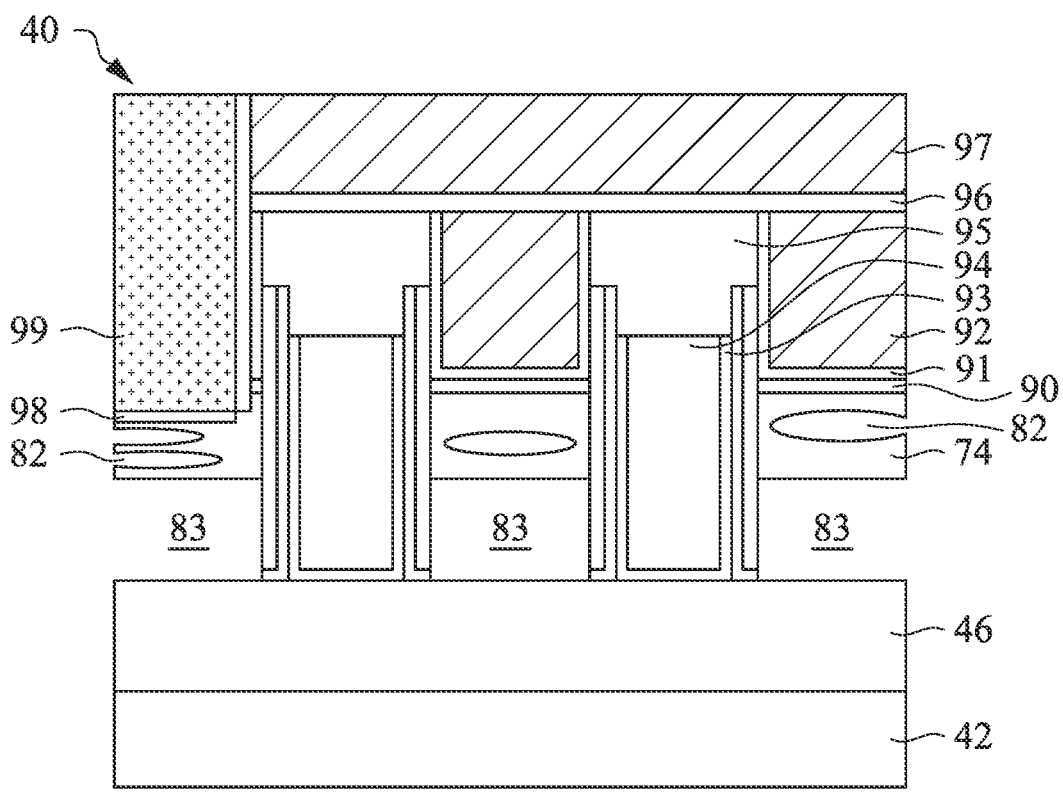

At operation 32, source/drain contact features 99 and gate contact features 89 are formed as shown in FIGS. 1N, 1O, and 1P. FIG. 1N is a sectional view of the semiconductor device 40 along the line A-A in FIG. 1O. FIG. 1O is a sectional view of the semiconductor device 40 along the line B-B in FIG. 1N. FIG. 1P is a sectional view of the semiconductor device 40 along the line C-C in FIG. 1N.

Contact holes for the source/drain contact features 99 and gate contact features 89 are formed by one or more patterning and suitable etching processes. Contact holes for the gate contact features 89 may be formed by one or more patterning and suitable etching process to remove the ILD layer 97, the etch stop layer 96, and the SAC layer 95.

Contact holes for source/drain contact features 99 may be formed by one or more patterning and etch processes to remove the ILD layer 97, the etch stop layer 96, the ILD layer 92, and the CESL 91 to expose a contact surface 87 on the epitaxial source/drain features 74. In some embodiments, at least a portion of the epitaxial cap layer 90 is removed to expose the epitaxial source/drain feature 74 below. In some embodiments, a portion of the epitaxial source/drain feature 74 is removed so that the contact surface 87 lands at below the upper merge point 80 (shown in FIG. 1I) to land within the merged portion of the epitaxial source/drain features 74a, 74b. Particularly, the source/drain contact holes may be formed to have the contact surface 87 located at a level between the upper merge point 80 and the lower merge point 84 to land the contact surface 87 within the merged portion of the epitaxial source/drain feature 74. Landing the source/drain contact hole in the merged portion of the epitaxial source/drain feature 74 increases total exposed areas of the merged epitaxial source/drain feature 74, thus, increasing contact areas and reducing contact resistance. As discussed in FIG. 1I, the merged epitaxial source/drain features 74 according to the present disclosure has increased merged portion along the z-direction, thus providing an increased landing window for the source/drain contact holes.

After formation of the source/drain contact holes, a silicide layer 98 is selectively formed over an exposed surface of the epitaxial source/drain features 74 exposed by the source/drain contact holes. In some embodiments, the silicide layer 98 is formed on the contact surface 87. In some embodiments, the silicide layer 98 includes one or more of WSi, CoSi, NiSi, TiSi, MoSi, and TaSi.

The source/drain contact features 99 and gate contact features 89 are then formed by filling a conductive material in the source/drain contact holes and gate contact holes. In some embodiments, the conductive material layer for the gate contact may be formed by CVD, PVD, plating, ALD, or other suitable technique. In some embodiments, the conductive material for the source/drain contact features 99 and the gate contact features 89 includes TiN, TaN, Ta, Ti, Hf, Zr, Ni, W, Co, Cu, Ag, Al, Zn, Ca, Au, Mg, Mo, Cr, or the like. Subsequently, a CMP process is performed to remove a portion of the conductive material layer above a top surface of the ILD layer 97. As shown in FIG. 1N, the source/drain contact feature 99 contacts the epitaxial source/drain feature 74 at the merged portion, thus, with increased contact area. As shown in FIG. 1P, the source/drain contact feature 99 may be formed over the voids 82.

The semiconductor device 40 discussed above includes FinFET structures. Embodiments of the present disclosure may be used in any suitable structures. FIGS. 2-4, 5A-5B, 6A-6B, 7A-7B, 8A-8B, 9A-9B, 10A-10B, 11A-11E, 12A-12B, 13A-13B, 14A-14B, 15A-15B, 16A-16B, 17A-17B, and 18A-18C include methods and schematic views of manufacturing a semiconductor device including GAA structures.

Figure 2:
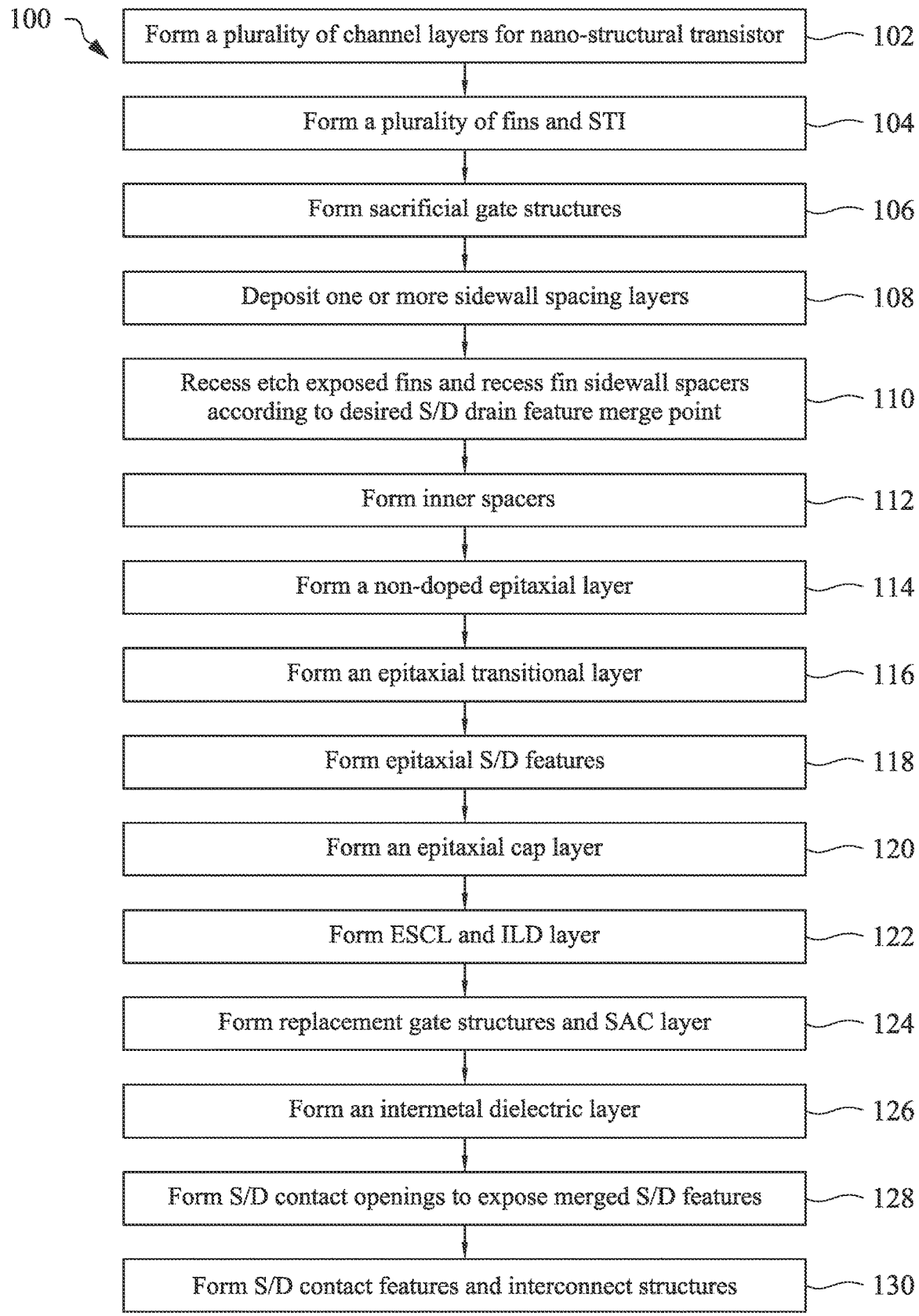
FIG. 2 is a flow chart of a method for manufacturing of a semiconductor device according to embodiments of the present disclosure.
Figure 3:
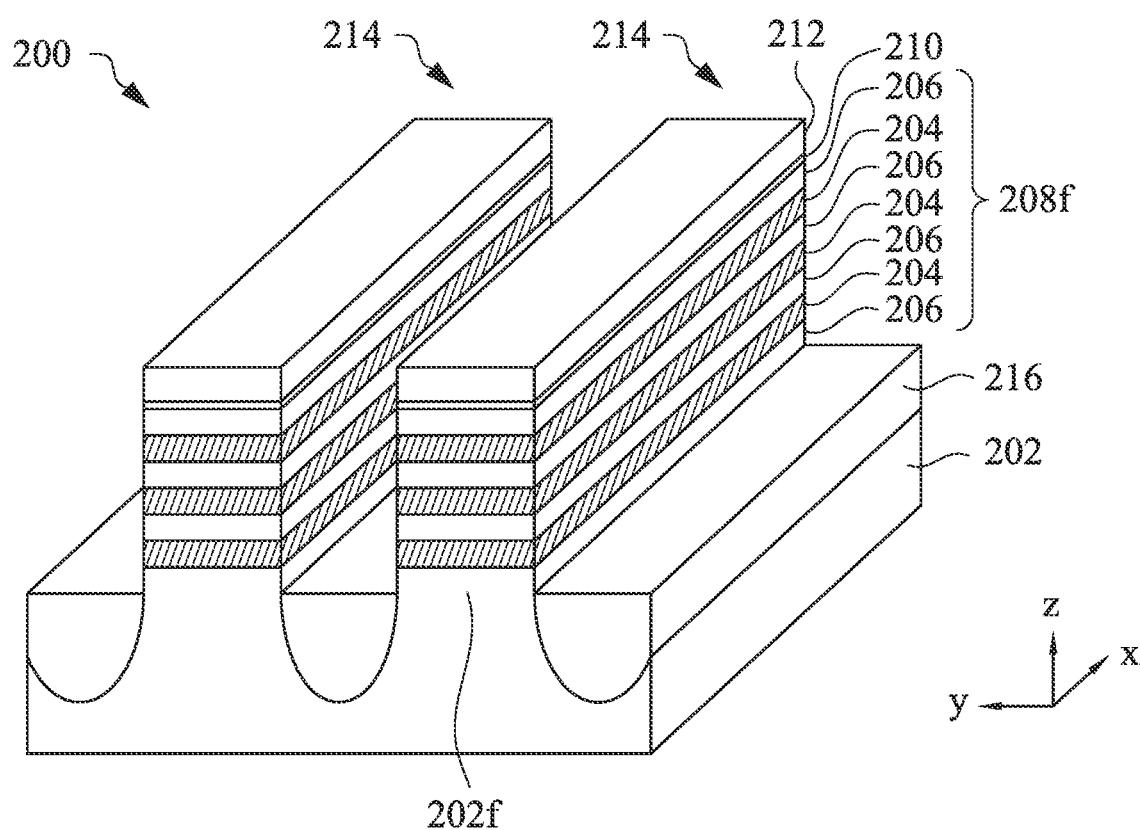
FIGS. 3 to 4, 5A-5B, 6A-6B, 7A-7B, 8A-8B, 9A-9B, 10A-10B, 11A-11E, 12A-12B, 13A-13B, 14A-14B, 15A-15B, 16A-16B, 17A-17B, and 18A-18C schematically illustrate various stages of manufacturing a semiconductor device according to embodiments of the present disclosure.
Figure 4:
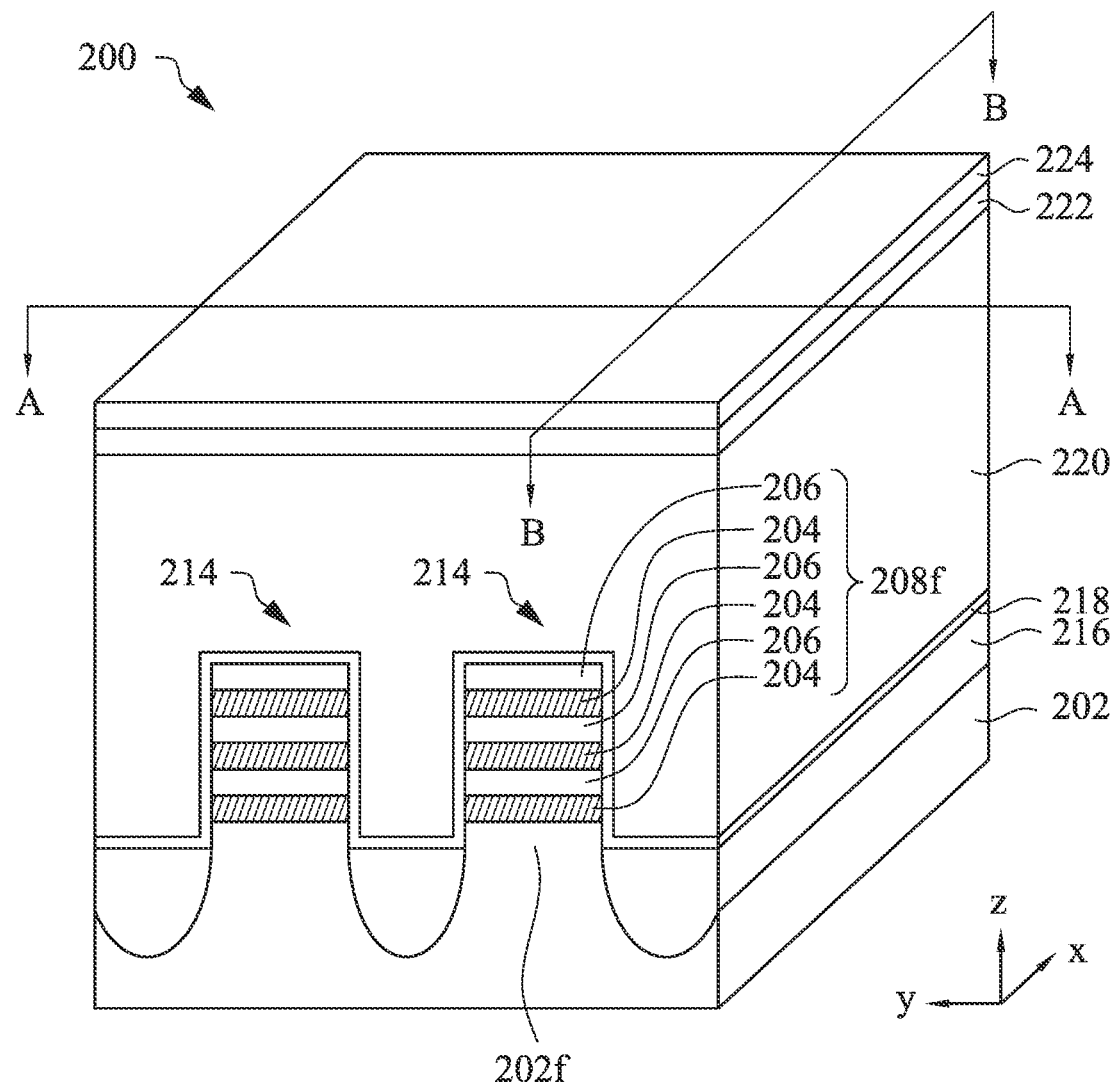

FIG. 2 is a flow chart of a method 100 for manufacturing of a semiconductor device according to embodiments of the present disclosure. FIGS. 3-4, 5A-5B, 6A-6B, 7A-7B, 8A-8B, 9A-9B, 10A-B, 11A-11E, 12A-12B, 13A-13B, 14A-14B, 15A-15B, 16A-16B, 17A-17B, and 18A-18C schematically illustrate various stages of manufacturing a semiconductor device 200 according to embodiments of the present disclosure. Particularly, the semiconductor device 200 may be manufactured according to the method 100 of FIG. 2. FIGS. 3-4 are schematic side views of various stages of the semiconductor device 200 during fabrication.

At operation 102 of the method 100, a plurality of channel layers and a plurality of semiconductor layers for multi-channel transistors, such as nanostructure transistors, are formed. A substrate 202 is provided to form the semiconductor device 200 thereon. The substrate 202 may include a single crystalline semiconductor material such as, but not limited to Si, Ge, SiGe, GaAs, InSb, GaP, GaSb, InAlAs, InGaAs, GaSbP, GaAsSb, and InP. The substrate 202 may include various doping configurations depending on circuit design. For example, the substrate 202 may one or more p-doped regions and one or more n-doped regions. In some embodiments, the substrate 202 is a silicon (100) substrate.

In the example of FIG. 3, only a portion of the substrate 202 where a N-type device is to be formed is shown. It should be noted that the substrate 202 includes other portions where other devices, such as p-type devices, resistors, capacitors, and other suitable devices in an IC are to be formed.

At operation 102, a semiconductor stack 208 including alternating semiconductor layers 204 and semiconductor channel layers 206 are formed on the substrate 202. The semiconductor layers 204 and semiconductor channel layers 206 have different compositions. In some embodiments, the semiconductor layer 204 and the semiconductor channel layer 206 have different oxidation rates and/or different etch selectivity. In later fabrication stages, portions of the semiconductor channel layers 206 form nanostructure channels in a multi-gate device. Three semiconductor layers 204 and three semiconductor channel layers 206 are alternately arranged as illustrated in FIG. 3 as an example. More or less semiconductor layers 204 and semiconductor channel layers 206 may be included depending on the desired number of channels in the semiconductor device to be formed. In some embodiments, the number of semiconductor layers 204 and the semiconductor channel layers 206 is between 1 and 10.

When n-type devices are to be formed over the substrate 202, the semiconductor layer 204 may include silicon germanium (SiGe) and the semiconductor channel layer 206 may include silicon. The semiconductor layer 204 may be a SiGe layer including more than 25% Ge in molar ratio. For example, the semiconductor layer 204 may be a SiGe layer including Ge in a molar ratio in a range between 25% and 50%. In some embodiments, the semiconductor channel layer 206 may be a Ge layer. The semiconductor channel layer 206 may include n-type dopants, such as phosphorus (P), arsenic (As), etc.

The semiconductor layers 204 and the semiconductor channel layers 206 may be formed by a molecular beam epitaxy (MBE) process, a metal organic chemical vapor deposition (MOCVD) process, and/or other suitable epitaxial growth processes.

A pad layer 210 and a mask layer 212 may be formed over the semiconductor stack 208 for fin formation. The pad layer 210 may be a thin film including silicon oxide formed, for example, using a thermal oxidation process. In some embodiments, the mask layer 212 is formed of silicon nitride, for example, using low-pressure chemical vapor deposition (LPCVD). The pad layer 210 may act as an adhesion layer between the semiconductor stack 208 and the mask layer 212. The pad layer 210 may also act as an etch stop layer for etching the mask layer 212.

At operation 104, fin structures 214 are formed and an isolation layer 216 is formed in the trenches between the fin structures 214, as shown in FIG. 3. The fin structures 214 may be formed by depositing and patterning a photoresist layer (not shown) over the mask layer 212. The patterned photoresist layer may be used to pattern the mask layer 212. The fin structures 214 are then formed using one or more etching processes using the patterned mask layer 212 as an etching mask. The fin structures 214 may be formed by the etching through the semiconductor stack 208 and a portion of the substrate 202. As shown in FIG. 3, each fin structure 214 may include a nanostructure portion 208$f$ and a well portion 202$f$ formed in the substrate 202.

The isolation layer 216 is formed in the trenches between the fin structures 214 by a suitable deposition followed by an etch back process. In some embodiments, a semiconductor liner (not shown) may be formed over exposed portions of the fin structures 214 and the mask layers (not shown) over the fin structures 214 prior to deposition and etching back of the isolation layer 216. The isolation layer 216 may be formed by a high-density plasma chemical vapor deposition (HDP-CVD), a flowable CVD (FCVD), or other suitable deposition process. In some embodiments, the isolation layer 216 may include silicon oxide, silicon nitride, silicon oxynitride, fluorine-doped silicate glass (FSG), a low-k dielectric, combinations thereof. In some embodiments, the isolation layer 216 is formed to cover the fin structures 214 by a suitable deposition process to fill the trenches between the fin structures 214, a planarization process may be performed to expose the topmost semiconductor channel layer 206 and then recess etched using a suitable anisotropic etching process to expose the nanostructure portion 208$f$ of the fin structures 214, as shown in FIG. 3.

Figure 5A:
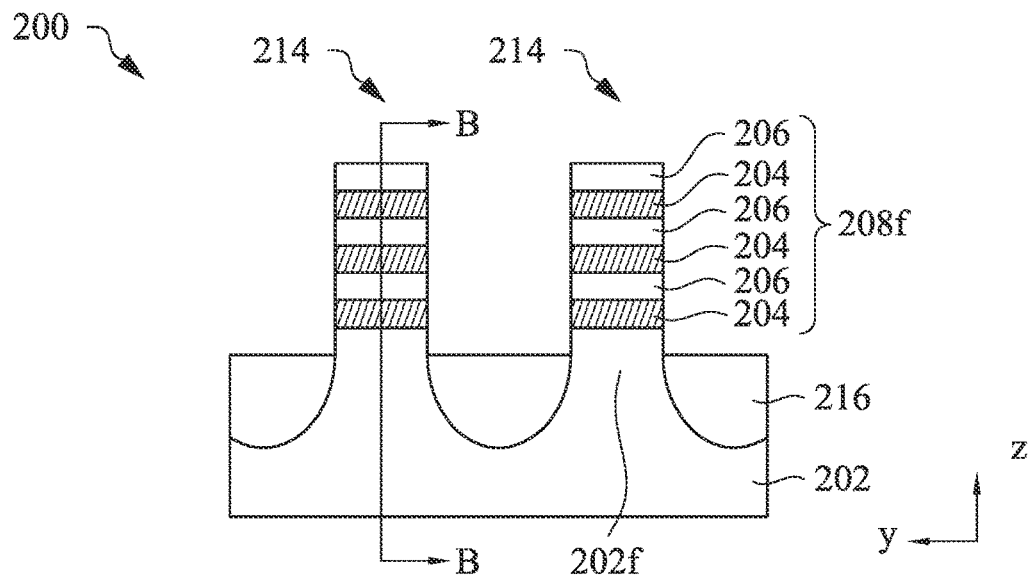
Figure 5B:
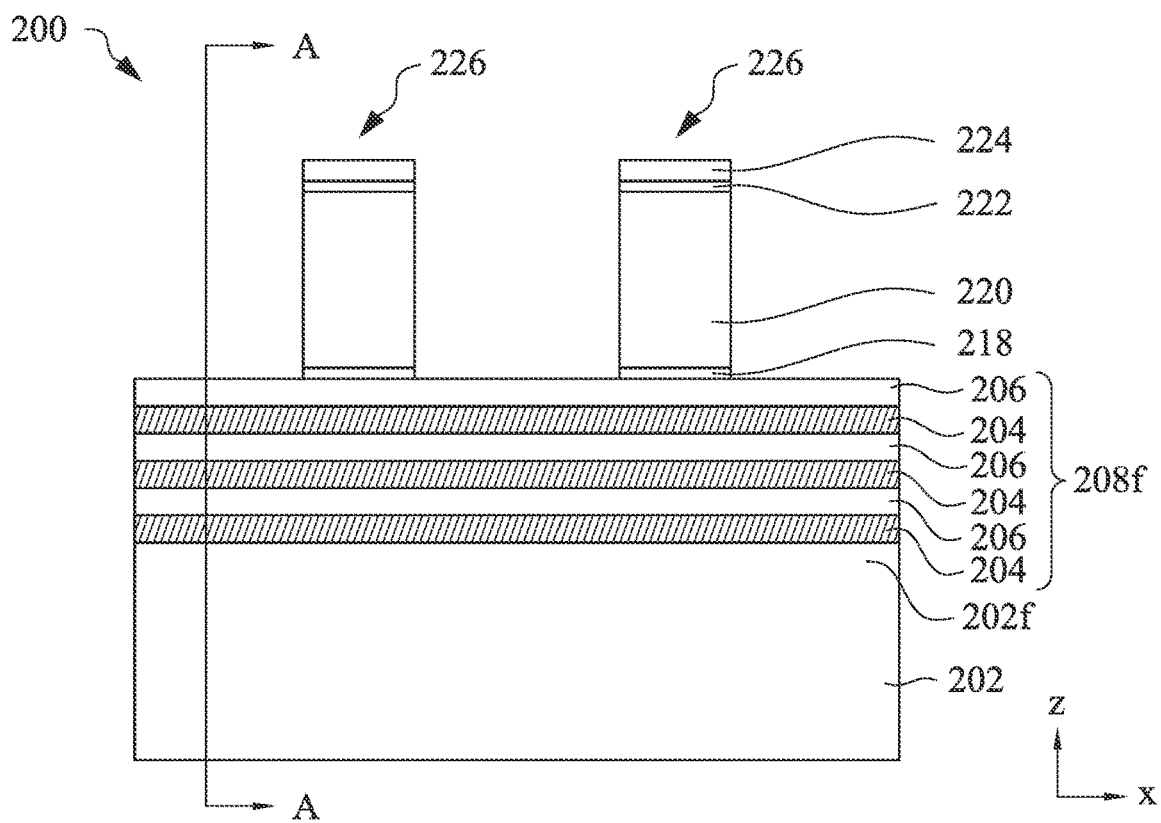

At operation 106, sacrificial gate structures 226 are formed as shown in FIG. 4 and FIGS. 5A-5B. FIG. 5A is a sectional view of the semiconductor device 200 along the line A-A in FIG. 4 and FIG. 5B. FIG. 5B is a sectional view of the semiconductor device 200 along the line B-B in FIG. 4 and FIG. 5A.

As shown in FIG. 4, a sacrificial gate dielectric layer 218 is conformally formed over the substrate 202. The sacrificial gate dielectric layer 218 is formed over the fin structures 214 and the isolation layer 216. The sacrificial gate dielectric layer 218 may include silicon oxide, silicon nitride, a combination thereof, or the like. The sacrificial gate dielectric layer 218 may be deposited or thermally grown according to acceptable techniques, such as thermal CVD, CVD, ALD, and other suitable methods.

A sacrificial gate electrode layer 220 is deposited on the sacrificial gate dielectric layer 218 and then planarized, such as by a CMP process. The sacrificial gate electrode layer 220 includes silicon such as polycrystalline silicon, amorphous silicon, poly-crystalline silicon-germanium (poly-SiGe), or the like. In some embodiments, the sacrificial gate electrode layer 220 is subjected to a planarization operation. The sacrificial gate electrode layer 220 may be deposited using CVD, including LPCVD and PECVD, PVD, ALD, or other suitable process.

In some embodiments, a pad layer 222, and a mask layer 224 are sequentially deposited over the sacrificial gate electrode layer 220. The pad layer 222 may include silicon nitride. The mask layer 224 may include silicon oxide. A patterning operation is performed on the mask layer 224, the pad layer 222, the sacrificial gate electrode layer 220, and the sacrificial gate dielectric layer 218 to form the sacrificial gate structures 226 using one or more etching processes, such as one or more plasma etching processes or one or more wet etching processes. In some embodiments, the mask layer 224 and pad layer 222 are first patterned using a patterning process. The sacrificial gate electrode layer 220 is then patterned using the patterned mask layer 224 and pad layer 222 as an etching mask. In some embodiments, the sacrificial gate electrode layer 220 may be etched by an anisotropic etching, such as a reactive ion etching (RIE) process. The anisotropic etching has a greater etching rate along the Z direction than etching rates along the X and Y directions. During the etching of the sacrificial gate electrode layer 220, the sacrificial gate dielectric layer 218 on the fin structures 214 may act as an etch stop to prevent the etchant from removing the fin structures 214.

In some embodiments, after patterning the sacrificial gate electrode layer 220, any exposed residual sacrificial gate dielectric layer 218 is removed by a suitable etch process. In some embodiments, the residual sacrificial gate dielectric layer 218 can be etched by tuning one or more parameters, such as etchant, etching temperature, etching solution concentration, etching pressure, source power, radio frequency (RF) bias voltage, etchant flow rate, of the etch process for etching the sacrificial gate electrode layer 220.

The sacrificial gate structure 226 covers a portion of the fin structures 214. The portion of the fin structures 214 covered by the sacrificial gate structures 226 eventually form a channel region, including one or more channels in a FET device, such as a Fin-FET with a single channel in a fin structure, a nanostructure FET, a GAA FET, or the like.

Figure 6A:
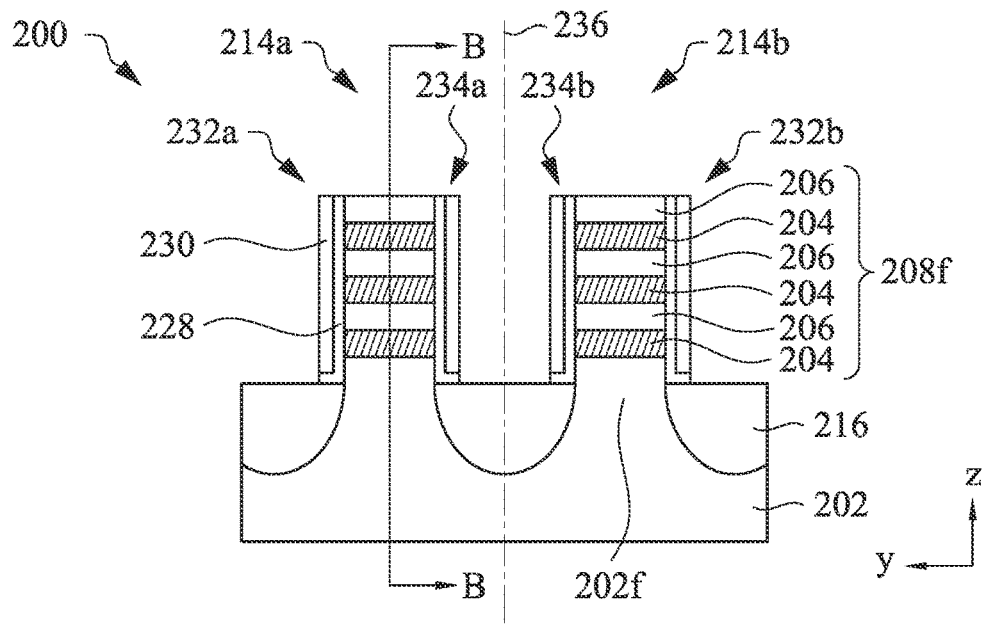
Figure 6B:
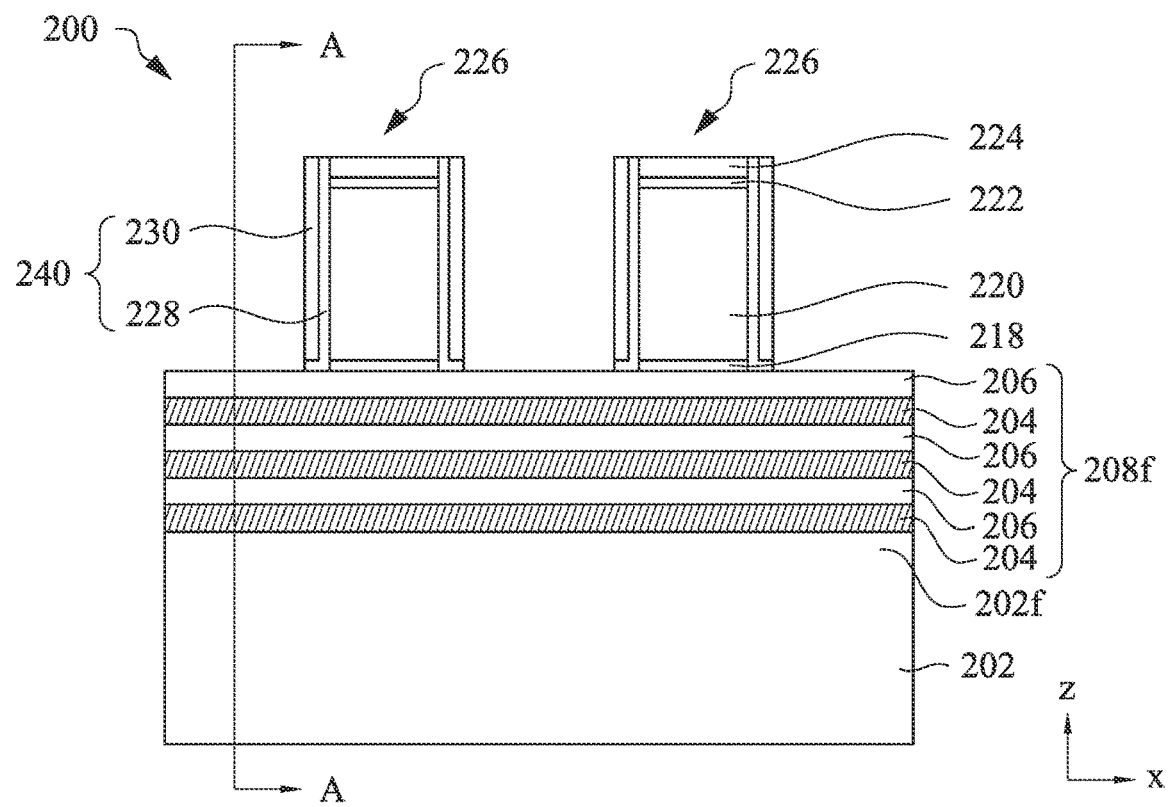

In operation 108, one or more sidewall spacer layers are deposited over the exposed surfaces of the semiconductor device 200 and sidewall spacers are formed, as shown in FIGS. 6A-6B. FIG. 6A is a sectional view of the semiconductor device 200 along the line A-A in FIG. 4 and FIG. 6B. FIG. 6B is a sectional view of the semiconductor device 200 along the line B-B in FIG. 4 and FIG. 6A.

In FIGS. 6A-6B, a spacer layer 228 and a spacer layer 230 may be formed over exposed surfaces of the semiconductor device 200. The spacer layer 228 and the spacer layer 230 may be formed by ALD or CVD, or any other suitable method. The spacer layer 228 may include an oxide material, such as silicon oxide, and the spacer layer 230 may include a nitride material, such as silicon nitride. Alternatively, the spacer layer 230 includes another suitable dielectric material, such as silicon oxide, silicon oxynitride, or combinations thereof. The spacer layer 228 may also comprise another suitable dielectric material.

The spacer layer 228 and spacer layer 230 are formed by a suitable process. For example, the spacer layer 228 and spacer layer 230 are formed by blanket deposition sequentially. In some embodiments, an anisotropic etching may be performed to remove the spacer layer 228 and spacer layer 230 from horizontal surfaces, such that the spacer layer 228 and spacer layer 230 are positioned on sidewalls of the sacrificial gate structures 226. As shown in FIG. 6B, gate sidewall spacers 240 formed on sidewall of the sacrificial gate structures 226. In this example, the gate sidewall spacers 240 include spacer layer 228 and the spacer layer 230. The gate sidewall spacers 240 may have other suitable arrangements and/or compositions.

In some embodiments, the spacer layer 228 and spacer layer 230 may remain on exposed sidewalls of the fin structures 214 forming fin sidewall spacers. In FIG. 6A, the fin structures 214 are denoted as fin structure 214a, 214b respectively. The fin structures 214a, 214b are neighboring fin structures. In some embodiments, the fin structures 214a, 214b are substantially symmetrical to a central line 236. In other words, the fin structures 214a, 214b may be disposed on opposite sides of the central line 236 and at substantially equal distances from the central line 236. The as shown in FIG. 6A, fin sidewall spacers 232a, 234a are formed on sidewalls of the fin structure 214a, and fin sidewall spacers 232b, 234b are formed on sidewalls of the fin structure 214b. The fin sidewall spacers 232a, 232b are formed on outer sidewalls of the fin structures 214a, 214b and the fin sidewall spacers 234a, 234b are formed on inner sidewalls of the fin structures 214a, 214b. In this example, the fin side wall spacers 232a, 234a, 232b, 234b include the spacer layer 228 and the spacer layer 230. The fin side wall spacers 232a, 234a, 232b, 234b may have other suitable arrangements and/or compositions.

Figure 7A:
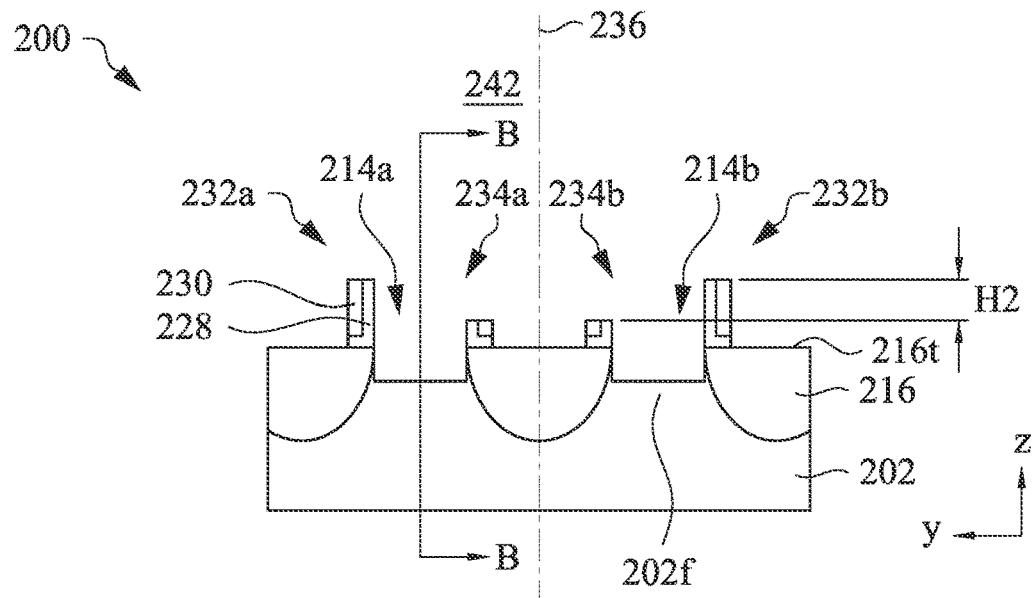
Figure 7B:
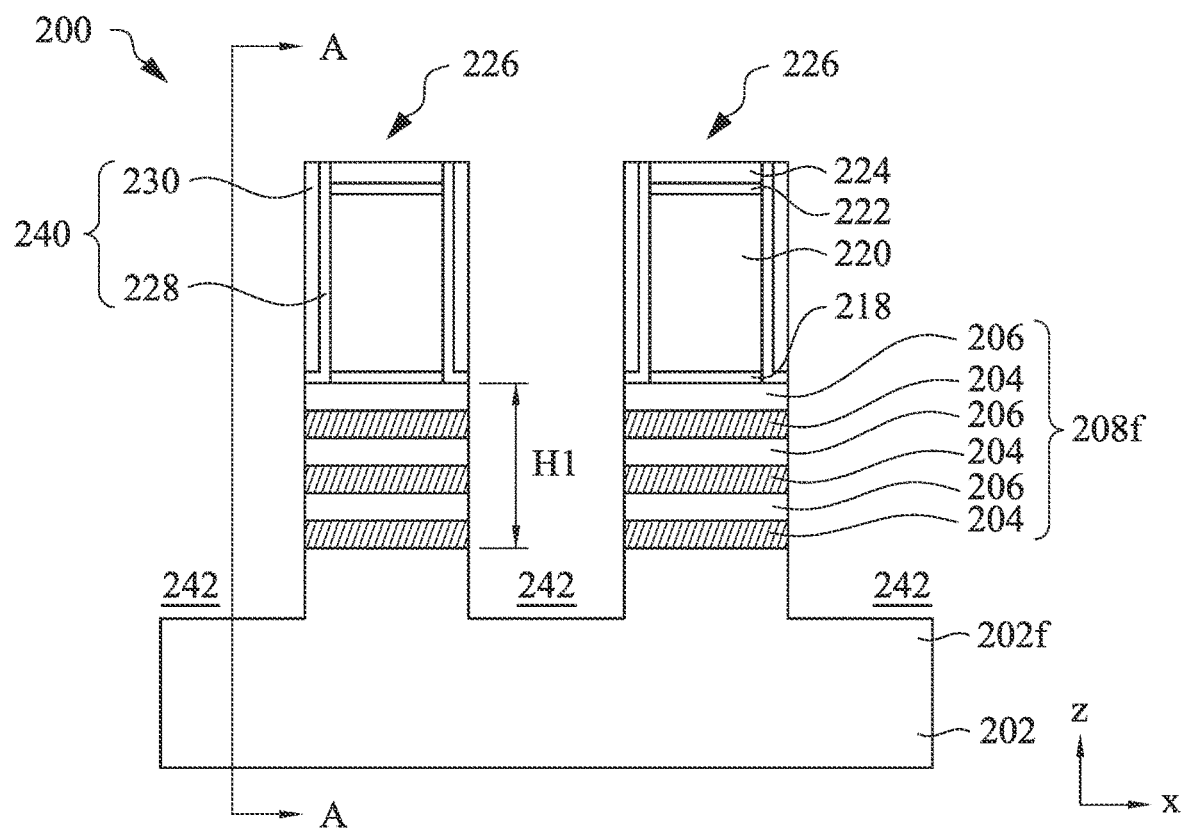

In operation 110, the fin structures 214 in source/drain region, or regions not covered by the sacrificial gate structures 234, 234a, 234b, are recess etched, as shown in FIGS. 7A-7B. FIG. 7A is a sectional view of the semiconductor device 200 along the line A-A in FIG. 4 and FIG. 7B. FIG. 7B is a sectional view of the semiconductor device 200 along the line B-B in FIG. 4 and FIG. 7A. The spacer layer 228 and the spacer layer 230 are also at least partially recessed. In some embodiments, suitable dry etching and/or wet etching may be used to remove the semiconductor channel layers 206, the semiconductor layers 204, together or separately. In some embodiments, the nanostructure portion 208f of the fin structure 214a, 214b are completely removed exposing the well portion 202f of the fin structures 214a, 214b. In some embodiment, a portion of the well portion 202f is also recessed during operation 110. For example, the well portion 202f may be recessed to a level below a top surface 216t of the isolation layer 216. As shown in FIG. 7B, source/drain recesses 242 are formed on both sides of the sacrificial gate structures 226.

In some embodiments, the fin sidewall spacers 234a, 232a, 232b, 234b are partially recessed as shown in FIG. 7A. In some embodiments, the fin sidewall spacers 234a, 232a, 232b, 234b may be recessed during recess etch of the fin structures 214. In other embodiments, the fin sidewall spacers 234a, 232a, 232b, 234b may be removed using a separate process. In some embodiments, heights of the fin sidewall spacers 234a, 232a, 232b, 234b may be controlled to achieve desired shape of the source/drain features to be formed from the fin structures 214. For example, the heights of the fin sidewall spacers 234a, 232a, 232b, 234b, along the z-direction, from a top surface 216t of the isolation layer 216 may be controlled to define critical dimension and/or shape of the source/drain features to be formed. In some embodiments, the heights of the fin sidewall spacers 234a, 232a, 232b, 234b may be set to control location of the merge point the two source/drain features formed from the neighboring fin structures 214a, 214b. For example, the heights of the fin sidewall spacers 234a, 232a, 232b, 234b are used control the level of merge point along the z-direction.

Various factors may be considered when selecting heights of the fin sidewall spacers 234a, 232a, 232b, 234b to achieve desired shape of the source/drain features to be formed, for example, the pitch of the fin structures 214a, 214b, i.e. the distance between the fin structures 214a, 214b along the Y-axis, the width of the fin structures 214a, 214b along the Y-axis, the total height H1 of the semiconductor stack 208, and other relevant geometry and/or material properties of the fin structures 214a, 214b and source/drain structures to be formed.

In some embodiments, the fin sidewall spacers 234a, 232a, 232b, 234b may have the same heights. In other embodiments, the fin sidewall spacers 232a, 234a may have different heights as shown in FIG. 7A. Similarly, the fin sidewall spacers 232b, 234b may also have different heights. In some embodiments, the fin sidewall spacers 234a, 234b are higher than the fin sidewall spacers 232a, 232b. In other embodiments, the fin sidewall spacers 234a, 234b are shorter than the fin sidewall spacers 232a, 232b. In some embodiments, heights of the fin sidewall spacers 234a, 232a, 232b, 234b maybe symmetrical to the central line 236. For example, the fin sidewall spacers 234a, 234b may have substantially the same height and the fin sidewall spacers 232a, 232b may have substantially the same height. In some embodiments, the fin sidewall spacers 232a, 232b and the fin sidewall spacers 234a, 234b may have a height difference H2. The dimension of H2 may vary according to the dimension of the semiconductor device 200. In some embodiment, H2 may be in a range between 5 nm and about 30 nm. In other embodiments, a ratio of H2 over H1 may be in a range between 0.05 and about 0.5.

Figure 8A:
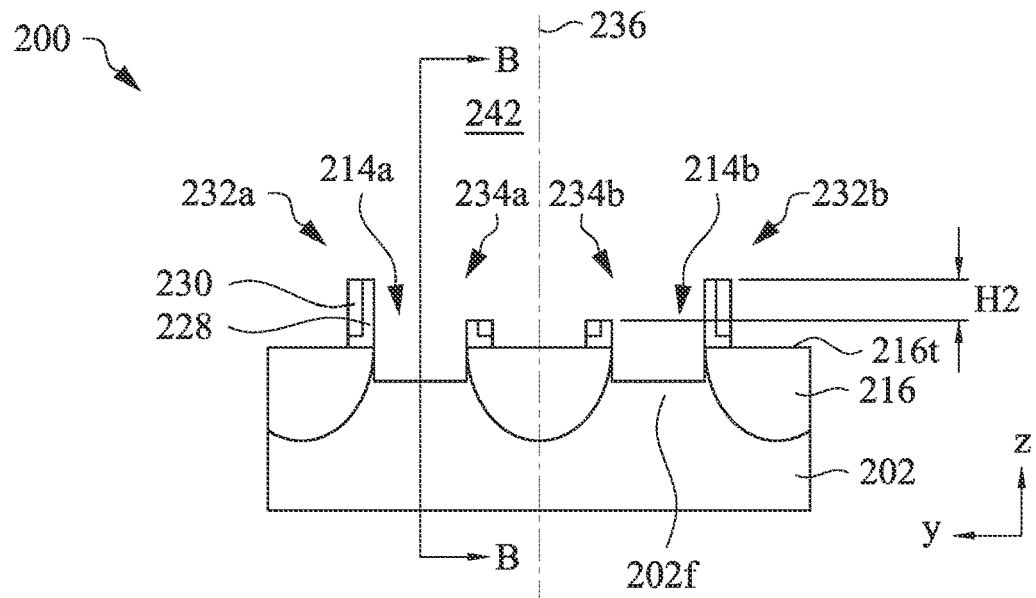
Figure 8B:
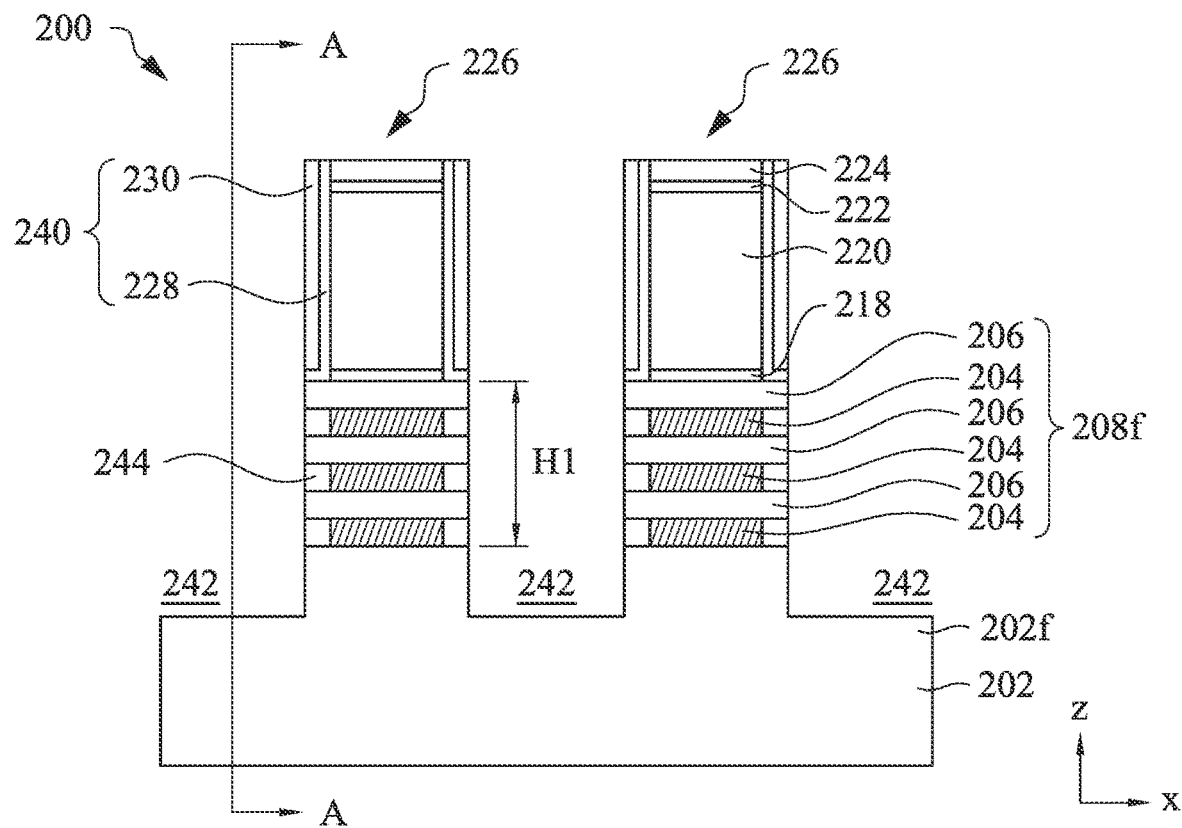

In operation 112, the semiconductor layers 204 under the gate sidewall spacers 240 are recessed etched and inner spacers 244 are formed therein, as shown in FIGS. 8A-8B. FIG. 8A is a sectional view of the semiconductor device 200 along the line A-A in FIG. 4 and FIG. 8B. FIG. 8B is a sectional view of the semiconductor device 200 along the line B-B in FIG. 4 and FIG. 8A.

The semiconductor layers 204 under the gate sidewall spacers 240 are selectively etched along the horizontal direction, or x-direction, to form inner spacer cavities between the semiconductor channel layers 206. In some embodiments, the semiconductor layer 204 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

The inner spacers 244 are formed in the inner spacer cavities by conformally deposit and then partially remove an insulating layer. The insulating layer can be formed by ALD or any other suitable method. The subsequent etch process removes most of the insulating layer except inside the cavities, resulting in the inner spacers 244. In some embodiments, the insulating material of the inner spacers 244 is a silicon nitride-based material, such as SiN, SiON, SiOCN or SiCN and combinations thereof.

Figure 9A:
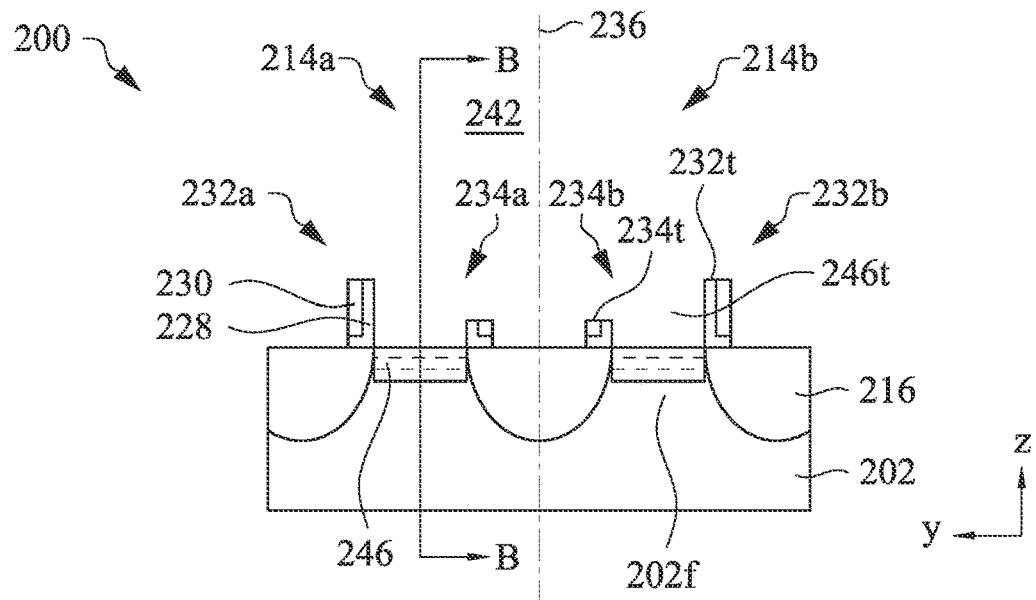
Figure 9B:
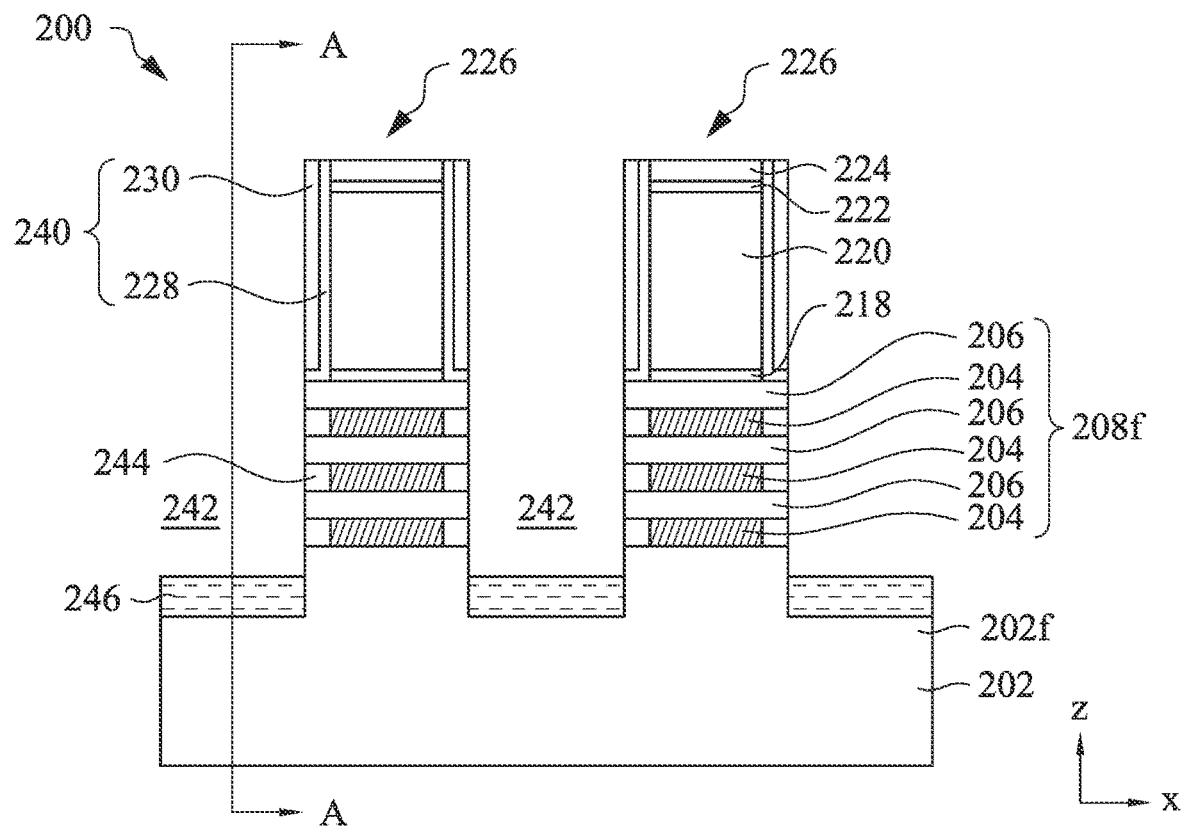

At operation 114, an undoped epitaxial layer 246 is formed from the well portion 202f of the fin structure 214 between the fin sidewall spacers 232a and 234a, and between the fin sidewall spacers 232b and 234b, as shown in FIGS. 9A-9B. FIG. 9A is a sectional view of the semiconductor device 200 along the line A-A in FIG. 4 and FIG. 9B. FIG. 9B is a sectional view of the semiconductor device 200 along the line B-B in FIG. 4 and FIG. 9A.

In some embodiments, a pre-clean process may be performed to remove any undesirable silicon oxide that is formed as a result of the oxidation of the exposed surfaces the source/drain recesses 242. In some embodiments, the pre-clean process may be performed using inductively coupled plasma of a cleaning agent. In some embodiment, the cleaning agent includes Ar, $NF_3$, and $NH_3$. The pre-cleaning process may be performed in a temperature range between about 25° C. and about 250° C. for a time period between 80 seconds and about 400 seconds. Alternatively, the pre-cleaning process may be performed using an HF-based gas or a SiCoNi based gas.

In some embodiments, the undoped epitaxial layer 246 may be an epitaxial silicon layer. The undoped epitaxial layer may be formed by any suitable method, such as by CVD, CVD epitaxy, molecular beam epitaxy (MBE), or any suitable deposition technique.

In some embodiments, the undoped epitaxial layer 246 may be formed to refill the fin structure 214 between the fin sidewall spacers 232a, 234a and between the fin sidewall spacers 232b, 234b. The undoped epitaxial layer 246 may be formed to a level between below the top surface 216t of the isolation layer 216 and below the fin sidewall spacers 234a/234b. For example, the undoped epitaxial layer 246 may level with the top surface 216t of the isolation layer 216 or a bottom of the semiconductor channel layer 206. As shown in FIG. 9A, a top surface 246t of the undoped epitaxial layer 246 is substantially level with a top surface 234t of the fin sidewall spacers 234a, 234b.

Figure 10A:
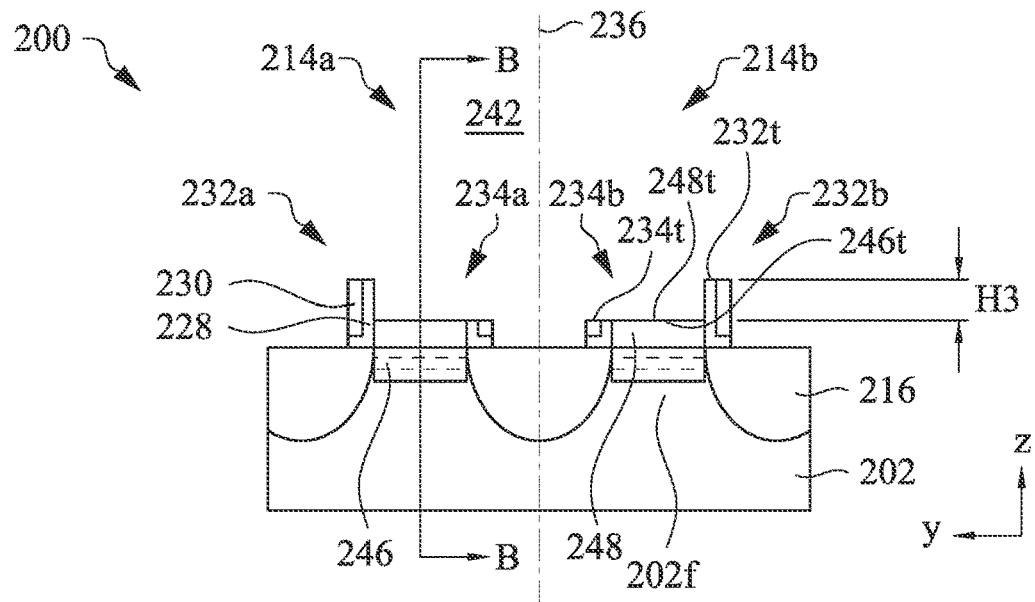
Figure 10B:
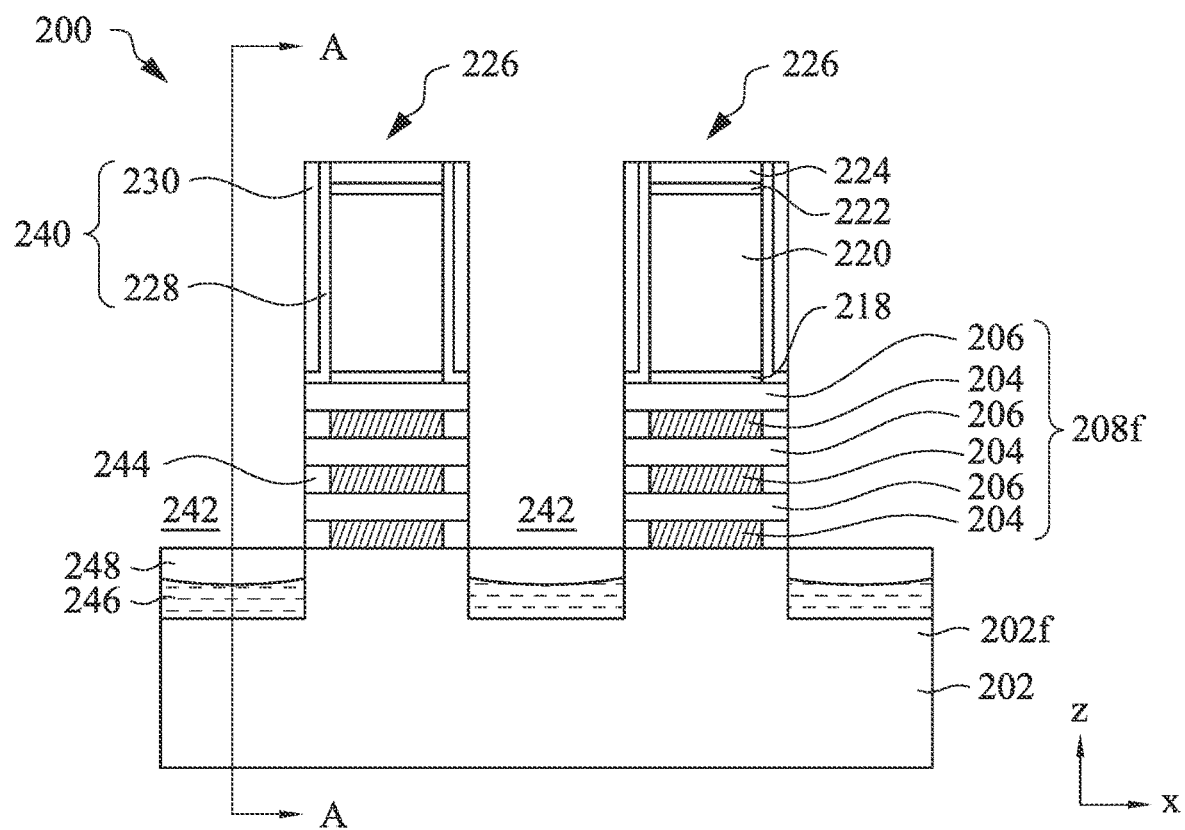

At operation 116, an epitaxial transitional layer 248 is formed over the undoped epitaxial layer 246, as shown in FIGS. 10A-10B. FIG. 10A is a sectional view of the semiconductor device 200 along the line A-A in FIG. 4 and FIG. 10B. FIG. 10B is a sectional view of the semiconductor device 200 along the line B-B in FIG. 4 and FIG. 10A.

The epitaxial transitional layer 248 is formed over the undoped epitaxial layer 246. The epitaxial transitional layer 248 may be formed by any suitable method, such as by CVD, CVD epitaxy, molecular beam epitaxy (MBE), or any suitable deposition technique. The epitaxial transitional layer 248 can serve to gradually change the lattice constant from that of the undoped epitaxial layer 246 to that of the source/drain features to be formed. In some embodiments, the epitaxial transitional layer 248 may be a semiconductor material with a lattice structure similar to the semiconductor material configured to function as a source/drain feature for a n-type device. In some embodiments, the epitaxial transitional layer 248 may be a semiconductor material includes n-type dopants at a dopant concentration lower than a dopant concentration used in a source/drain feature. The epitaxial transitional layer 248 may include one or more layers of Si, SiAs, SiP, SiC and SiCP. The epitaxial transitional layer 248 also include n-type dopants, such as phosphorus (P), arsenic (As), etc. In some embodiments, the epitaxial transitional layer 248 may be a Si layer includes arsenic dopants. In some embodiments, the epitaxial transitional layer 248 includes a dopant concentration in a range between about 15E19 atoms/$cm^3$ and about 5E20 atoms/$cm^3$.

The epitaxial transitional layer 248 may have a thickness H3 in a range between about 3 nm and about 15 nm. If the thickness of the epitaxial transitional layer 248 is below 3 nm, the epitaxial transitional layer 248 may not be thick enough to function as lattice transitional layer between the undoped epitaxial layer 246 and the source/drain features to be formed. If the thickness of epitaxial transitional layer 248 is greater than 15 nm, the epitaxial transitional layer 248 may be in contact with the semiconductor channel layers 206 and affect the device function and without obvious additional advantages for crystalline structural transition. In some embodiments, a top surface 248t of the epitaxial transitional layer 248 is below the semiconductor channel layers 206 of the semiconductor stack 208. In some embodiments, the top surface 248t of the epitaxial transitional layer 248 may be substantially level with a top surface of the higher one of the fin sidewall spacers 232a/232b and 234a/234b. As shown in FIG. 10A, the top surface 248t of the epitaxial transitional layer 248 is substantially level with a top surface 232t of the fin sidewall spacers 232a, 232b. In some embodiments, the height difference between the fin sidewall spacers 232a/232b and 234a/234b, the epitaxial transitional layer 248 may result in the top surface 248t that is lob sided towards the central line 236, enabling formation of merged source/drain features to be formed.

In some embodiments, the epitaxial transitional layer 248 may be grown in an epitaxial chamber by a suitable process. For example, the epitaxial transitional layer 248 is formed by a selective etching growth process, as described with the operation 20 in the method 10.

Figure 11A:
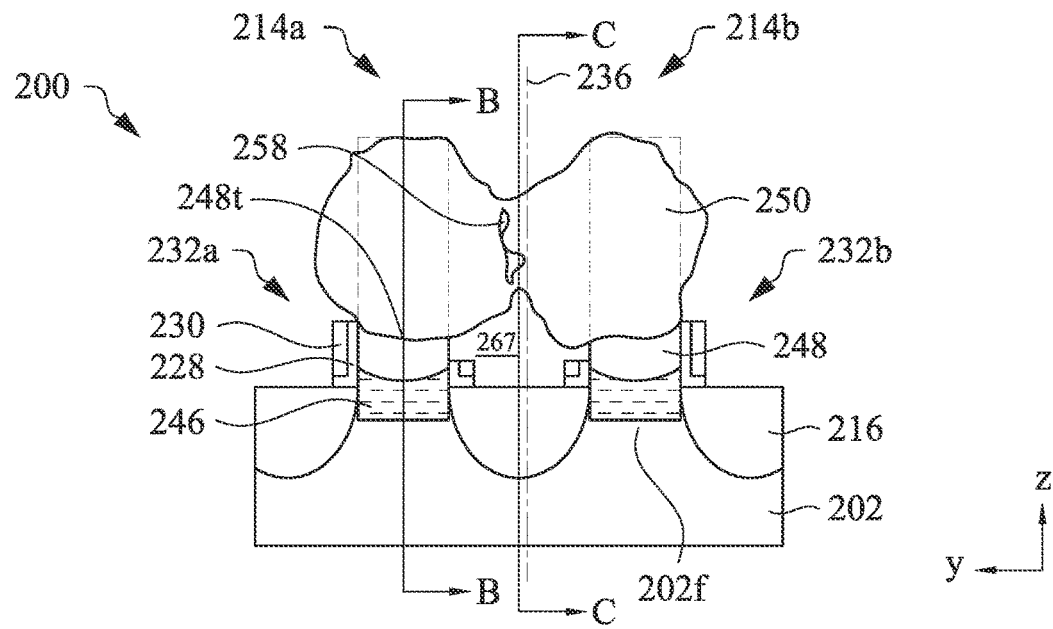
Figure 11B:
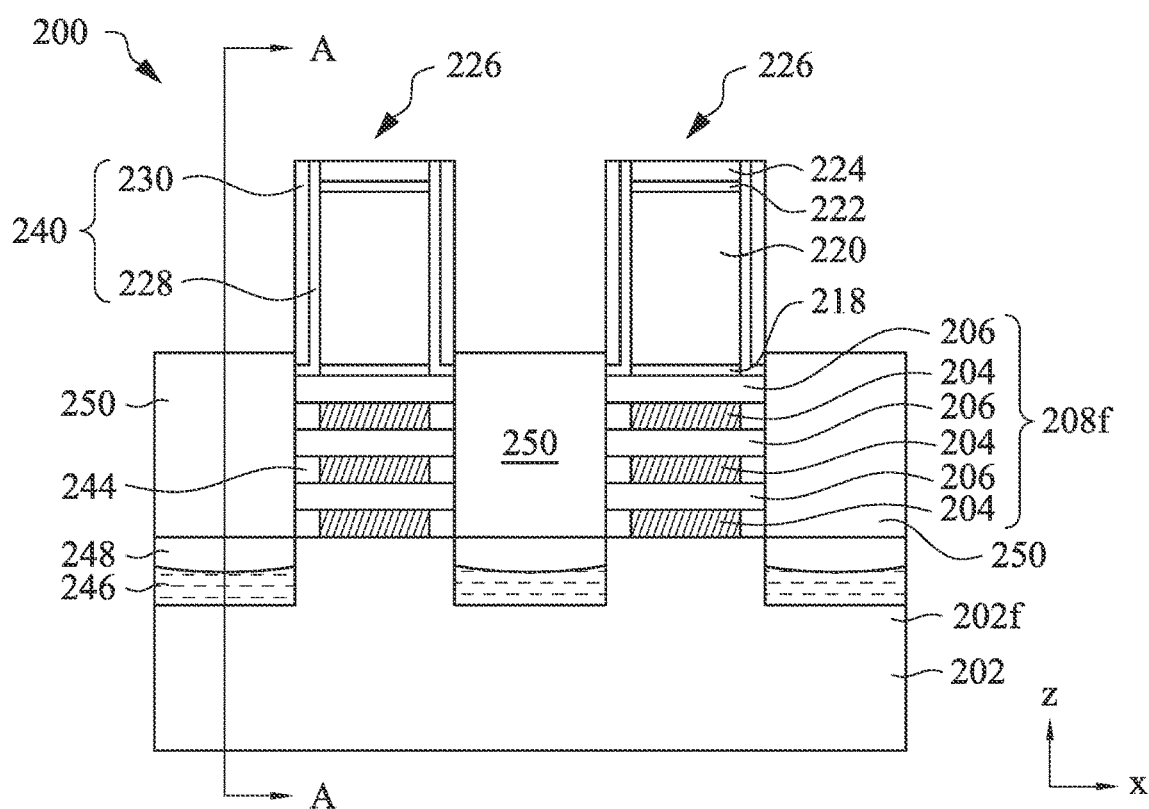
Figure 11C:
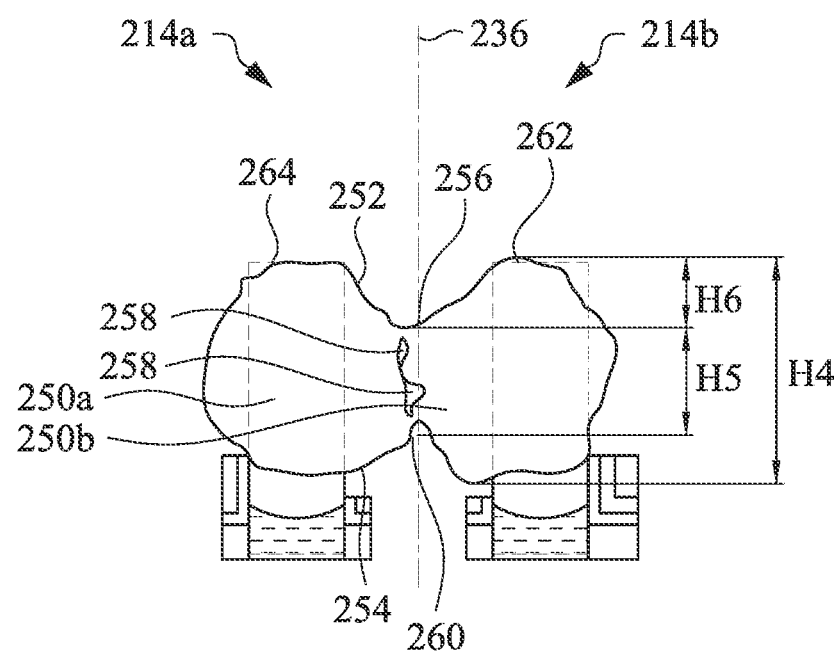

At operation 118, epitaxial source/drain features 250 are formed over the epitaxial transitional layer 248, as shown in FIGS. 11A-11B. FIG. 11A is a sectional view of the semiconductor device 200 along the line A-A in FIG. 4 and FIG. 11B. FIG. 11B is a sectional view of the semiconductor device 200 along the line B-B in FIG. 4 and FIG. 11A. FIG. 11C is a partial enlarged view of FIG. 11A showing the epitaxial source/drain features 250.

The epitaxial source/drain features 250 are formed over the epitaxial transitional layer 248. The epitaxial source/drain features 250 may be formed by any suitable method, such as by CVD, CVD epitaxy, molecular beam epitaxy (MBE), or any suitable deposition technique. The epitaxial source/drain features 250 may include one or more layers of Si, SiP, SiC and SiCP. The epitaxial source/drain features 250 also include n-type dopants, such as phosphorus (P), arsenic (As), etc. In some embodiments, the epitaxial source/drain features 250 may be a Si layer including phosphorus dopants. The dopant concentration in the epitaxial source/drain features 250 is higher than that of the epitaxial transitional layer 248. In some embodiments, the epitaxial source/drain features 250 include a dopant concentration of between about 1E20 atoms/cm$^3$ and about 5E21 atoms/cm$^3$.

The epitaxial source/drain features 250 may have a height H4 in a range between about 30 nm and about 70 nm or a thickness enough for side surfaces 250s of the epitaxial features 250 to cover all of the semiconductor channel layers 206 in the semiconductor stack 208. In some embodiments, a top surface 248t of the epitaxial transitional layer 248 is below the semiconductor channel layers 206 of the semiconductor stack 208.

In some embodiments, the epitaxial source/drain features 250 may be grown in an epitaxial chamber by a suitable process. For example, the epitaxial source/drain features 250 are formed by a selective etching growth process, as described with the operation 22 in the method 10.

Because of the epitaxial process parameters at operation 118 and the height selection of the fin sidewall spacers 232a, 234a, 234b, 232b, the epitaxial source/drain features 250 grown from the fin structures 214a and 214b merged along the central line 236. As shown in FIG. 11C, the epitaxial source/drain feature 250a grown from the fin structure 214a and the epitaxial source/drain feature 250b grown from the fin structure 214b merge together to form one epitaxial source/drain feature 250. The merged epitaxial source/drain feature 250 may have a top surface 252 and a bottom surface 254 opposing the top surface 252. The sidewalls 250s connect the top surface 252 and the bottom surface 254. The epitaxial source/drain features 250a, 250b merge substantially along the central line 236. The epitaxial source/drain features 250a, 250b are merged from a lower merge point 260 on the bottom surface 254 and an upper merge point 256 on the top surface 252. The lower merge point 260 and the top merge point 256 are at different vertical levels along the Z-direction. A merge length in the z-direction from the lower merge point 260 to the upper merge point 256 is denoted by H5. In some embodiments, a ratio of the merge length H5 and the height H4 is in a range between about 65% and about 80%. The merge height H5 is about 50% to 70% of the non-merge height, or the height above the upper merge point 256 and below the lower merge point 260.

In some embodiments, the shapes of the epitaxial source/drain features 250a, 250b are tuned such that the epitaxial source/drain features 250a, 250b are "just" merge to allow the epitaxial source/drain features 250a, 250b substantially retain the natural shapes from epitaxial growth without merging. The "just" merge arrangement allows the epitaxial source/drain features 250a, 250b to merge yet substantially maintain "natural" or "unmerged" source/drain feature volume.

As shown in FIG. 11C, the top surface 252 may be a wavy surface having peak points 262, 264 defining a valley therebetween. The upper merge point 256 coincides with the valley point between the peak points 262, 264. A wavy height H6 is defined by a distance from the valley point to the peak points 262, 264. In some embodiments, a ratio of the wavy height H6 over the total height H4 is in a range between about 5% and about 35%.

Figure 11D:
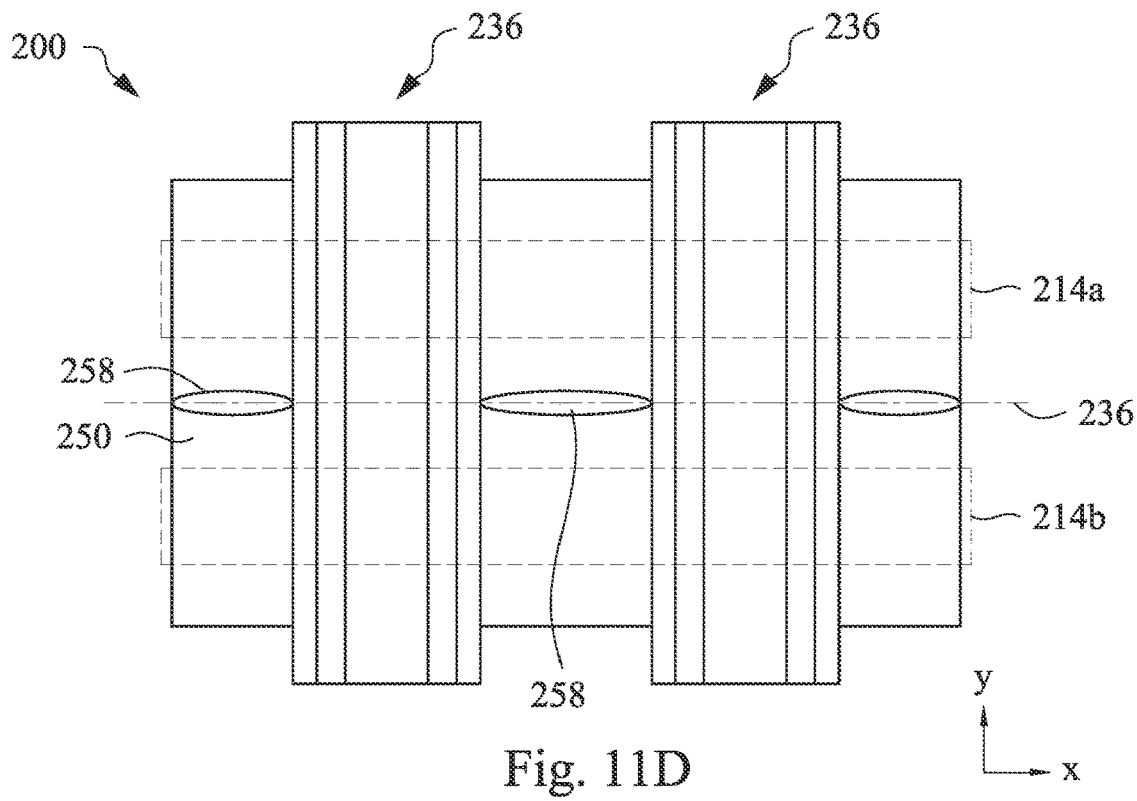
Figure 11E:
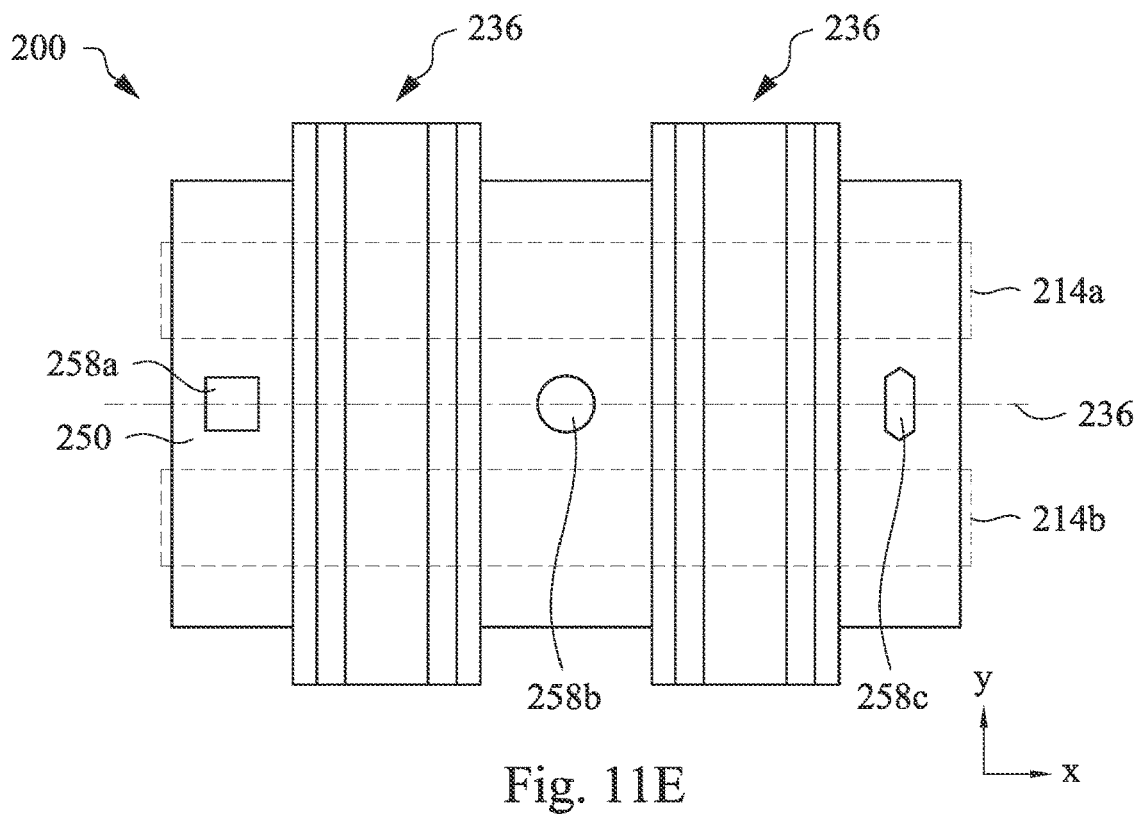

In some embodiments, one or more voids 258 are formed along the merge line or the central line 236 as the "just" merge arrangement. The one or more voids 258 may be filled with air or gas, such as hydrogen, helium, or other suitable gas. In some embodiments, the voids 258 may have a shape of circular, elliptical, parabolic, or triangular in the z-y plane. In some embodiments, the voids 258 may have a radius in a range between about 0.5 nm and about 3 nm. In some embodiments, the void 258 may be located along the central line 236 about 3 nm to 7 nm below the upper merge point 256. The merging of the epitaxial source/drain features 250a, 250b also result a void 267 between the bottom surface 254 and the isolation layer 216. The void 267 may be filled with air or gas, such as hydrogen, helium, or other suitable gas FIGS. 11D and 11E are schematic layout views of the semiconductor device 200 showing various positions and shapes of the voids 258 in the merged epitaxial source/drain features 250. As shown in FIG. 11D, the voids 258 may extend along the x-direction across the merged epitaxial source/drain features 250. Alternatively, the voids 258 may be located in a central portion of the epitaxial source/drain features 250. As shown in FIG. 11E, voids 258a, 258b, 258c of various cross-sectional shapes in the x-y plane are located within the epitaxial source/drain features 250. Particularly, a void with a triangle shaped cross section in the y-z plane (shown in FIG. 11A) may have a square or rectangular shaped cross section in the x-y plane as shown in the void 258a in FIG. 11E. A void with a cone or hyperbolic shaped cross section in the y-z plane (shown in FIG. 11A) may have an oval or circular shaped cross section in the x-y plane as shown in the void 258b in FIG. 11E. A void with an oval or elliptical shaped cross section in the y-z plane (shown in FIG. 11A) may have a hexagonal shaped cross section in the x-y plane as shown in the void 258c in FIG. 11E.

Figure 12A:
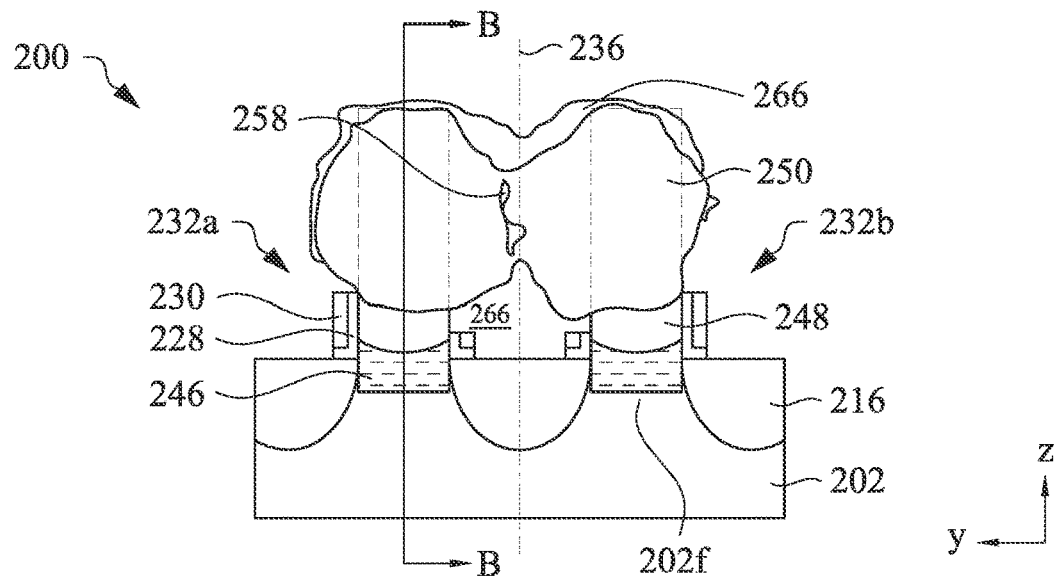
Figure 12B:
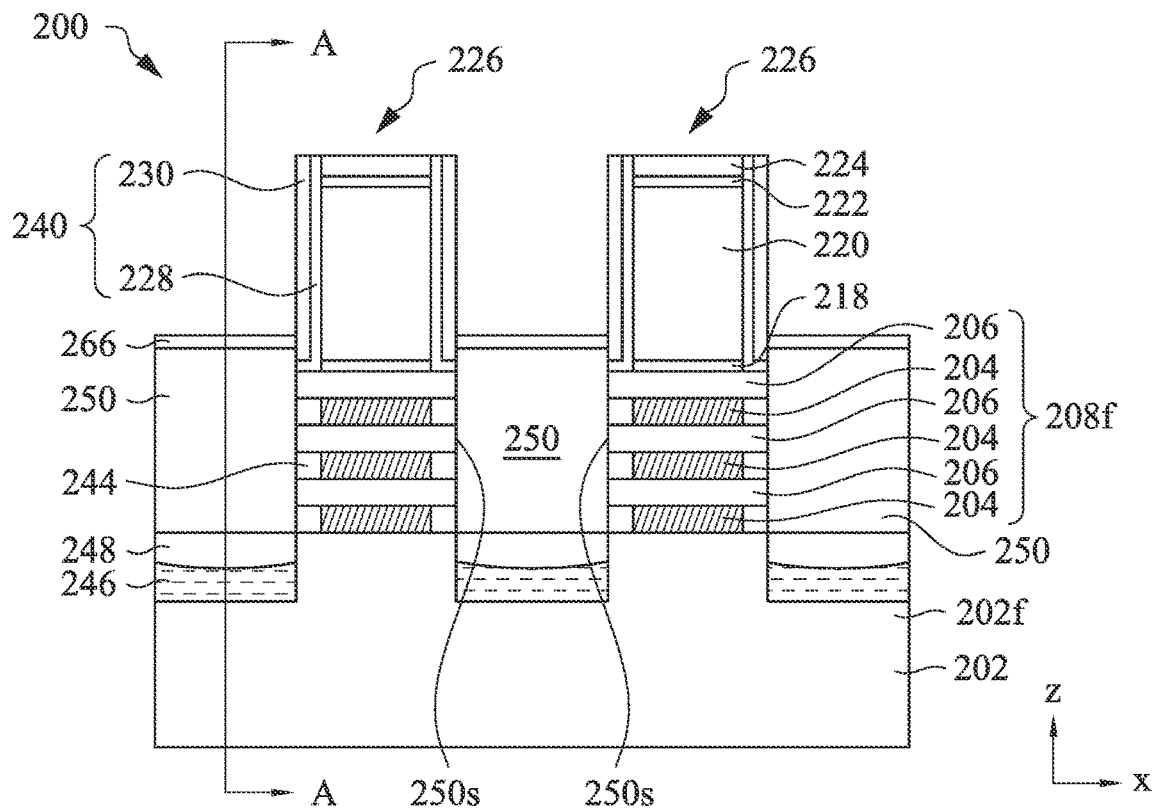

At operation 120, an epitaxial cap layer 266 is formed over the epitaxial source/drain features 250, as shown in FIGS. 12A-12B. FIG. 12A is a sectional view of the semiconductor device 200 along the line A-A in FIG. 4 and FIG. 12B. FIG. 12B is a sectional view of the semiconductor device 200 along the line B-B in FIG. 4 and FIG. 12A.

The epitaxial cap layer 266 is formed on the exposed surfaces of the epitaxial source/drain features 250. The epitaxial cap layer 266 may be formed by any suitable method, such as by CVD, CVD epitaxy, molecular beam epitaxy (MBE), or any suitable deposition technique. The epitaxial cap layer 266 may include one or more layers of Si, SiP, SiC and SiCP. The epitaxial cap layer 266 also include n-type dopants, such as phosphorus (P), arsenic (As), etc. In some embodiments, the epitaxial cap layer 266 may be a Si layer including phosphorus dopants. In some embodiments, the epitaxial cap layer 266 includes a dopant concentration of between about 1E21 atoms/cm$^3$ and about 2E21 atoms/cm$^3$.

The epitaxial cap layer 266 may have a thickness along the z-direction in a range between about 3 nm and about 10 nm. The epitaxial cap layer 266 maintains a wavy shape over the top surface 252 of the merged epitaxial source/drain feature 250.

In some embodiments, the epitaxial cap layer 266 may be grown in an epitaxial chamber by a suitable process. For example, the epitaxial cap layer 266 is formed by a selective etching growth process as described with the operation 24 in the method 10.

In some embodiments, the epitaxial deposition at operations 114, 116, 118, and 120 may be performed in the same epitaxial deposition chamber.

Figure 13A:
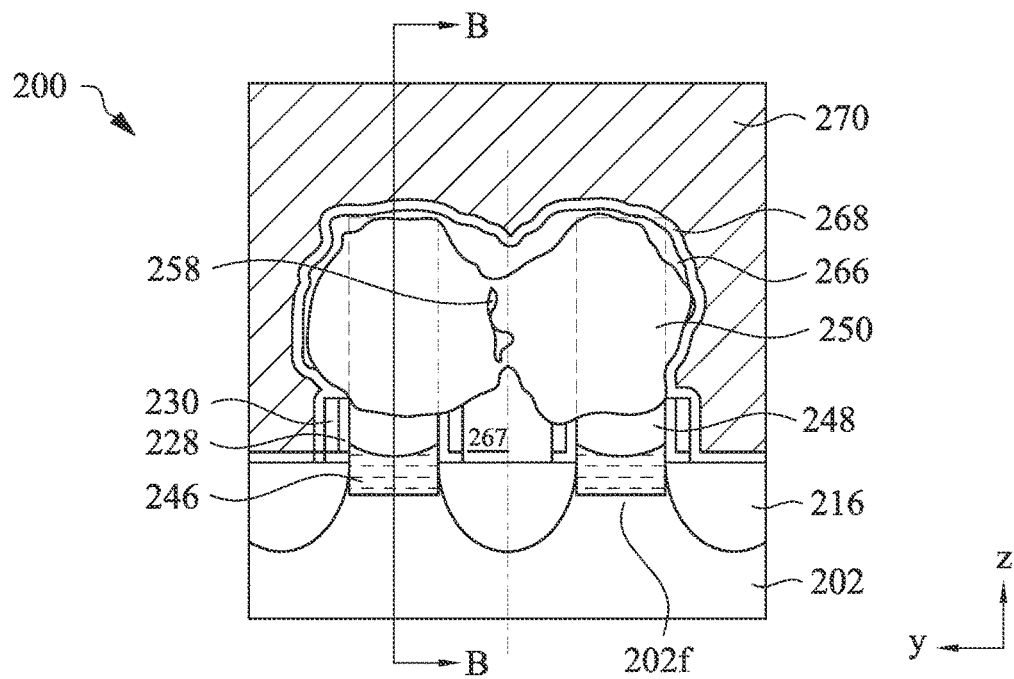
Figure 13B:
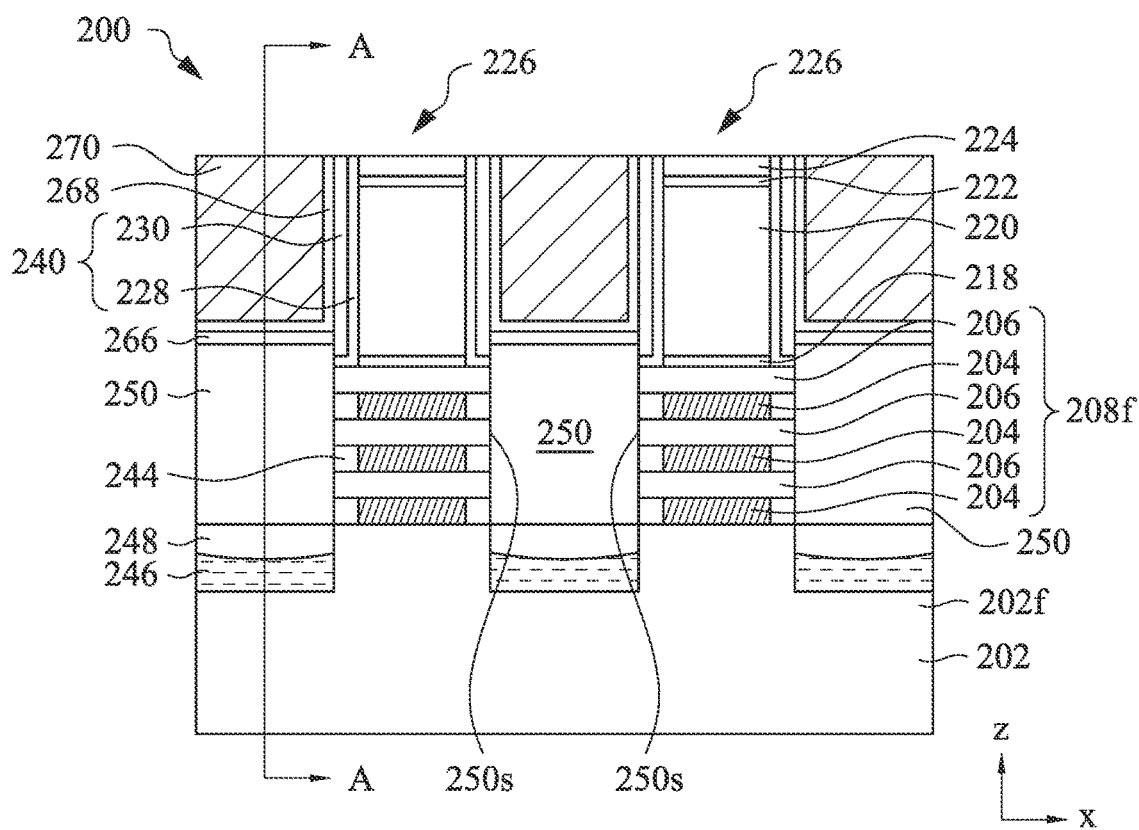

At operation 122, a contact etch stop layer (CESL) 268 and an interlayer dielectric (ILD) layer 270 are formed over the semiconductor device 200, as shown in FIGS. 13A-13B. FIG. 13A is a sectional view of the semiconductor device 200 along the line A-A in FIG. 4 and FIG. 13B. FIG. 13B is a sectional view of the semiconductor device 200 along the line B-B in FIG. 4 and FIG. 13A.

The CESL 268 is conformally formed over exposed surfaces of the semiconductor device 200. The CESL 268 is formed on the epitaxial cap layer 266, the gate sidewall spacers 240, the fin sidewall spacers 232a, 232b, and the isolation layer 216 if exposed. The CESL 268 may include SiN, SiON, SiCN or any other suitable material, and may be formed by CVD, PVD, or ALD.

The interlayer dielectric (ILD) layer 270 is formed over the CESL 268. The materials for the ILD layer 270 include compounds comprising Si, O, C, and/or H, such as silicon oxide, SiCOH and SiOC. Organic materials, such as polymers, may be used for the ILD layer 270. In some embodiments, the ILD layer 270 may be formed by flowable CVD (FCVD). The ILD layer 270 protects the epitaxial source/drain features 250 during the removal of the sacrificial gate structures 226.

Figure 14A:
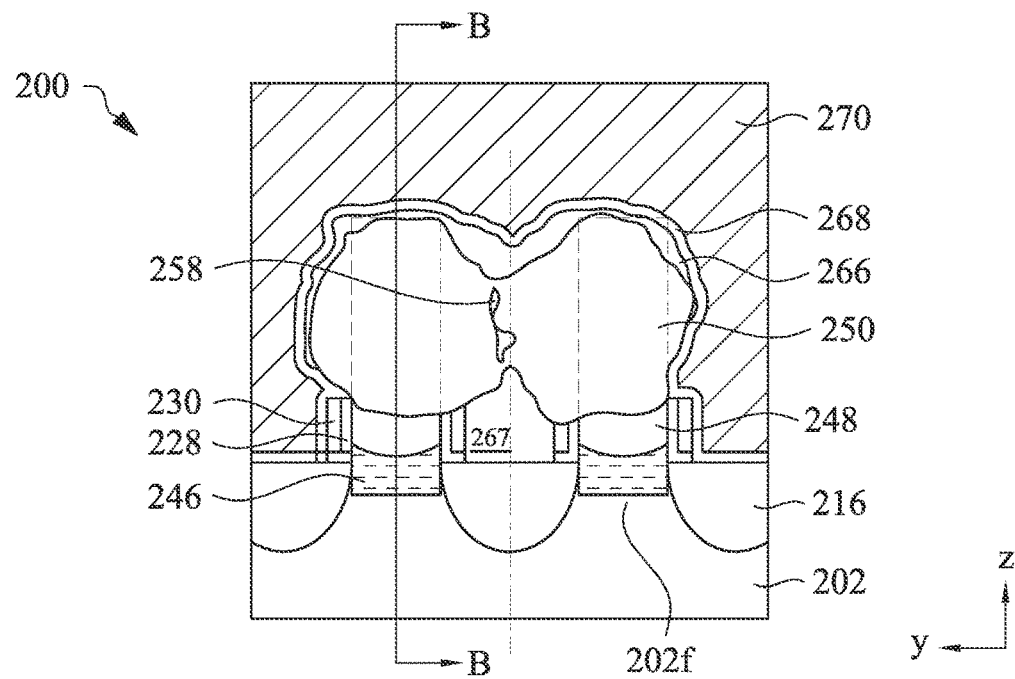
Figure 14B:
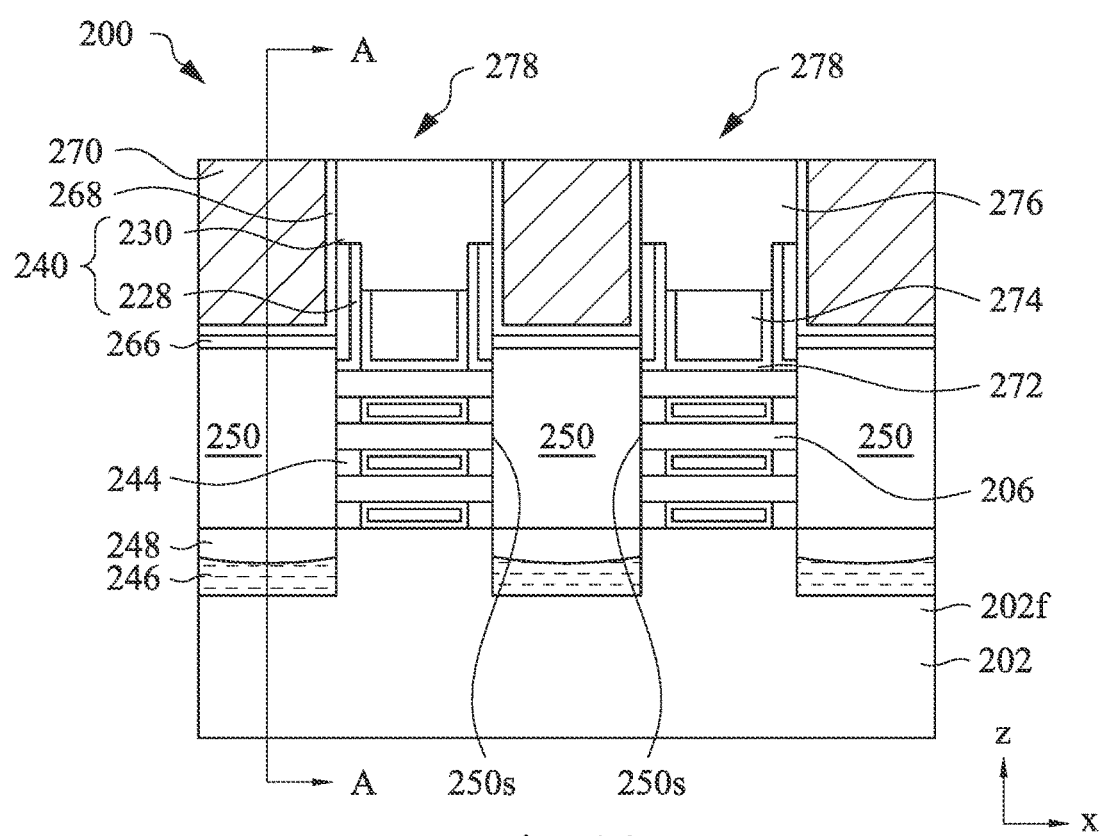

At operation 124, replacement gate structures 278 are formed, as shown in FIGS. 14A-14B. FIG. 14A is a sectional view of the semiconductor device 200 along the line A-A in FIG. 4 and FIG. 14B. FIG. 14B is a sectional view of the semiconductor device 200 along the line B-B in FIG. 4 and FIG. 14A.

The sacrificial gate dielectric layer 218 and sacrificial gate electrode layer 220 are removed by one or more suitable process, such as dry etch, wet etch, or a combination thereof, to expose the semiconductor stack 208 underneath the sacrificial gate structures 226. In some embodiments, a wet etchant such as a tetramethylammonium hydroxide (TMAH) solution is used.

The semiconductor layers 204 are then removed by one or more suitable etching process to expose the semiconductor channel layers 206 and form gate cavities around the semiconductor channel layers 206.

The replacement gate structures 278 are formed around the semiconductor channel layers 206, as shown in FIG. 14B. In some embodiments, the replacement gate structure 278 includes a gate dielectric layer 272 and a gate electrode layer 274. Optionally, the replacement gate structure 278 may include a self-aligned contact (SAC) layer 276.

The gate dielectric layer 272 may be conformally deposited on exposed surfaces in the gate cavities. The gate dielectric layer 272 may have different composition and dimensions for N-type devices and P-type devices and are formed separately using patterned mask layers and different deposition recipes. The gate dielectric layer 272 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 272 may be formed by CVD, ALD or any suitable method.

The gate electrode layer 274 is then formed on the gate dielectric layer 272 to fill the gate cavities. The gate electrode layer 274 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 274 may be formed by CVD, ALD, electro-plating, or other suitable method. After the formation of the gate electrode layer 274, a planarization process, such as a CMP process, is performed to remove excess deposition of the gate electrode material and expose the top surface of the ILD layer 270.

In some embodiments, a metal gate etching back (MGEB) process is performed to form the self-aligned contact (SAC) layer 276. One or more etching processes are performed to remove portions of the gate dielectric layer 272 and the gate electrode layer 274 to form trenches in the region above the remaining gate electrode layer 274. The MGEB process may be a plasma etching process employing one or more etchants such as chlorine-containing gas, a bromine-containing gas, and/or a fluorine-containing gas. The etching process allows the gate dielectric layer 272 and the gate electrode layer 274 to be selectively etched from the ILD layer 270 and the CESL 268.

In the MGEB process, the gate dielectric layer 272 and gate electrode layer 274 are etched back to a level lower than a top surface of high-k dielectric features formed on hybrid fins (not shown) parallel to the fin structures 214. In some embodiments, the gate sidewall spacers 240 are also etched back to a level be lower than the CESL 268 and higher than the gate electrode layer 274.

In some embodiments, a metal gate liner, not shown, may be first deposited on exposed surfaces in the trenches above the gate electrode layer 274 prior to depositing the SAC layer 276. The metal gate liner and the SAC layer 276 may be formed by a suitable deposition process, such as CVD, PVD, or ALD. The metal gate liner may function as a diffusion barrier for the gate electrode layer 274. The metal gate liner may be a dielectric layer including but not limited to SiO, SiN, SiC, SiCN, SiOC, SiON, SiOCN, ZrO, ZrN, or a combination thereof. The SAC layer 276 may be any dielectric layer that can be used as an etch stop layer during subsequent trench and via patterning for metal contacts. In some embodiments, the SAC layer 276 may a high-k dielectric layer. The SAC layer 276 may a dielectric layer including but not limited to SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or any combinations thereof.

After filling the trenches with the SAC layer 276, a planarization process, such as a CMP process, is performed to remove excess deposition of the SAC layer 276 and metal gate liner to expose the top surface of the ILD layer 270.

Figure 15A:
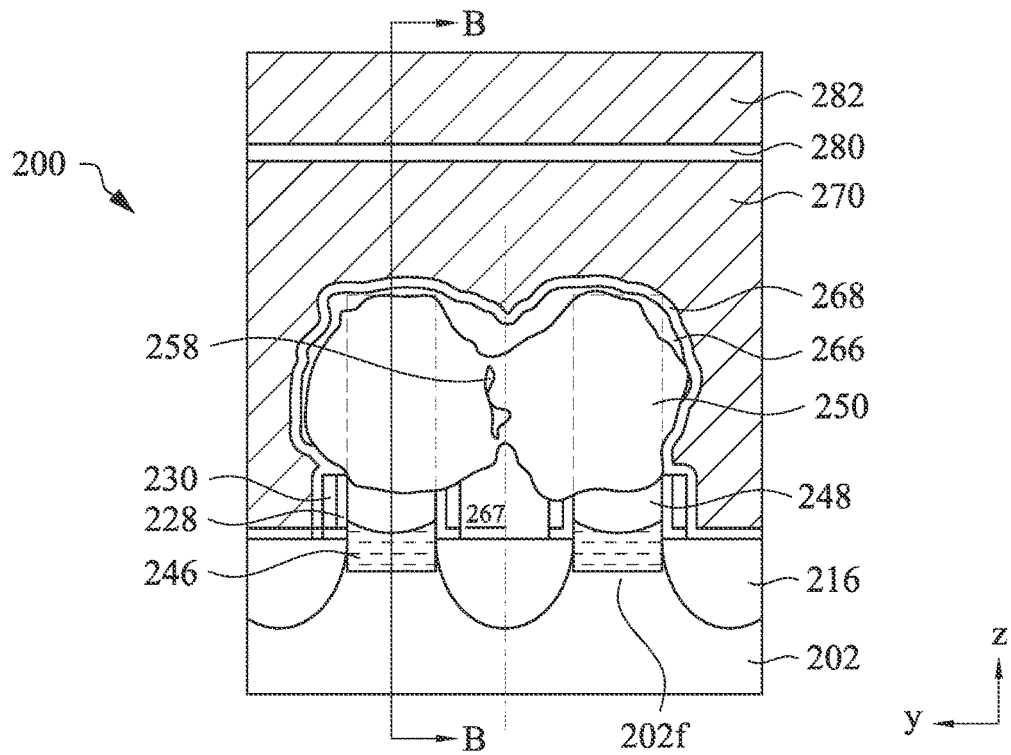
Figure 15B:
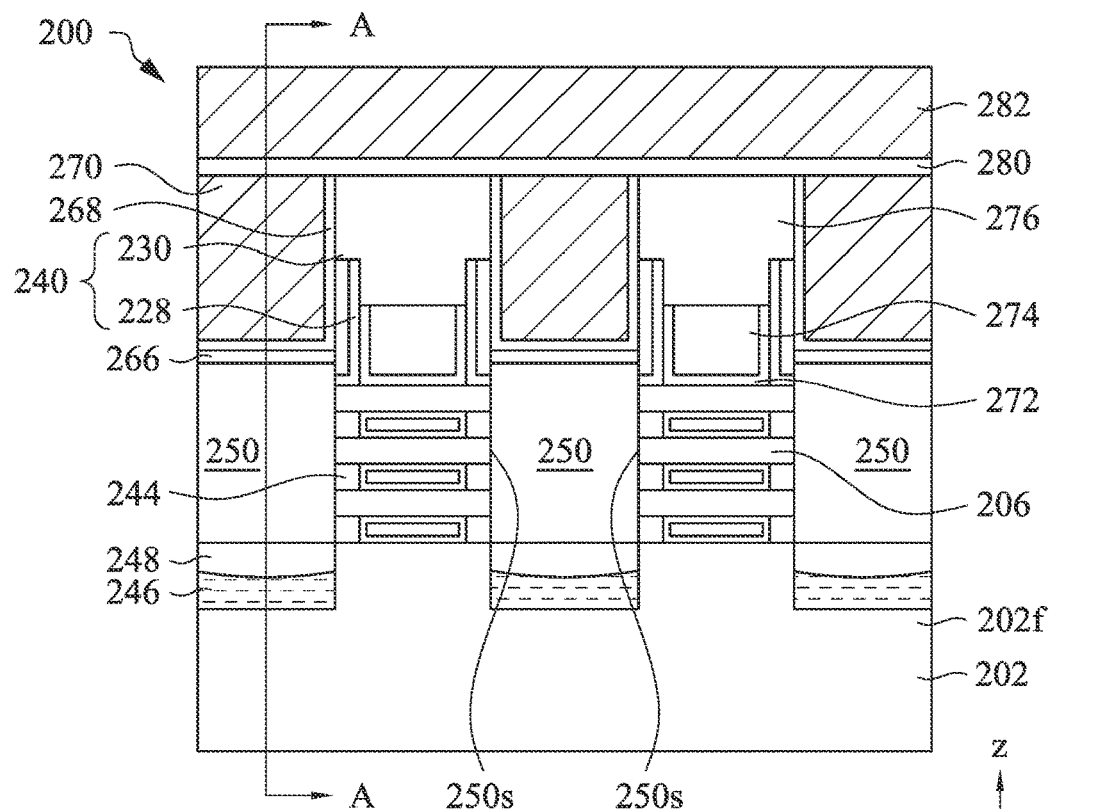

At operation 126, an etch stop layer 280 and an interlayer dielectric (ILD) layer 282 are formed over the semiconductor device 200, as shown in FIGS. 15A-15B. FIG. 15A is a sectional view of the semiconductor device 200 along the line A-A in FIG. 4 and FIG. 15B. FIG. 15B is a sectional view of the semiconductor device 200 along the line B-B in FIG. 4 and FIG. 15A.

In some embodiments, the etch stop layer 280 may be conformally formed over the semiconductor device 200 by a blanket deposition. The etch stop layer 280 may include SiN, SiON, SiCN or any other suitable material, and may be formed by CVD, PVD, or ALD.

The ILD layer 282 is formed over the etch stop layer 280. The materials for the ILD layer 282 may include compounds comprising Si, O, C, and/or H, such as silicon oxide, SiCOH and SiOC. Organic materials, such as polymers, may be used for the ILD layer 282. In some embodiments, the ILD layer 282 may be formed by flowable CVD (FCVD).

Figure 16A:
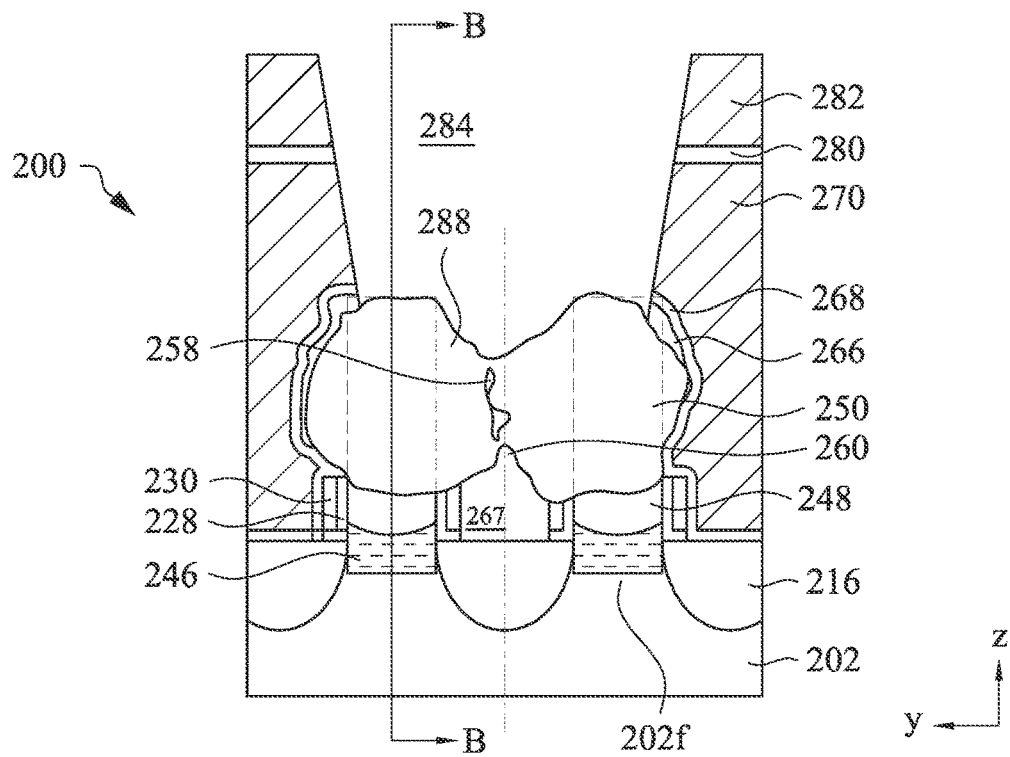
Figure 16B:
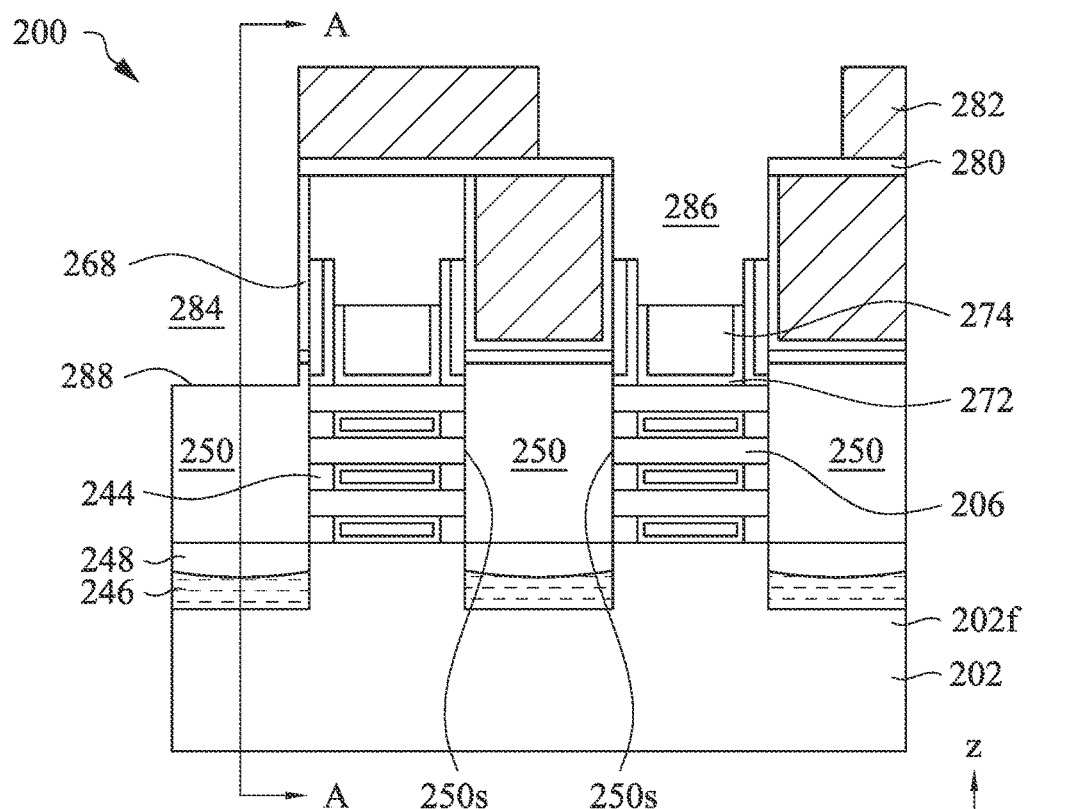

At operation 128, source/drain contact holes 284 and gate contact holes 286 are formed, as shown in FIGS. 16A-16B. FIG. 16A is a sectional view of the semiconductor device 200 along the line A-A in FIG. 4 and FIG. 16B. FIG. 16B is a sectional view of the semiconductor device 200 along the line B-B in FIG. 4 and FIG. 16A.

The source/drain contact holes 284 may be formed by one or more patterning and etch processes to remove the ILD layer 282, the etch stop layer 280, the ILD layer 270, and the CESL layer 268 to expose the epitaxial source/drain features 250. In some embodiments, at least a portion of the epitaxial cap layer 266 is removed to expose the epitaxial source/drain feature 250 below.

In some embodiments, a portion of the epitaxial source/drain feature 250 is removed so that the contact surface 288 lands at below the upper merge point 256 (shown in FIG. 11C) to land within the merged portion of the epitaxial source/drain features 250a, 250b. Particularly, the source/drain contact holes 284 may be formed to have the contact surface 288 located at a level between the upper merge point 256 and above the lower merge point 260 to land the contact surface 288 within the merged portion of the epitaxial source/drain feature 250. Landing the source/drain contact hole 284 in the merged portion of the epitaxial source/drain feature 250 increases total exposed areas of the merged epitaxial source/drain feature 250, thus, increasing contact areas and reducing contact resistance. As discussed in FIG. 11C, the merged epitaxial source/drain features 250 according to the present disclosure has increased merged portion along the z-direction, thus providing an increased landing window for the source/drain contact holes 284.

The gate contact holes 286 may be formed by one or more patterning and suitable etching process to remove the ILD layer 282, the etch stop layer 280, and the SAC layer 276.

Figure 17A:
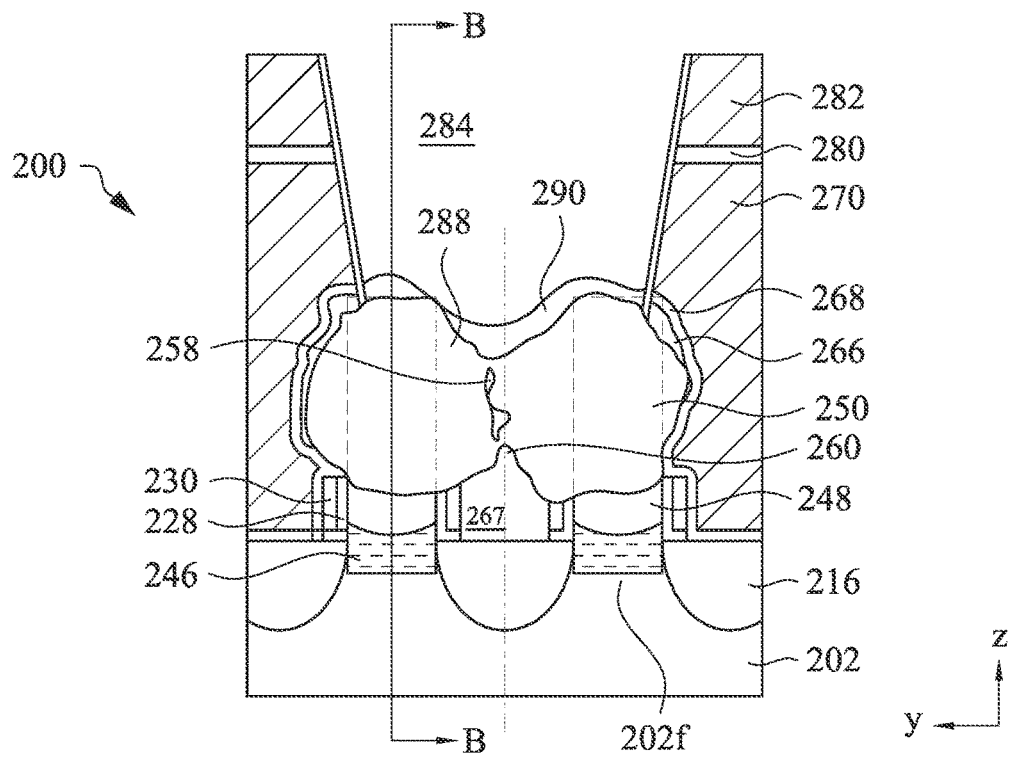
Figure 17B:
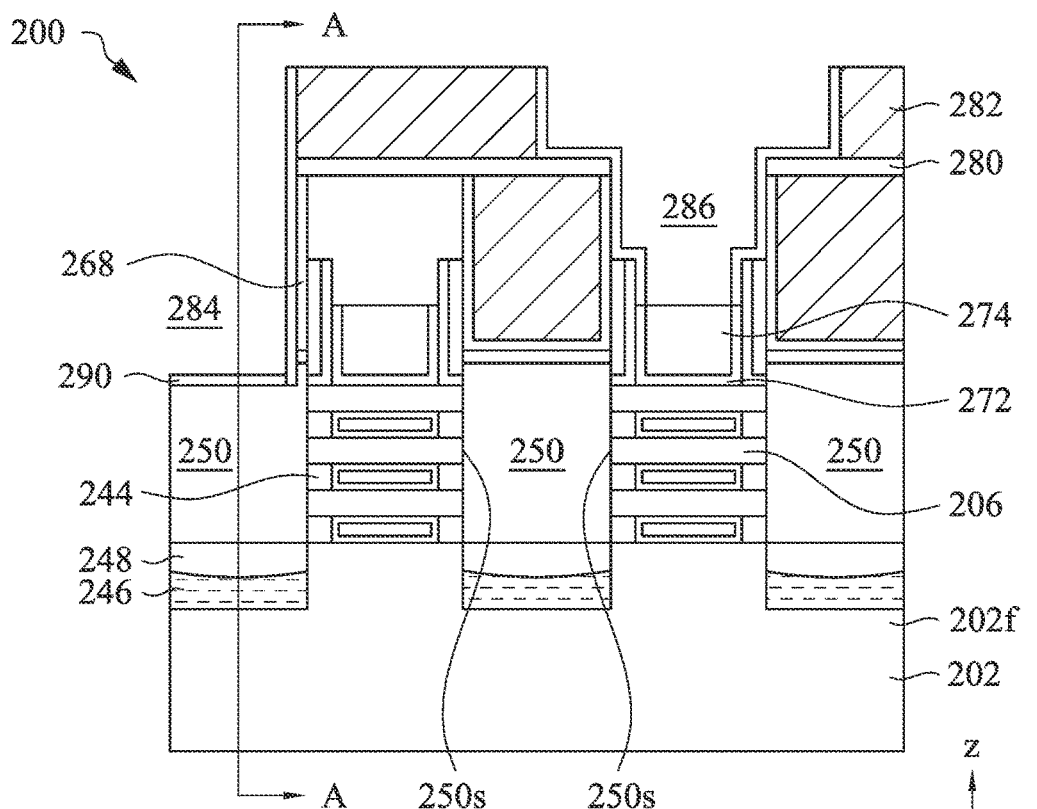
Figure 18A:
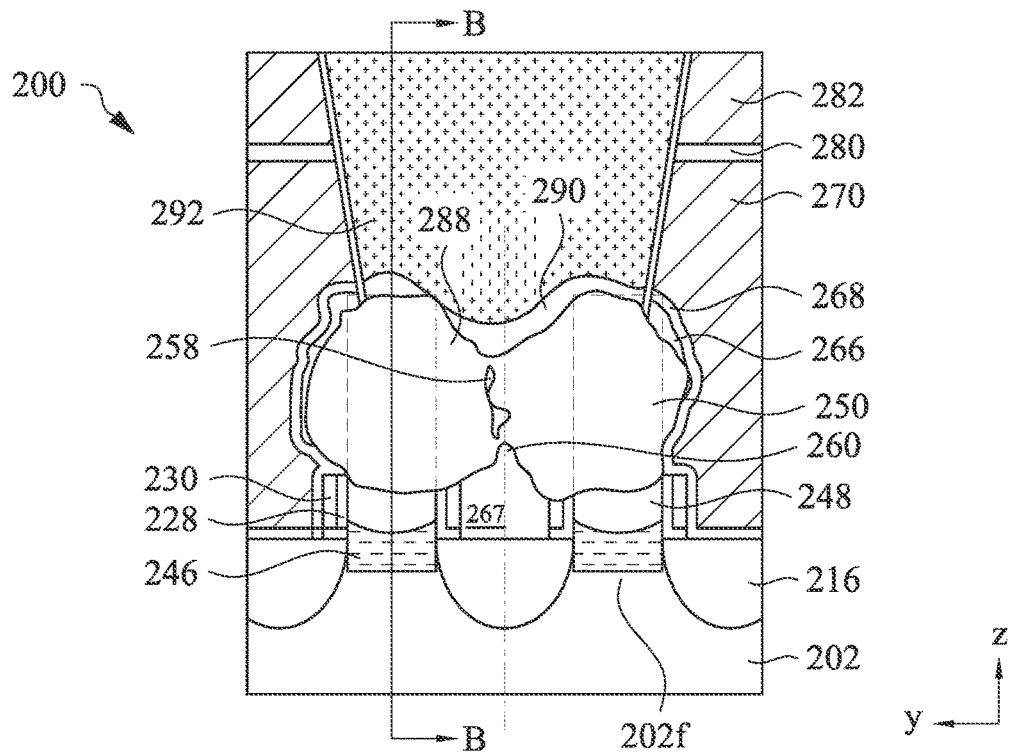
Figure 18B:
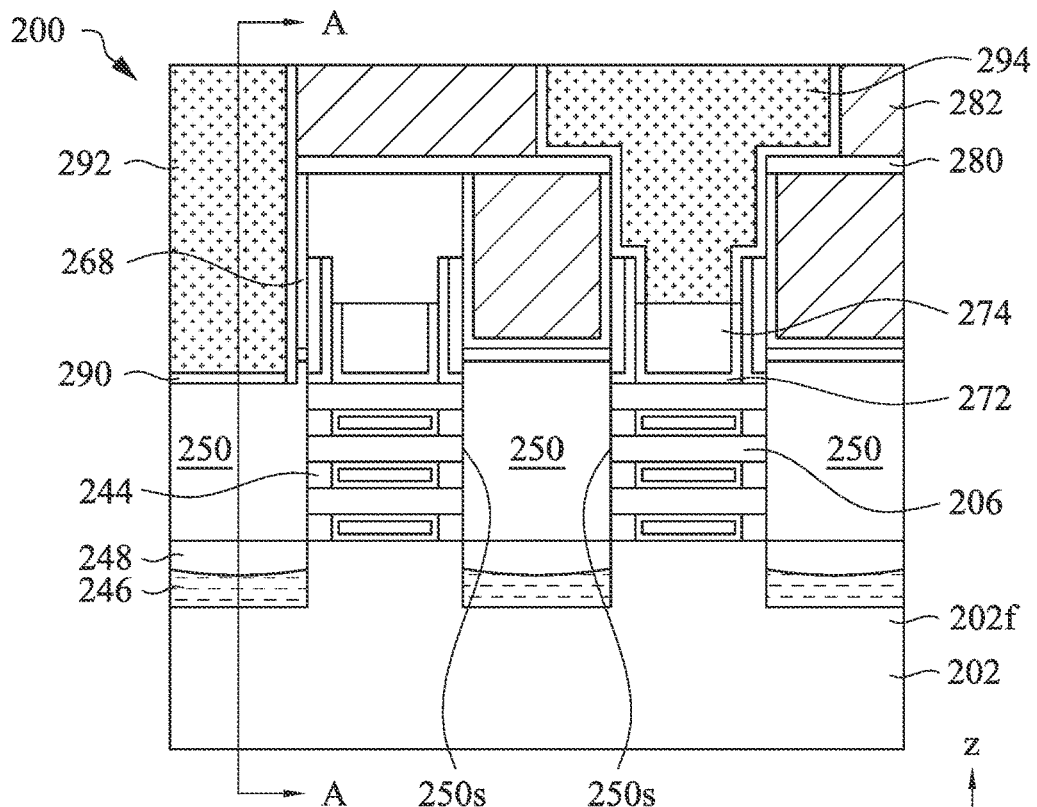
Figure 18C:
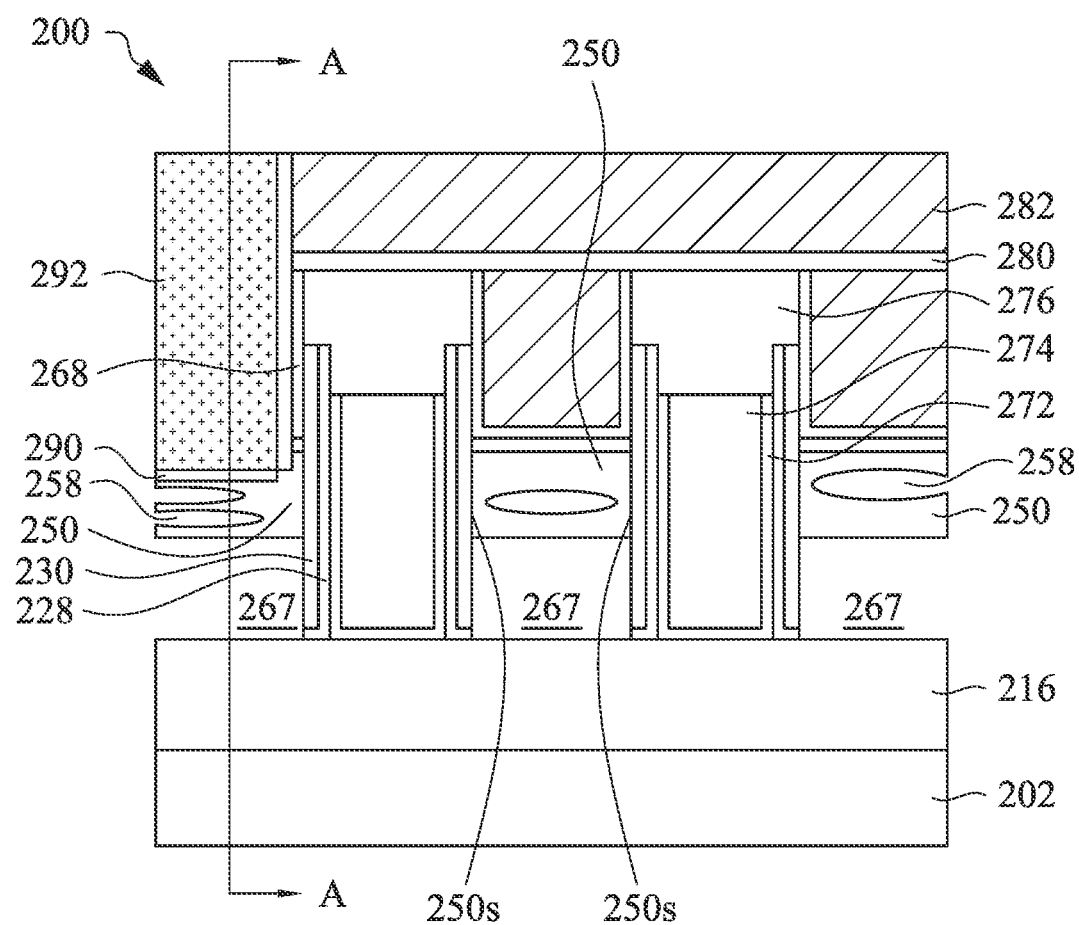

In operation 130, source/drain contact features 292 and gate contact features 294 are formed as shown in FIGS. 17A-17B, and FIGS. 18A-18C. FIG. 17A is a sectional view of the semiconductor device 200 along the line A-A in FIG. 4 and FIG. 17B. FIG. 17B is a sectional view of the semiconductor device 200 along the line B-B in FIG. 4 and FIG. 17A. FIG. 18A is a sectional view of the semiconductor device 200 along the line A-A in FIG. 4 and FIG. 18B. FIG. 18B is a sectional view of the semiconductor device 200 along the line B-B in FIG. 4 and FIG. 18A. FIG. 18C is a sectional view of the semiconductor device 200 along the line C-C in FIG. 18A.

After formation of the source/drain contact holes 284, a silicide layer 290 is selectively formed over an exposed surface of the epitaxial source/drain features 250 exposed by the source/drain contact holes 284. In some embodiments, the silicide layer 290 is formed on the contact surface 288. In some embodiments, the silicide layer 290 includes one or more of WSi, CoSi, NiSi, TiSi, MoSi, and TaSi.

The source/drain contact features 292 and gate contact features 294 are then formed by filling a conductive material in the source/drain contact holes 284 and gate contact holes 286. In some embodiments, the conductive material layer for the gate contact may be formed by CVD, PVD, plating, ALD, or other suitable technique. In some embodiments, the conductive material for the source/drain contact features 292 and the gate contact features 294 includes TiN, TaN, Ta, Ti, Hf, Zr, Ni, W, Co, Cu, Ag, Al, Zn, Ca, Au, Mg, Mo, Cr, or the like. Subsequently, a CMP process is performed to remove a portion of the conductive material layer above a top surface of the ILD layer 282. As shown in FIG. 18A, the source/drain contact feature 292 contacts the epitaxial source/drain feature 250 at the merged portion, thus, with increased contact area. As shown in FIG. 18C, the source/drain contact feature 292 may be formed over the voids 258.

Even though source/drain structures in the example above are formed from two fin structures, embodiments of the present disclosure may be extended to forming merged source/drain features from two or more fin structures. It should be noted that the semiconductor device 200 may include other type of devices, such as the p-type devices, and various operations may be performed before, after, in between the operations of the method 100 to fabricate the other type of devices.

Various embodiments or examples described herein offer multiple advantages over the state-of-art technology. Embodiments of the present disclosure provide an epitaxial source/drain feature with one or more voids formed therein. The voids result from barely merging two epitaxial source/drain features grown from two fins. By barely merging two epitaxial source/drain features, the result source/drain feature benefit from the merging without obvious reduction of total volume of the epitaxial feature. Merging two epitaxial source/drain features provides an increased contact surface between the source/drain feature and source/drain contact, thus, reducing the source/drain contact resistance.

Some embodiments of the present disclosure provide a semiconductor device. The semiconductor device includes, a first fin, a second fin, a first epitaxial source/drain feature extending from the first fin, and a second epitaxial source/drain feature extending from the second fin, wherein the first and second epitaxial source/drain features are merged at a first level and at a second level, and a void is defined by the first and second epitaxial features at a third level between the first level and the second level.

Some embodiments of the present disclosure provide a semiconductor device. The semiconductor device includes a source/drain feature including a top surface, a bottom surface opposite the top surface, and a side surface connecting the top surface and bottom surface, wherein a first void is formed between the top surface and the bottom surface, and one or more semiconductor channels in contact with the side surface of the source/drain feature.

Some embodiments of the present disclosure provide a method for forming a semiconductor device. The method includes forming a first fin and a second fin adjacent the first fin, forming a sacrificial gate structure across the first and second fins, recess etching the first and second fins exposed by the sacrificial gate structure, and forming first and second epitaxial source/drain features from the first and second fins respectively, wherein the first and second epitaxial source/drain features are merged at a first level and at a second level, and a void is formed between the first and second levels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
a first fin;
a second fin;
a first epitaxial source/drain feature grown from the first fin;
a second epitaxial source/drain feature grown from the second fin, wherein the first and second epitaxial source/drain features are merged at a first level and at a second level, and a void is defined by the first and second epitaxial source/drain features at a third level between the first level and the second level;
a first epitaxial transitional layer formed between the first fin and the first epitaxial source/drain feature;
a second epitaxial transitional layer formed between the second fin and the second epitaxial source/drain feature
first and second fin sidewall spacers, wherein the first epitaxial transitional layer is formed between the first and second fin sidewall spacers; and
third and fourth fin sidewall spacers, wherein the second epitaxial transitional layer is formed between the third and fourth fin sidewall spacers.

2. The semiconductor device of claim 1, wherein the merged first and second epitaxial source/drain features form a wavy top surface above the first level.

3. The semiconductor device of claim 2, further comprising an epitaxial cap layer formed on the wavy top surface.

4. The semiconductor device of claim 3, further comprising a source/drain contact feature in connection with the first and second epitaxial source/drain features through a contact surface, and the contact surface is at a level below the first level.

5. The semiconductor device of claim 3, further comprising:
a first undoped epitaxial layer formed between the first fin and first epitaxial transitional layer; and
a second undoped epitaxial layer formed between the second fin and second epitaxial transitional layer.

6. A semiconductor device, comprising:
a source/drain feature including a top surface, a bottom surface opposite to the top surface, and a side surface connecting the top surface and bottom surface, wherein a first void is formed between the top surface and the bottom surface, and the source/drain feature includes:
a first epitaxial material having the first void formed therein and defining a portion of the bottom surface; and
a second epitaxial material in contact with the first epitaxial material and defining at least a portion of the top surface; and
one or more semiconductor channels in contact with the side surface of the source/drain feature;
a first semiconductor fin connected to the source/drain feature at the bottom surface; and
a second semiconductor fin connected to the source/drain feature at the bottom surface, wherein a second void is defined between the first and second semiconductor fins and exposed to the bottom surface of the source/drain feature.

7. The semiconductor device of claim 6, further comprising:
a third epitaxial material formed between the first epitaxial material and the first semiconductor fin.

8. The semiconductor device of claim 6, wherein the top surface of the source/drain feature is a wavy surface having a valley point between a first peak and a second peak, and the first void is substantially aligned with the valley point.

9. The semiconductor device of claim 8, wherein a wavy height is measured from the first peak to the valley point, a total height is measured from the first peak to the bottom surface, and a ratio of the wavy height over the total height is in a range between about 5% and about 35%.

10. A semiconductor device, comprising:
a first fin;
a second fin adjacent the first fin;
first and second fin sidewall spacers on sidewalls of the first fin, wherein the second fin sidewall spacer faces the second fin, and the first fin sidewall spacer is higher than the second fin sidewall spacer;
third and fourth fin sidewall spacers on sidewalls of the second fin, wherein the third fin sidewall spacer faces the first fin, and the fourth fin sidewall spacer is higher than the third fin sidewall spacer;
a first epitaxial source/drain feature grown from the first fin; and
a second epitaxial source/drain feature grown from the second fin, wherein the first and second epitaxial source/drain features are merged forming a merged source/drain feature, and a void is formed within the merged source/drain features.

11. The semiconductor device of claim 10, wherein the merged source/drain feature including a wavy top surface having a valley point between a first peak and a second peak, and the void is formed below the valley point.

12. The semiconductor device of claim 10, further comprising:
   a first epitaxial transitional layer disposed between the first and second fin sidewall spacers, wherein the first epitaxial transitional layer is in contact with the first epitaxial feature.

13. The semiconductor device of claim 12, wherein the epitaxial transitional layer includes SiAs.

14. The semiconductor device of claim 12, further comprising:
   a first undoped epitaxial layer disposed between the first fin and the first epitaxial transitional layer.

15. The semiconductor device of claim 12, further comprising:
   an epitaxial cap layer disposed over the first and second epitaxial source/drain features.

16. The semiconductor device of claim 15, wherein the epitaxial cap layer comprises a doped silicon layer.

17. The semiconductor device of claim 6, wherein the second epitaxial material comprises a doped silicon layer.

18. The semiconductor device of claim 1, wherein the first fin sidewall spacer has a first height, the second fin sidewall spacer has a second height, and the first height is greater than the second height.

19. The semiconductor device of claim 18, wherein a difference between the first height and the second height is in a range between about 5 nm and about 30 nm.

20. The semiconductor device of claim 18, wherein the fourth fin sidewall spacer is disposed between the second fin sidewall spacer and the third fin sidewall spacer, the third fin sidewall spacer has a third height, the fourth fin sidewall spacer has a fourth height, the third height is substantially similar to the first height, and the fourth height is substantially similar to the second height.

* * * * *